United States Patent
Ozkan et al.

(10) Patent No.: US 10,287,677 B2
(45) Date of Patent: May 14, 2019

(54) METHODS OF FABRICATING PILLARED GRAPHENE NANOSTRUCTURES

(71) Applicant: THE REGENTS OF THE UNIVERSITY OF CALIFORNIA, Oakland, CA (US)

(72) Inventors: Cengiz S. Ozkan, San Diego, CA (US); Mihrimah Ozkan, San Diego, CA (US); Ali B. Guvenc, San Diego, CA (US); Rajat K. Paul, San Diego, CA (US); Jian Lin, San Diego, CA (US); Maziar Ghazinejad, San Diego, CA (US); Miro Penchev, San Diego, CA (US); Shirui Guo, San Diego, CA (US); Jiebin Zhong, San Diego, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 0 days.

(21) Appl. No.: 14/443,300

(22) PCT Filed: Nov. 18, 2013

(86) PCT No.: PCT/US2013/070615
§ 371 (c)(1),
(2) Date: May 15, 2015

(87) PCT Pub. No.: WO2014/078807
PCT Pub. Date: May 22, 2014

(65) Prior Publication Data
US 2015/0299852 A1    Oct. 22, 2015

Related U.S. Application Data

(60) Provisional application No. 61/728,147, filed on Nov. 19, 2012.

(51) Int. Cl.
*H01L 21/02* (2006.01)
*C01B 32/186* (2017.01)
(Continued)

(52) U.S. Cl.
CPC .............. *C23C 16/44* (2013.01); *B82Y 10/00* (2013.01); *B82Y 20/00* (2013.01); *B82Y 40/00* (2013.01);
(Continued)

(58) Field of Classification Search
CPC ............ H01L 51/0048; H01L 31/0048; H01L 21/02527; C01B 31/0453; C01B 31/0446;
(Continued)

(56) References Cited

U.S. PATENT DOCUMENTS

2003/0185985 A1* 10/2003 Bronikowski ...... B81C 1/00031
427/258
2010/0021708 A1    1/2010 Kong et al.
(Continued)

FOREIGN PATENT DOCUMENTS

CN    102364701 A    2/2012
CN    102426187 A    4/2012
(Continued)

OTHER PUBLICATIONS

Paul et al, Synthesis of a Pillared Graphene Nanostructure: A Counterpart of Three-Dimensional Carbon Architectures, 2010, Small 6 No. 20, 2309-2313.*
(Continued)

*Primary Examiner* — Andrew J Golden
(74) *Attorney, Agent, or Firm* — Knobbe, Martens, Olson & Bear LLP

(57) ABSTRACT

Methods of fabricating a graphene film are disclosed. An example method can include providing a substrate, heating the substrate between about 600° C. and about 1100° C. in
(Continued)

a chamber, and introducing a carbon source into the chamber at a temperature between about 600° C. and about 1100° C. for about 10 seconds to about 1 minute. The method can further include cooling the substrate to about room temperature to form the graphene film Methods of fabricating pillared graphene nano structures and graphene based devices are also provided.

10 Claims, 66 Drawing Sheets

(51) Int. Cl.
| | |
|---|---|
| C23C 16/26 | (2006.01) |
| C23C 16/44 | (2006.01) |
| B82Y 40/00 | (2011.01) |
| H01L 31/028 | (2006.01) |
| H01L 31/068 | (2012.01) |
| H01L 31/076 | (2012.01) |
| H01L 29/778 | (2006.01) |
| H01L 31/18 | (2006.01) |
| H01L 29/41 | (2006.01) |
| H01L 29/16 | (2006.01) |
| H01L 29/06 | (2006.01) |
| H01L 27/30 | (2006.01) |
| H01G 9/145 | (2006.01) |
| H01G 9/042 | (2006.01) |
| H01G 4/008 | (2006.01) |
| H01G 9/20 | (2006.01) |
| H01G 11/36 | (2013.01) |
| H01G 11/52 | (2013.01) |
| B82Y 20/00 | (2011.01) |
| B82Y 10/00 | (2011.01) |
| H01L 51/42 | (2006.01) |
| H01L 51/00 | (2006.01) |

(52) U.S. Cl.
CPC ............ *C01B 32/186* (2017.08); *C23C 16/26* (2013.01); *H01G 4/008* (2013.01); *H01G 9/042* (2013.01); *H01G 9/145* (2013.01); *H01G 9/20* (2013.01); *H01G 9/2031* (2013.01); *H01G 9/2072* (2013.01); *H01G 11/36* (2013.01); *H01G 11/52* (2013.01); *H01L 21/0262* (2013.01); *H01L 21/02491* (2013.01); *H01L 21/02527* (2013.01); *H01L 21/02664* (2013.01); *H01L 27/302* (2013.01); *H01L 29/0673* (2013.01); *H01L 29/1606* (2013.01); *H01L 29/413* (2013.01); *H01L 29/7781* (2013.01); *H01L 31/028* (2013.01); *H01L 31/068* (2013.01); *H01L 31/076* (2013.01); *H01L 31/1804* (2013.01); *C01B 2204/04* (2013.01); *C01B 2204/22* (2013.01); *H01L 51/0048* (2013.01); *H01L 51/424* (2013.01); *Y02E 10/542* (2013.01); *Y02E 10/547* (2013.01); *Y02E 10/548* (2013.01); *Y02E 60/13* (2013.01); *Y02P 70/521* (2015.11)

(58) Field of Classification Search
CPC ............ C01B 31/0223; C01B 31/0226; C01B 31/022; C01B 2204/02; C01B 2202/08; C01B 32/182; C01B 32/184; C01B 32/186; C01B 32/159; C01B 32/164; C23C 16/26; C23C 16/44
USPC .............. 136/243–265; 977/742; 423/447.1, 423/447.3
See application file for complete search history.

(56) References Cited

U.S. PATENT DOCUMENTS

| | | | |
|---|---|---|---|
| 2010/0255984 A1 | 10/2010 | Sutter et al. | |
| 2011/0033688 A1 | 2/2011 | Veerasamy | |
| 2011/0041980 A1 | 2/2011 | Kim et al. | |
| 2011/0244210 A1 | 10/2011 | Choi et al. | |
| 2012/0121891 A1* | 5/2012 | Kim | B82Y 40/00 428/323 |
| 2012/0152725 A1* | 6/2012 | Barker | C01B 31/0213 204/157.44 |
| 2012/0258587 A1 | 10/2012 | Kub et al. | |
| 2012/0282419 A1 | 11/2012 | Ahn et al. | |

FOREIGN PATENT DOCUMENTS

| | | | | |
|---|---|---|---|---|
| CN | 102522217 A | 6/2012 | | |
| CN | 102549202 A | 7/2012 | | |
| CN | 102623174 A | 8/2012 | | |
| WO | WO 2011037388 A2 * | 3/2011 | ............ | B82Y 10/00 |
| WO | WO 2012/148439 A1 | 11/2012 | | |

OTHER PUBLICATIONS

Xu et al, Controllable fabrication of carbon nanotubes on a catalysts derived from PS-b-P2VP block copolymer template and in situ synthesis of carbon nanotubes/Au nanoparticles composite materials, 2010, Materials Chemistry and Physics 119, 249-253.*
Lee et al, Versatile Carbon Hybrid Films Composed of Vertical Carbon Nanotubes Grown on Mechanically Compliant Graphene Films, 2010, Advanced Materials, 22, 1247-1252.*
Bennett et al, Using Block Copolymer Micellar Thin Films as Templates for the Production of Catalysts for Carbon Nanotube Growth, Chem. Mater. 2004, 16, 5589-5595.*
Clay et al, Synthesis of metal nanoclusters within microphase-separated diblock copolymers: sodium carboxylate vs carboxylic acid functionalization, 1998, Supramolecular Science, 5, 41-48.*
Chai et al, Using Cylindrical Domains of Block Copolymers to Self-Assemble and Align Metallic Nanowires, Jan. 2008, ACS Nano, vol. 2 No. 3, 489-501. (Year: 2008).*
International Search Report and Written Opinion received in International Patent Application No. PCT/US13/70615 dated May 2, 2014 in 17 pages.
Office Action received in Chinese Patent Application 201380069418. 1, dated Sep. 5, 2016 in 18 pages.
Quanhong Chang, *Research on the Synthesis of Quality Graphene by Chemical Vapor Deposition (CVD) and Its Properties*, Oct. 31, 2012, China Dissertation Database, 16 pages.
Peng Xu, *Fabrication of Ordered Nanomaterials Based on the Self-assembly of Amphiphilic Block Copolymers*, China Doctoral Dissertations Full-text Database, Engineering Science and Technology I, Jul. 15, 2009, No. 7, 41 pages.
Hyonkwang Choi et al., *Electrochemical Electrode of Graphene-Based Carbon Nanotubes Grown by Chemical Vapor Deposition*, Nov. 19, 2010, Scripta Materialia, 64, 601-604.
Ruiling Gao, *Search on First Principles of Electronic Properties of B- and N-Doped Graphene*, et al., Nov. 7, 2009, China Academic Journal Electronic Publishing House, 194-197.
Xiaochen Dong et al., *One-step growth of graphene-carbon nanotube hybrid materials by chemical vapor deposition*, 2011, Elsevier, 1-16.
Zhuangjun Fan et al., *A Three-Dimensional Carbon Nanotube/ Graphene Sandwich and Its Application as Electrode in Supercapacitors*, 2010, Advanced Materials 22, 3723-3728.
Duc Dung Nguyen et al., *Controlled growth of carbon nanotube-graphene hybrid materials for flexible and transparent conductors and electron field emitters*, 2012, Nanoscale, vol. 4, Issue 2, Abstract.

(56) References Cited

OTHER PUBLICATIONS

Shuangqiang Chen et al., *Carbon nanotubes grown in situ on graphene nanosheets as superior anodes for Li-ion batteries*, 2011, Nanoscale, 3, 4323-4329.

* cited by examiner

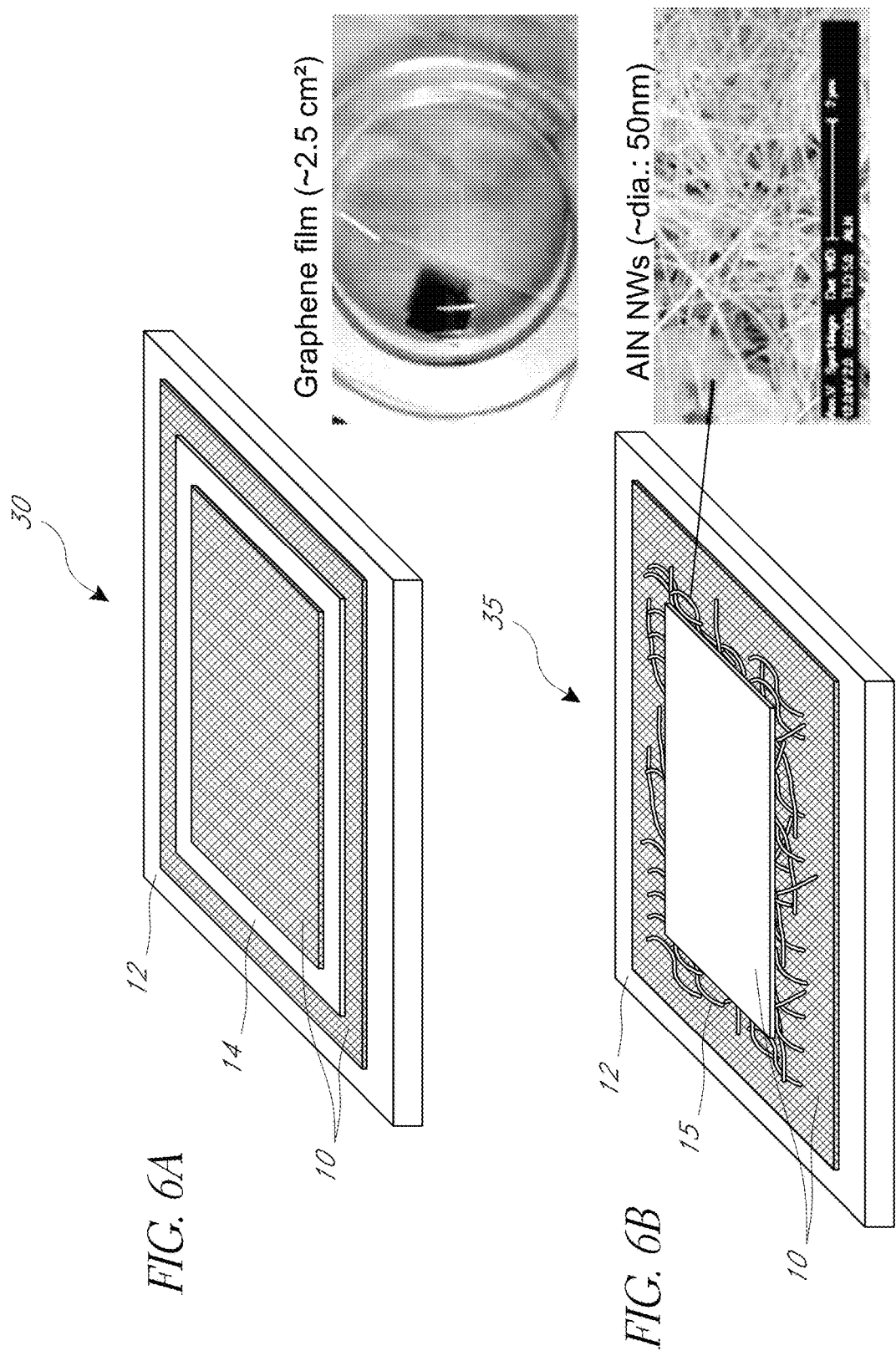

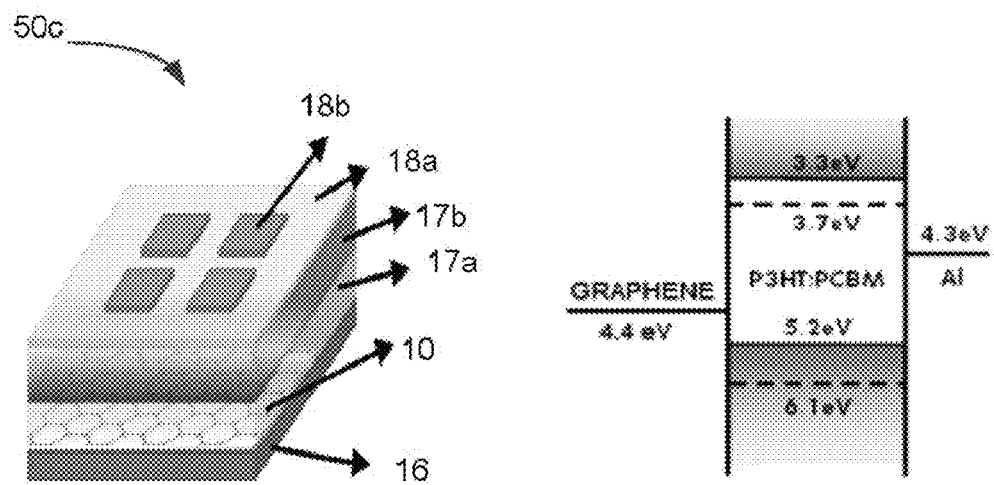
*FIG. 10C*  *FIG. 10D*
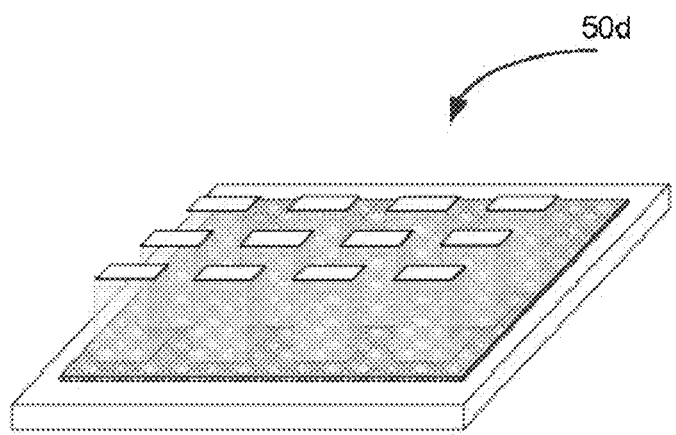
*FIG. 10E*

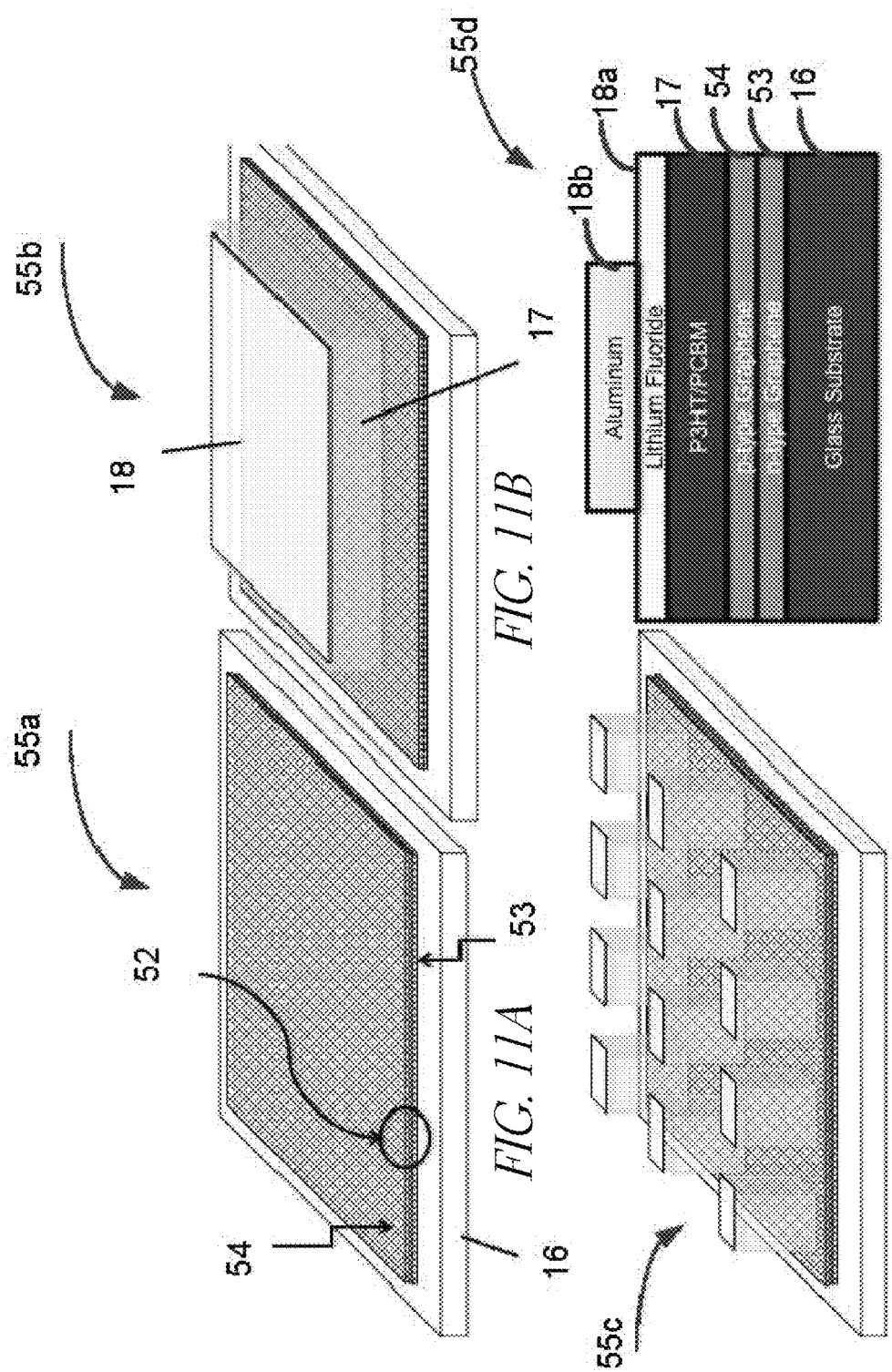

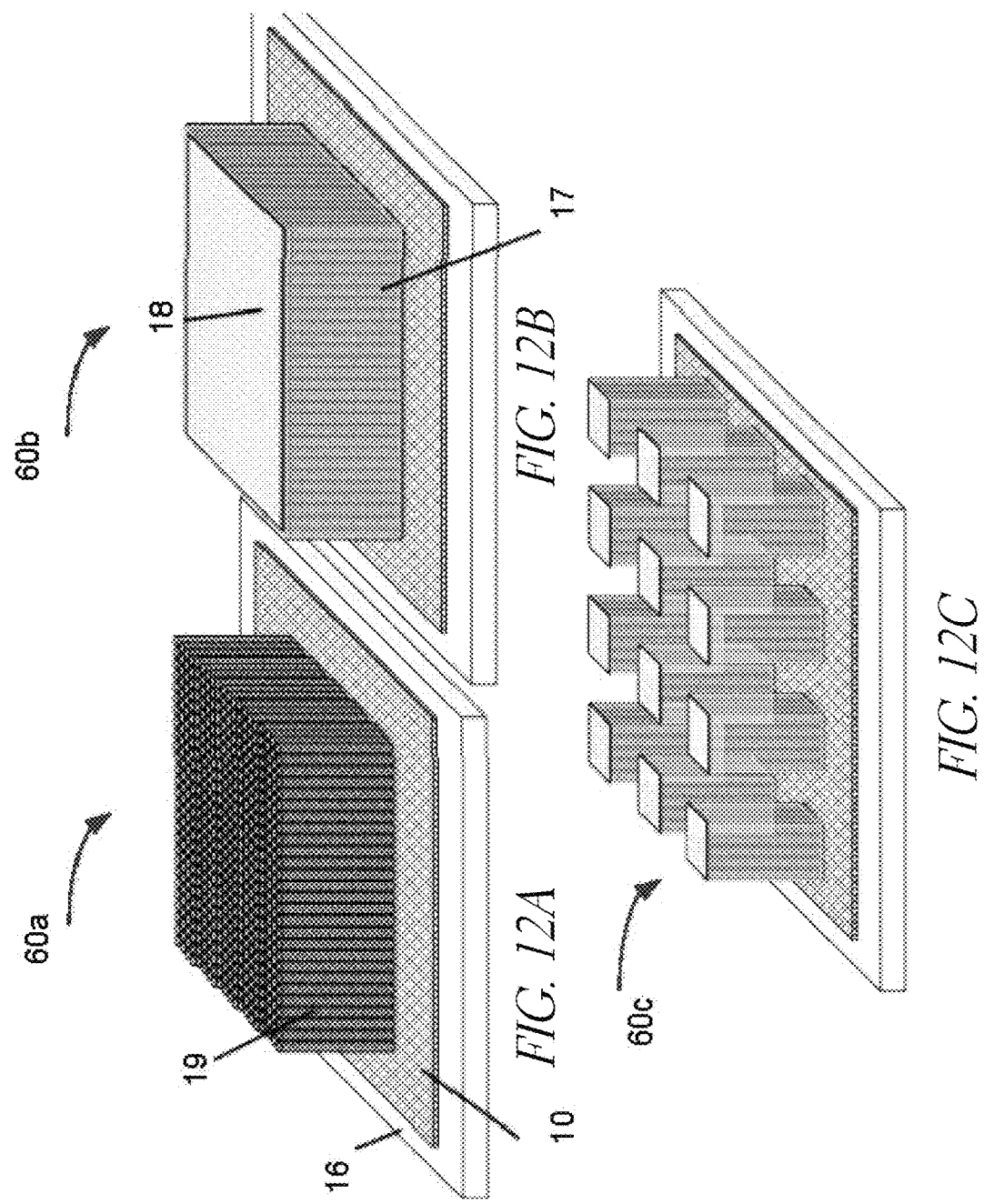

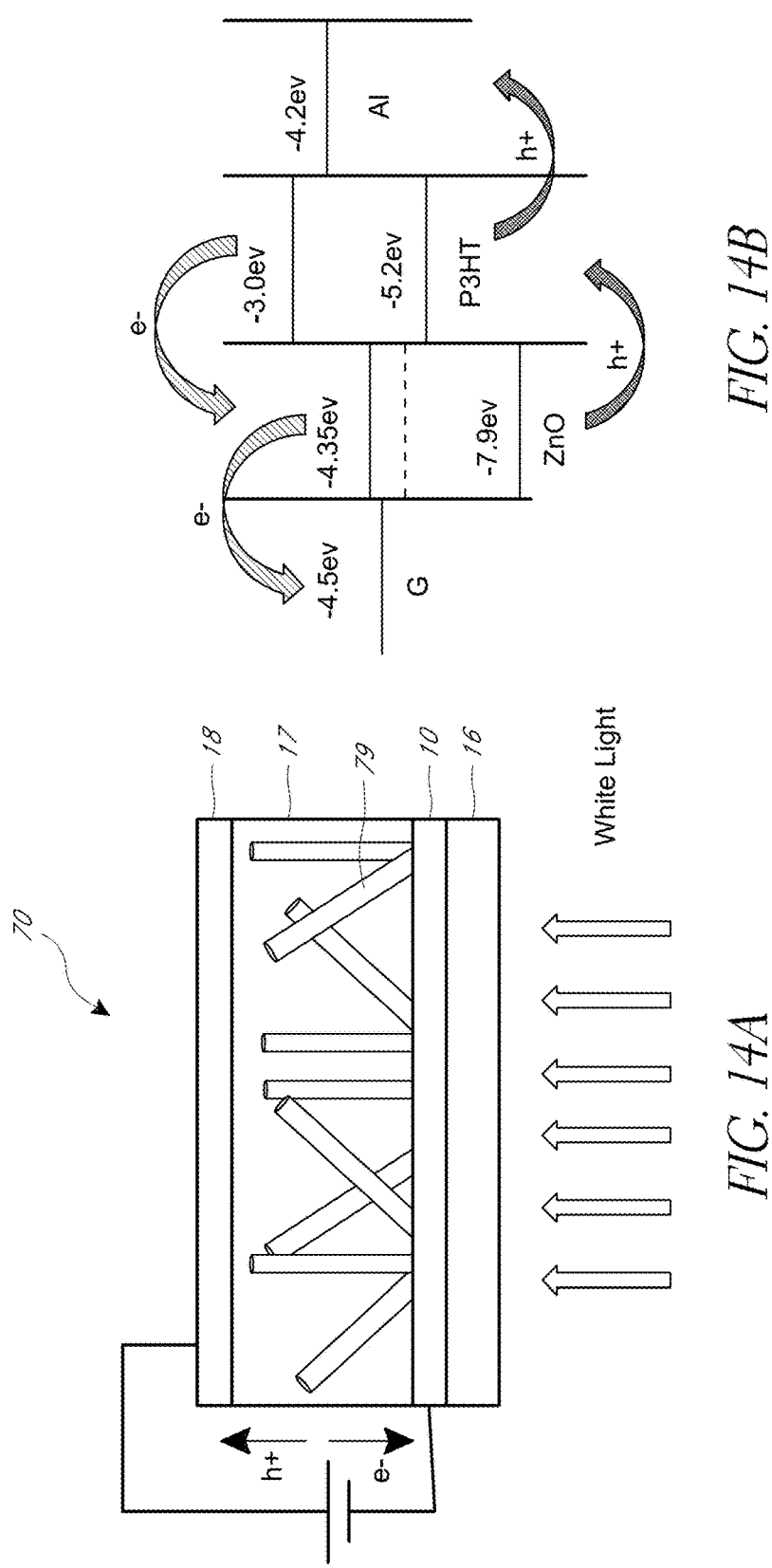

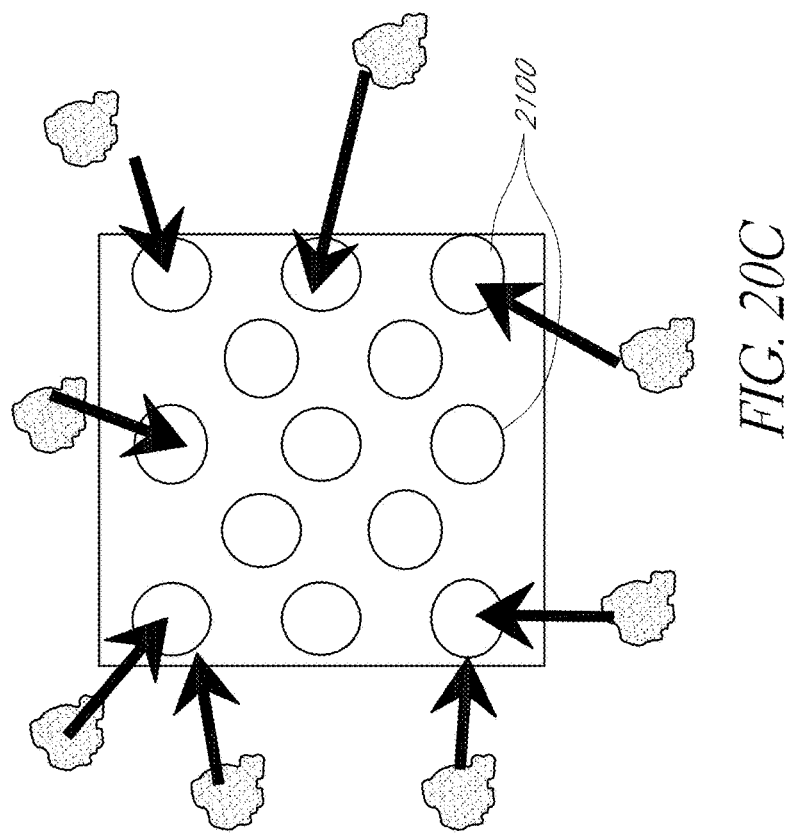

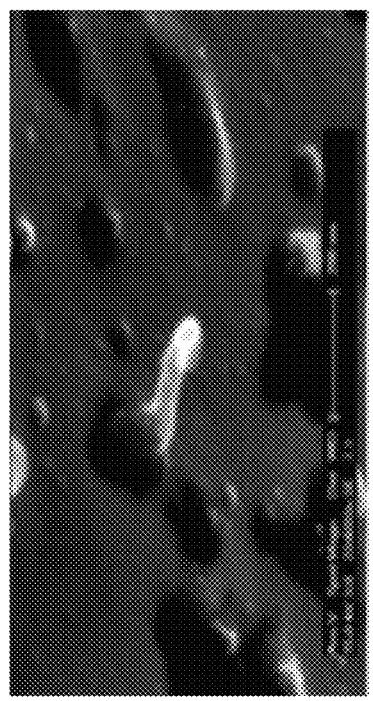 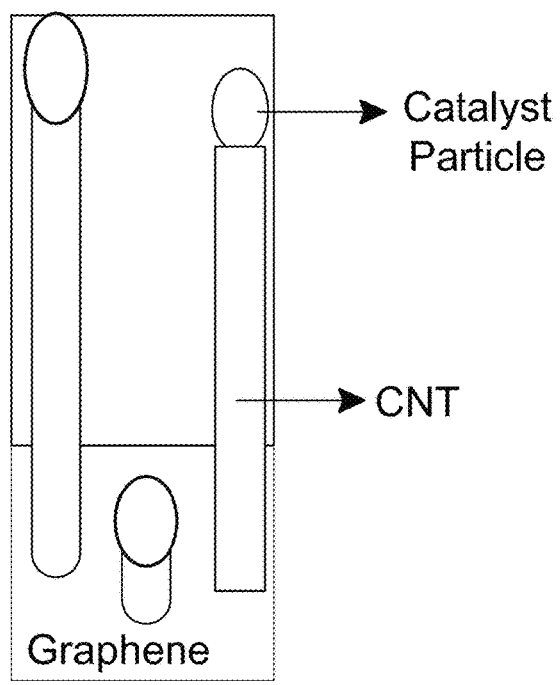
*FIG. 21A*  *FIG. 21B*

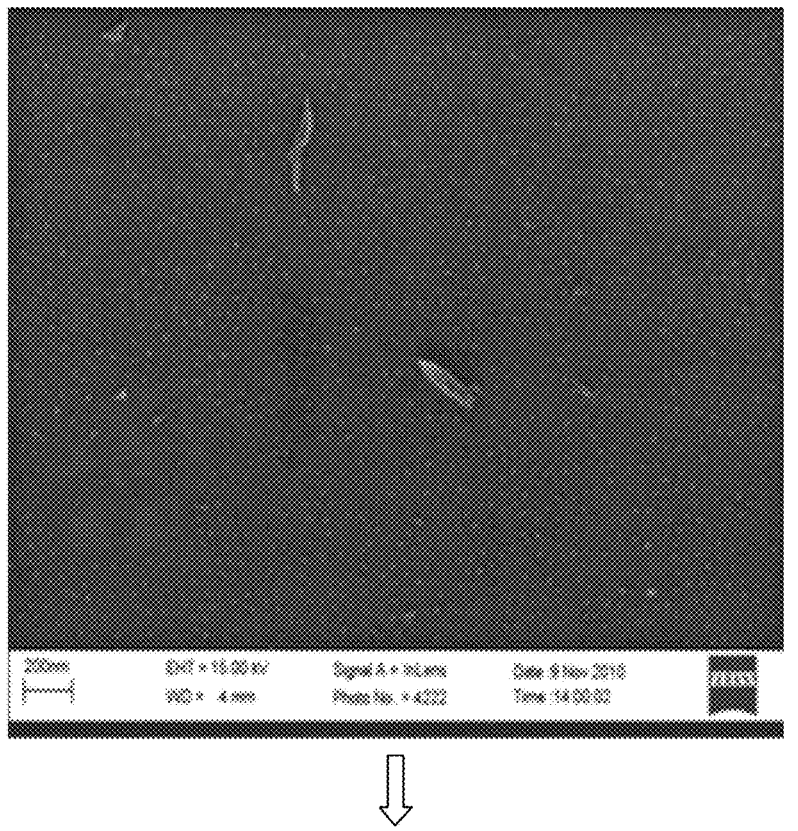
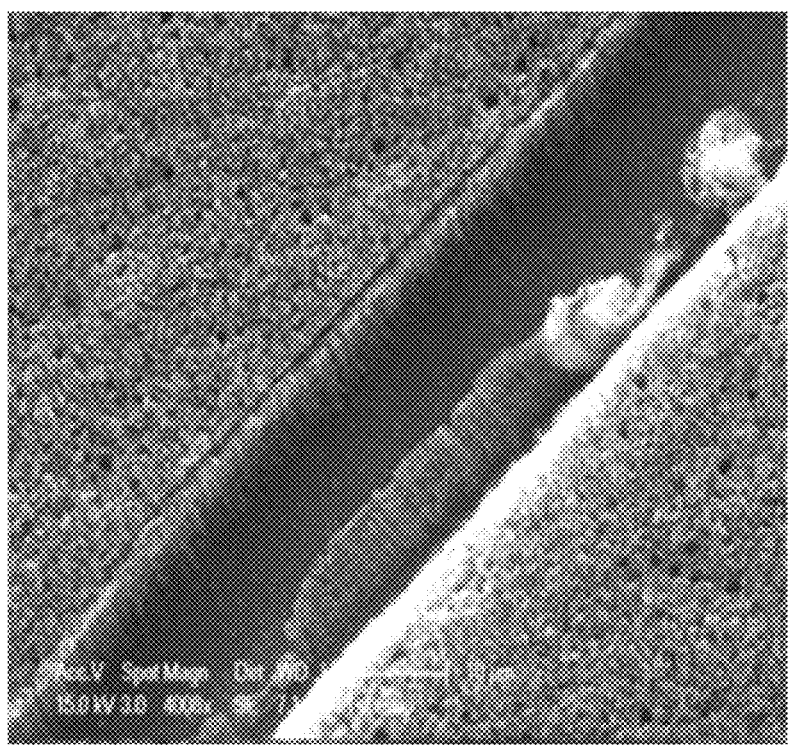
FIG. 22A

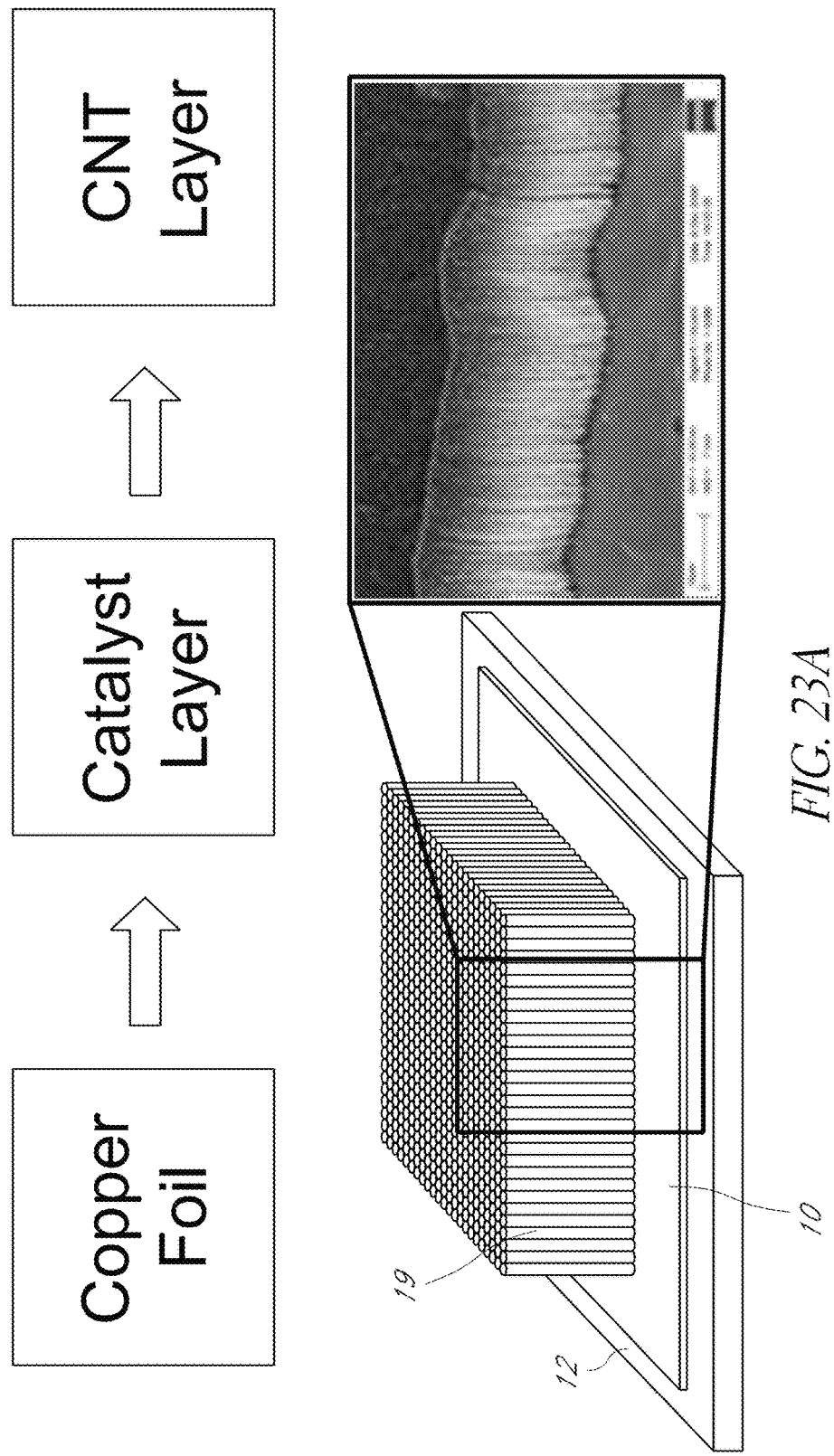

METHODS OF FABRICATING PILLARED GRAPHENE NANOSTRUCTURES

CROSS-REFERENCE TO RELATED APPLICATIONS

This application is a national stage application under 35 U.S.C. § 371 of PCT Application No. PCT/US2013/070615, filed on Nov. 18, 2013, which published in English as WO 2014/078807 A2 on May 22, 2014 and which claims priority benefit of U.S. Patent Application No. 61/728,147, filed on Nov. 19, 2012.

STATEMENT REGARDING FEDERALLY SPONSORED R&D

This work has been supported by the CMMI Division of the National Science Foundation Award: 0800680, the Materials Research Science and Engineering Center (NSF-MRSEC) on Polymers Award: 0213695, and the Nanoscale Science and Engineering Center (NSF-NSEC) on hierarchical manufacturing (CHM), Award: 0531171. The Government has certain rights in this invention

BACKGROUND

Field of the Invention

This invention relates to the graphene based electrodes and applications.

Description of the Related Art

Graphene, a single layer carbon sheet, has attracted extensive attention due to its excellent physical properties, such as quantum electronic transport, a tunable band gap, extremely high mobility and high electromechanical properties. Since the discovery of the first isolated graphene prepared by mechanical exfoliation of graphite crystals, several methods have been developed for formation of graphene, including epitaxial growth on silicon carbide and ruthenium as well as two-dimensional assembly of reduced graphene oxides and exfoliated graphene films.

Graphene films synthesized using exfoliation methods exhibit relatively poor electrical conductivity. For example, the electrical conductivity of exfoliated graphene films is reduced due to poor interlayer junction contact resistance and structural defects that are induced by mechanical stress during exfoliation and reduction processes.

In contrast, graphene films grown by epitaxial processes, such as chemical vapor deposition (CVD), possess high crystalline quality. Furthermore, CVD fabricated graphene films may be made in relatively large areas, enabling the fabrication of wafer level nanoelectronic devices. Examples of such nanoelectronic devices may include, but are not limited to, ultra-capacitors and solar cells.

Recently, large-scale patterned growth of graphene films by CVD on thin nickel layers has been reported [see, e.g., *Nature*, Vol. 475 (2009) 706-710; *Nanoletters*, Vol. 9 (2009) 30-35]. However, despite this progress, there are difficulties in achieving large-area ultra-thin graphene films having small numbers of layers (e.g., 1 layer (monolayer), 2 layers (bi-layers)). Furthermore, there are significant challenges associated with transfer of such graphene films onto a desired substrate without damaging the crystalline quality and film uniformity of the synthesized graphene.

SUMMARY

Certain embodiments disclosed herein include methods of fabricating a graphene film. The fabricated graphene film can comprise between about one layer to about 10 layers of graphene. For example, the graphene film can comprise between about one layer to about 5 layers of graphene. The graphene can extend over an area of at least about 6 cm$^2$. In some embodiments, the graphene can extend over an area less than about 1750 cm$^2$, less than about 1500 cm$^2$, less than about 1000 cm$^2$, less than about 750 cm$^2$, less than about 500 cm$^2$, less than about 350 cm$^2$, less than about 200 cm$^2$, less than about 150 cm$^2$, less than about 100 cm$^2$, less than about 50 cm$^2$, or less than about 25 cm$^2$. In addition, the graphene can have a crystallinity of at least about 95%, at least about 97%, at least about 98%, or at least about 99%.

The method can include providing a substrate, heating the substrate between about 600° C. and about 1100° C. in a chamber, and introducing a carbon source into the chamber at a temperature between about 600° C. and about 1100° C. for about 10 seconds to about 1 minute. In some embodiments, the method can further include depositing a catalyst on the substrate. Depositing the catalyst can comprise depositing a transition metal using an electron-beam evaporator. Additionally, heating the substrate can comprise annealing the catalyst on the substrate between about 600° C. and about 1100° C. Annealing the catalyst on the substrate can comprise annealing for about 2 minutes to about 120 minutes.

In some embodiments, the substrate can be placed inside a silica tube in an Ar+H$_2$ atmosphere. The carbon source can be methane. The substrate can be SiO$_2$/Si. The method can further include cooling the substrate to about room temperature to form the graphene film. Cooling the substrate can comprise cooling at a cooling rate between about 20° C. per min to about 80° C. per minute.

In various embodiments, the method can include applying a polymer over the graphene film. For example, applying the polymer can comprise spin coating a layer of PMMA over the graphene film. The method can include removing the substrate and transferring the graphene film on a different substrate. Removing the substrate can include immersing the substrate and graphene film in a solution, where the substrate dissolves and the graphene film floats on the solution. The solution can be an aqueous HCl solution. Furthermore, the method can include removing the polymer.

Certain embodiments disclosed herein can include methods of fabricating a pillared graphene nanostructure comprising carbon nanotubes on a graphene film. The method can include providing a substrate, depositing a block copolymer on the substrate, and loading a catalyst into the block copolymer. In various embodiments, depositing the block copolymer can comprise dissolving the block copolymer to form a polymer solution, spin coating the solution onto the substrate, and solvent annealing the spin coated solution. The catalyst can comprise ions of a transition metal. In addition, loading the catalyst into the block copolymer can comprise introducing the copolymer into a solution of the catalyst in salt form.

The method can also include introducing the loaded copolymer into a heated atmosphere of Ar+H$_2$, introducing a carbon source into the heated atmosphere of Ar+H$_2$ to form the pillared graphene nanostructure, and cooling the pillared graphene nanostructure. The heated atmosphere can be between about 600° C. and about 1100° C. The carbon source can be introduced for about 5 minutes to about 30 minutes. The carbon source can be C$_2$H$_2$ or CH$_4$.

In some embodiments, the method further includes removing the loaded copolymer from the substrate and transferring the loaded copolymer to a different substrate. The different substrate can comprise a deposited metal layer.

Furthermore, the method can further comprise controlling the size and separation of the carbon nanotubes by controlling the size and separation of the loaded catalyst.

Certain embodiments disclosed herein can include graphene based devices. The device can include a substrate and an electrode disposed on the substrate. The electrode can comprise a graphene film. The graphene film can comprise between about one layer to about 10 layers of graphene and extending over an area of at least about 6 cm$^2$. For example, the graphene film can comprise between about one layer to about 5 layers of graphene. The graphene can extend over an area less than about 1750 cm$^2$, less than about 1500 cm$^2$, less than about 1000 cm$^2$, less than about 750 cm$^2$, less than about 500 cm$^2$, less than about 350 cm$^2$, less than about 200 cm$^2$, less than about 150 cm$^2$, less than about 100 cm$^2$, less than about 50 cm$^2$, or less than about 25 cm$^2$. The graphene can have a crystallinity of at least about 95%, at least about 97%, at least about 98%, or at least about 99%.

In some embodiments, the device can be a dielectric capacitor. The dielectric capacitor can further comprise a dielectric material disposed over the graphene film and a second electrode disposed over the dielectric material. The dielectric material can comprise $Al_2O_3$, $HfO_2$, AlN, or a combination thereof. For example, the dielectric material can comprise $Al_2O_3/HfO_2$ film or AlN nanowires. The second electrode can comprise a second graphene film. The second graphene film can comprise between about one layer to about 10 layers of graphene and extending over an area of at least about 6 cm$^2$. For example, the second graphene film can comprise between about one layer to about 5 layers of graphene. The graphene of the second graphene film can extend over an area less than about 1750 cm$^2$, less than about 1500 cm$^2$, less than about 1000 cm$^2$, less than about 750 cm$^2$, less than about 500 cm$^2$, less than about 350 cm$^2$, less than about 200 cm$^2$, less than about 150 cm$^2$, less than about 100 cm$^2$, less than about 50 cm$^2$, or less than about 25 cm$^2$.

In some embodiments, the device can be an electrochemical capacitor and the electrode is a first electrode. The device can further comprise a second electrode, an electrolyte, and a separator disposed within the electrolyte and between the first electrode and the second electrode. The first electrode can include a first plurality of carbon nanotubes disposed over the graphene film. The carbon nanotubes can be aligned with one another. In addition, the second electrode can include a second plurality of carbon nanotubes disposed over a second graphene film. The carbon nanotubes in the second plurality can be aligned with one another.

In some embodiments, the device can be a dye-sensitized solar cell and the electrode can be a window electrode. The device can further comprise a hole transport material, and a film contact. The window electrode can be a p-n junction and the graphene film can comprise a p-type portion and an n-type portion. For example, the p-type portion can be doped with boron. In some embodiments, the device can also comprise a plurality of carbon nanotubes disposed over the graphene film. The carbon nanotubes can be aligned with one another. In some other embodiments, the device can also include ZnO nanowires disposed over the graphene film. The hole transport material can comprise a photo-excited polymer disposed over the graphene film. The film contact can be disposed over the photo-excited polymer.

In some embodiments, the device can be a multi junction tandem solar cell. The device can further comprise at least one p-n junction or at least one p-i-n junction. The at least one p-n junction or the at least one p-i-n junction can comprise amorphous silicon, crystalline silicon, microcrystalline silicon, or a combination thereof. The substrate can comprise $SiO_2$/Si or quartz glass.

In further embodiments, graphene based bio-mimicking devices are disclosed. The device can include a graphene film comprising between about one layer to about 10 layers of graphene and extending over an area of at least about 6 cm$^2$. The device can further include oligonucleotides, proteins, or inorganic molecules wrapped within the graphene film. As an example, the graphene film can comprise between about one layer to about 5 layers of graphene. The graphene can extend over an area less than about 1750 cm$^2$, less than about 1500 cm$^2$, less than about 1000 cm$^2$, less than about 750 cm$^2$, less than about 500 cm$^2$, less than about 350 cm$^2$, less than about 200 cm$^2$, less than about 150 cm$^2$, less than about 100 cm$^2$, less than about 50 cm$^2$, or less than about 25 cm2. The graphene can have a crystallinity of at least about 95%, at least about 97%, at least about 98%, or at least about 99%. The device of some embodiments can further include nanoparticles, protein, or enzyme groups on a surface of the graphene film. The graphene based bio-mimicking device can be a part of a memory device, photovoltaic cell, or a capacitor.

BRIEF DESCRIPTION OF THE DRAWINGS

FIGS. 6A and 6B disclose example embodiments of graphene based structures that can be used in dielectric capacitors in accordance with certain embodiments described herein.

FIG. 10C is a block diagram of the example device shown in FIG. 10B.

FIG. 10D is a band diagram of the example device shown in FIG. 10B.

FIG. 10E is a schematic illustration of an example of a patterned multi-DSSC device prepared according to certain embodiments of the present disclosure.

FIG. 11A is a schematic illustration of an example of a CVD grown p-n junction graphene film prepared according to various embodiments of the present disclosure.

FIG. 11B is a schematic illustration of an example DSSC device including a CVD grown p-n junction graphene film prepared according to various embodiments of the present disclosure.

FIG. 11C is a schematic representation of an example of a patterned multi-DSSCs device built in a single p-n junction graphene film prepared according to various embodiments of the present disclosure.

FIG. 11D is a schematic representation of an example embodiment of a patterned multi-DSSC device illustrating the composition of the layers of the device.

FIG. 12A is a schematic representation of an example of vertically aligned carbon nanotubes (CNTs) grown on graphene film prepared according to various embodiments of the present disclosure.

FIG. 12B is a schematic representation of an example of a hybrid DSSC device having CNTs/graphene film prepared according to certain embodiments of the present disclosure.

FIG. 12C is a schematic representation of an example of hybrid multi-DSSC devices having CNTs/graphene film prepared according to various embodiments of the present disclosure.

FIG. 14A is a schematic representation of an example of a hybrid DSSC device having ZnO nanowires (NWs) grown on a graphene window electrode prepared according to certain embodiments of the present disclosure.

FIG. 14B is a schematic band diagram of an example hybrid DSSC device having ZnO NWs grown on a graphene window electrode prepared according to certain embodiments of the present disclosure.

FIG. 20C is a schematic top view illustration of an example cylindrical block copolymer patterns. The arrows indicate catalyst ions being loaded into the cylindrical domains. Side lines indicate minor block micro-domains (e.g. polyvinylpyrrolidone (PVP) domains).

FIG. 21A is an SEM image illustrating an initial stage of a growth process for forming carbon nanotubes from a graphene platform according to certain embodiments of the present disclosure.

FIG. 21B is a schematic illustration of an initial stage of the growth process for forming carbon nanotubes from graphene platform according to certain embodiments of the present disclosure.

FIGS. 21C-22D are SEM images illustrating initial stages of the growth process for forming carbon nanotubes from graphene platforms according to various embodiments of the present disclosure.

FIGS. 22A is an SEM micrograph of an example embodiment of CVD grown CNTs using BCP patterned arrays of iron particles as catalysts.

FIG. 23A is an SEM image and a schematic illustration of an example of a synthesized and transferred PGN structure formed according to various embodiments of the present disclosure.

DETAILED DESCRIPTION

Certain embodiments of the present disclosure illustrate systems and methods for fabrication of ultra-thin, large-area graphene films using chemical vapor deposition (CVD) techniques. Some embodiments of the graphene films may be formed that extend over an area of at least about 6 cm2. For example, in various embodiments, the graphene can extend over an area from about 6.45 cm2 (about 1 in$^2$) to approximately wafer scale (e.g., to about 25 cm$^2$, to about 50 cm$^2$, to about 100 cm$^2$, to about 150 cm$^2$, to about 200 cm$^2$, to about 350 cm$^2$, to about 500 cm$^2$, to about 750 cm$^2$, to about 1000 cm$^2$, to about 1500 cm$^2$, or to about 1750 cm$^2$).

In some further embodiments, the graphene films may possess from about one layer to up to about 10 layers of graphene (e.g., about 6 layers, about 7 layers, about 8 layers, or about 9 layers). In certain embodiments, the graphene films may possess about 5 layers or less than about 5 layers of graphene (e.g., about 2 layers, about 3 layers, or about 4 layers). In some embodiments, the graphene film can have a thickness up to about 10 nm (e.g., between about 0.1 nm to about 1 nm, to about 2 nm, to about 3 nm, to about 4 nm, to about 5 nm, to about 6 nm, to about 7 nm, to about 8 nm, to about 9 nm, or to about 10 nm). Furthermore, in various embodiments, the graphene can have a crystallinity of at least about 95%, at least about 97%, at least about 98%, or at least about 99%.

The terms "approximately", "about", and "substantially" as used herein represent an amount equal to or close to the stated amount that still performs a desired function or achieves a desired result. For example, the terms "approximately," "about," and "substantially" may refer to an amount that is within less than 10% of, within less than 5% of, within less than 1% of, within less than 0.1% of, and within less than 0.01% of the stated amount.

Example Method of Fabricating a Graphene Film

Figure 1:
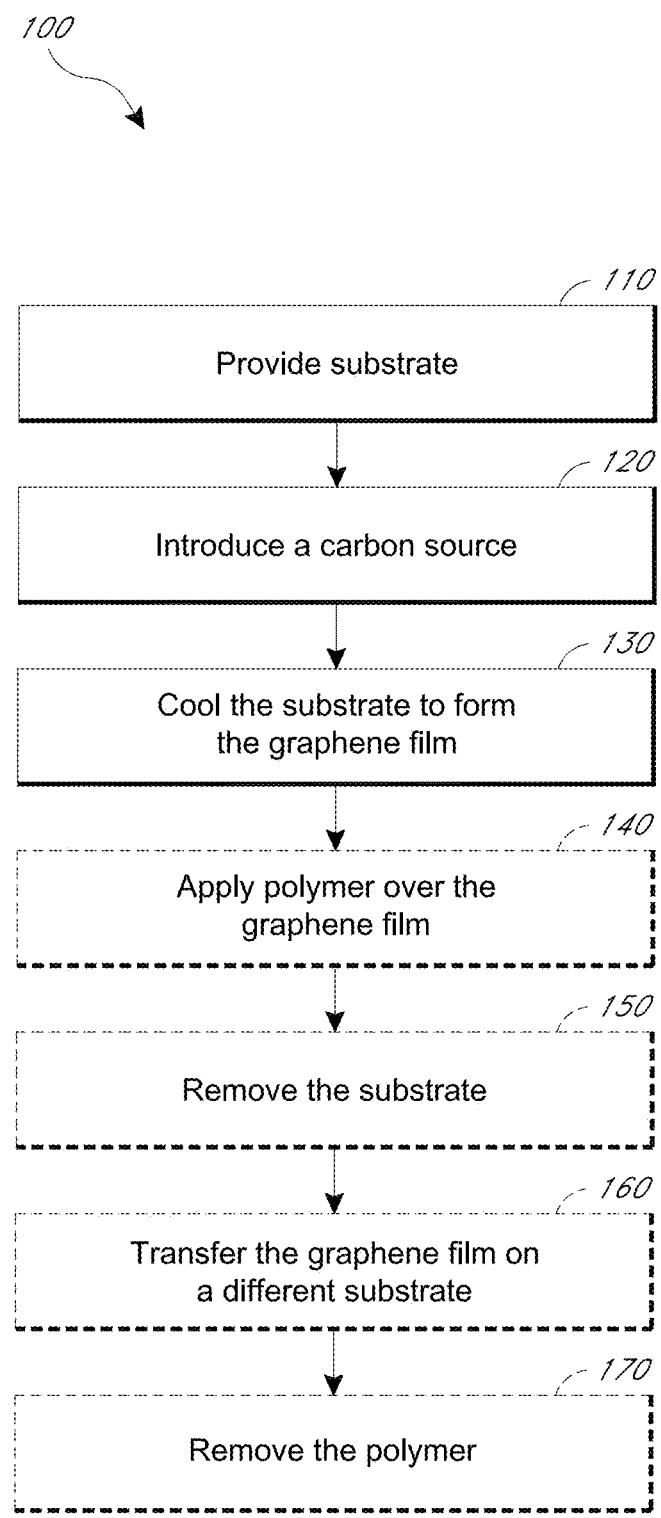
FIG. 1 is a flowchart of an example method of fabricating a graphene film in accordance with certain embodiments described herein.

FIG. 1 is a flowchart of an example method 100 of fabricating a graphene film in accordance with certain embodiments described herein. The method 100 can fabricate a graphene film as described herein and as fabricated and used in various example devices as described herein. The method 100 can include providing a substrate, introducing a carbon source, and cooling the substrate to form the graphene film, as shown in operational blocks 110, 120, and 130 respectively.

With respect to providing a substrate as shown in operational block 110, the substrate can include, but are not limited to, ceramics, metals, semiconductors, polymers, or combinations thereof. The substrate may comprise substantially homogeneous bulk materials. In other embodiments, the substrate may comprise two or more layers of materials having independently selected composition and thickness. In further embodiments, the substrate may comprise composite materials including a bulk matrix and one or more fillers having a selected morphology, including, but not limited to, particles, nanoparticles, fibers, whiskers, and the like. Non-limiting examples may include SiO$_2$/Si, Ge, GaAs, InP, CdTe, CdS, thin steel foils, quartz glass, indium tin oxide (ITO), polyimide films (e.g., 4,4'-opxydiphenylamine, commercially available as Kapton®-DuPont), polyester films (e.g., polyethylene terepthalate (PET), commercially available as Mylar®-DuPont Tejin Films), polymer substrates, metal substrates, carbon fiber composite layers, and synthetic aramid fiber composites (e.g., para-aramid synthetic fibers, commercially available as Kevlar®-DuPont).

The substrate can also include a catalyst such as a deposited metal. The deposited metal can be a transitional metal (e.g., iron, cobalt, nickel, or copper) deposited on the substrate. For example, a metal can be deposited on the substrate via electron-beam (e-beam) evaporation. In some embodiments, the substrate can be heated in a furnace, chamber, or tube to anneal the catalyst. For example the catalyst can be heated to about 600° C. to about 1100° C. for about 2 minutes to about 120 minutes (e.g., at about 1000° C. for about 25 minutes). In some embodiments, the catalyst can be annealed inside a silica or quartz tube in an Ar+H$_2$ atmosphere.

With respect to introducing a carbon source as shown in operational block 120, the introduced carbon source can be methane gas (CH$_4$) or acetylene gas (C$_2$H$_2$). The carbon source can be introduced at a temperature between about 600° C. and about 1100° C. for about 10 seconds to about 1 minute (e.g., at about 900° C. for about 30 seconds). In embodiments where the catalyst was annealed to about 1000° C., the temperature of the furnace, chamber, or tube can be reduced to about 900° C. prior to introducing the carbon source at about 900° C.

With respect to cooling the substrate as shown in operational block 130, the substrate can be cooled to about room temperature to form the graphene film. The cooling rate can be between about 20° C. per min to about 80° C. per minute. For example, the cooling rate can be about 30° C. per min, about 40° C. per minute, about 50° C. per minute, about 60° C. per minute, or about 70° C. per minute.

As shown in FIG. 1, the method 100 can further include applying a polymer over the graphene film, removing the substrate, and transferring the graphene film on a different substrate as shown in operational blocks 140, 150, and 160 respectively. With respect to applying a polymer over the graphene film as shown in operational block 140, the polymer can be deposited, e.g., spin coating a poly(methyl methacrylate) (PMMA) layer, over the graphene film. With respect to removing the substrate as shown in operational block 150, the substrate can be immersed in a solution, e.g., an aqueous HCl solution, where the substrate dissolves or is etched in the solution and the graphene film floats on the solution. The graphene film can then be transferred onto a different substrate, e.g., a desired substrate Examples of the desired substrate may include, but are not limited to, ceramics, metals, semiconductors, polymers, and combinations thereof. In some embodiments, the substrate may comprise substantially homogeneous bulk materials. In other embodiments, the substrate may comprise two or more layers of materials having independently selected composition and thickness. In further embodiments, the substrate may comprise composite materials including a bulk matrix and one or more fillers having a selected morphology, including, but not limited to, particles, nanoparticles, fibers, whiskers, and the like. Non-limiting examples may include SiO$_2$/Si, Ge, GaAs, InP, CdTe, CdS, thin steel foils, quartz glass, indium tin oxide (ITO), polyimide films (e.g., 4,4'-opxydiphenylamine, commercially available as Kapton®-DuPont), polyester films (e.g., polyethylene terepthalate (PET), commercially available as Mylar®-DuPont Tejin Films), polymer substrates, metal substrates, carbon fiber composite layers, and synthetic aramid fiber composites (e.g., para-aramid synthetic fibers, commercially available as Kevlar®-DuPont).

As shown in operational block 170 of FIG. 1, in various embodiments where a polymer is applied over the graphene film, the method 100 can further include removing the polymer. For example, in the example described herein, the PMMA film may be removed from the graphene film in acetone to achieve a large-area graphene on a desired substrate.

Figure 2A:
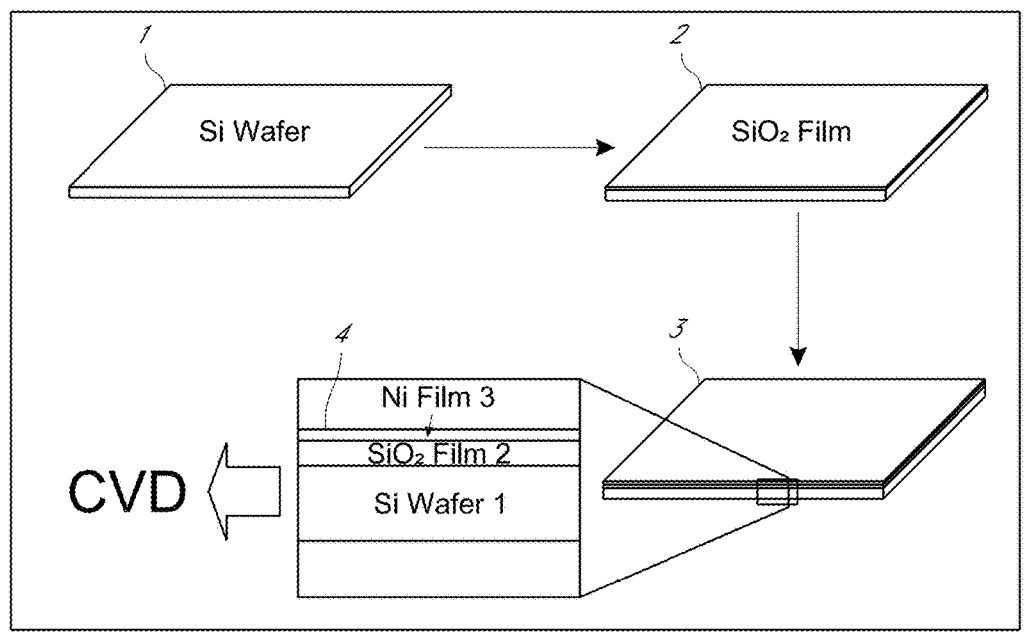
FIG. 2A is a schematic illustration of an example method of preparing substrates for a graphene film in accordance with certain embodiments described herein.

FIG. 2A is a schematic illustration of an example method of preparing substrates for a graphene film in accordance with certain embodiments described herein. For example, the example method can prepare substrates for large area graphene synthesis using a chemical vapor deposition (CVD) technique. As shown in FIG. 2A, the substrate can include a silicon (Si) wafer 1 which can be oxidized to form a silica ($SiO_2$) film 2 over the Si wafer 1. In this example, the substrate can extend over an area of approximately ~2.54 $cm^2$. A thin nickel (Ni) layer 3 (approximately 100 nm or less than about 100 nm) may be deposited on the $SiO_2$ film 2. For example, the Ni layer 3 can be deposited onto the $SiO_2$ film 3 using an electron-beam (e-beam) evaporator to form a Ni/$SiO_2$/Si sandwich structure 4. This sandwich structure 4 can be used as a substrate 4 for fabricating a graphene film using a CVD technique in accordance with certain embodiments described herein.

Figure 2B:
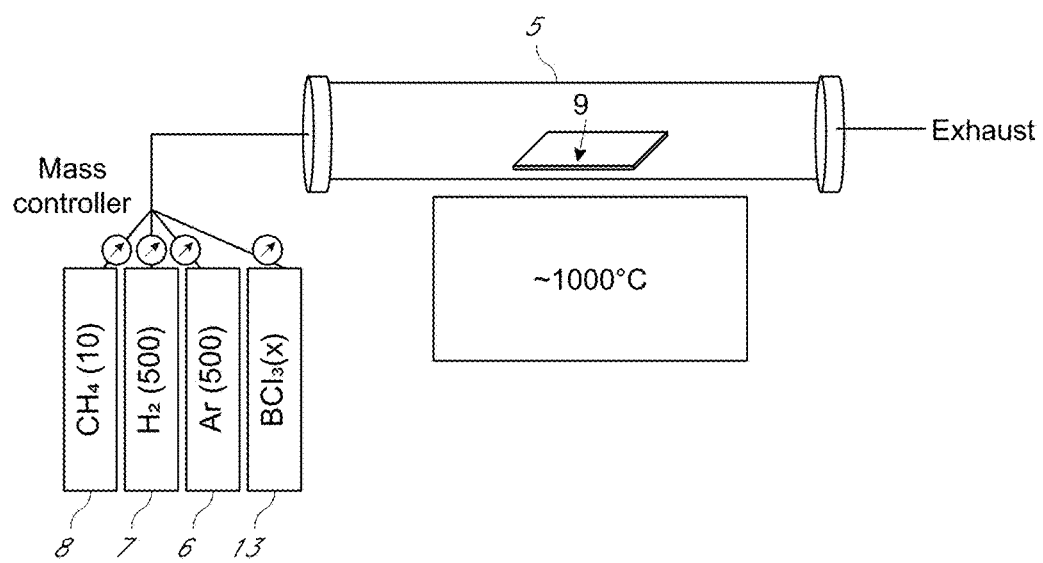
FIG. 2B is a schematic illustration of an example embodiment of an experimental setup for synthesis of a graphene film using a CVD technique in accordance with certain embodiments described herein.

FIG. 2B is a schematic illustration of an example embodiment of an experimental setup for synthesis of a graphene film using a CVD technique in accordance with certain embodiments described herein. The substrate 4 including the Ni layer 3 may be annealed within a furnace or tube. As shown in FIG. 2B, the substrate 4 may be annealed at about 1000° C. inside a quartz tube 5 in an Ar+$H_2$ atmosphere. In the example experimental setup, the substrate 4 can be annealed for about 25 minutes. As shown in FIG. 2B, about 500 standard cubic centimeter per minute (SCCM) of Ar 6 and about 500 SCCM of $H_2$ 7 are introduced into the quartz tube 5 using a mass controller. The temperature may be ramped down to about 900° C. The carbon source 8 may be methane ($CH_4$) gas and may be introduced in the reaction gas mixtures ($CH_4$:$H_2$:Ar=about 10:500:500 SCCM) at about 900° C. for about 30 seconds to deposit a carbon film 9 over the Ni layer 3 of the substrate 4.

Figure 2C:
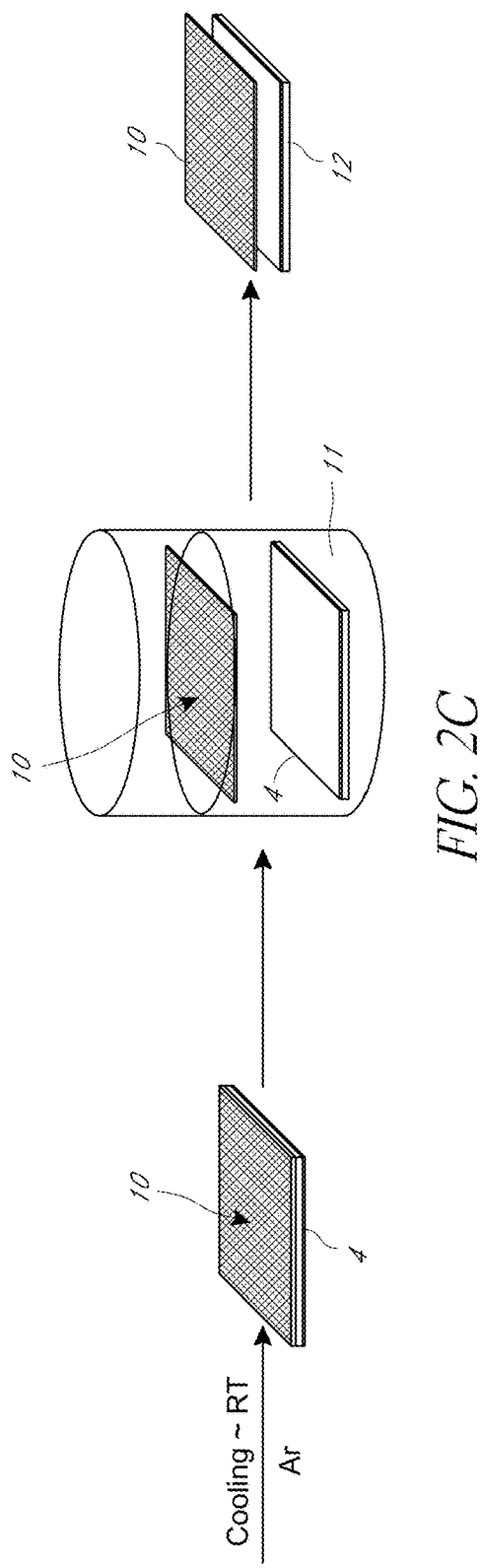
FIG. 2C is a schematic illustration of extraction and transfer of an example embodiment of the synthesized graphene film onto a desired substrate.

FIG. 2C is a schematic illustration of extraction and transfer of an example embodiment of the synthesized graphene film onto a desired substrate. As shown in FIG. 2C, the furnace may be rapidly cooled down at a selected cooling rate to room temperature in a flowing Ar+$H_2$ atmosphere to form the graphene film 10 on the Ni layer 3. For example, the cooling rate may be selected within the range between about 20° C. per min to about 80° C. per min. In some embodiments, as shown in FIG. 2B, a boron source 13 (e.g., $BCl_3$) can also be introduced for boron doping while cooling. Subsequently, in various embodiments, a thin layer of polymer (e.g., PMMA not shown) may be spin coated over the substrate 4 to keep the uniformity of the graphene film 10 substantially intact.

As further illustrated in FIG. 2C, the graphene film 10 deposited on the substrate 4 may be treated to remove the graphene film 10 from the substrate 4. For example, the substrate 4 may be immersed in aqueous HCl solution 11 (e.g., about 3% HCl solution) to dissolve or etch the $SiO_2$ and Ni, permitting the graphene film 10 attached on the PMMA film to float on the solution 11. The graphene/PMMA film may then be transferred on a desired substrate 12. As described herein, the PMMA film may then be removed from the graphene film. As a result, a large-area graphene film on a desired substrate can be achieved.

Figure 3A:
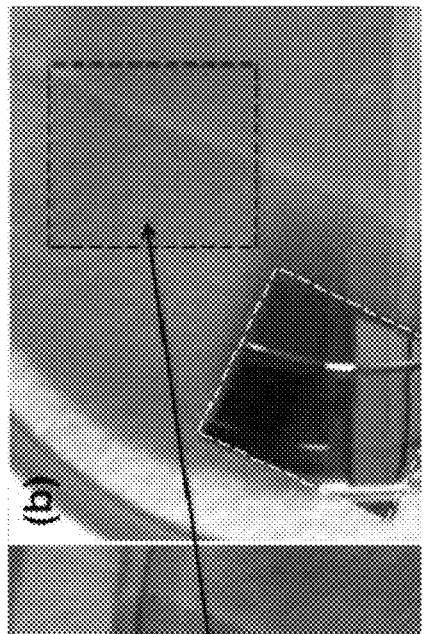
FIGS. 3A-3B are optical images of example embodiments of CVD grown ultra-thin graphene films.
Figure 3B:
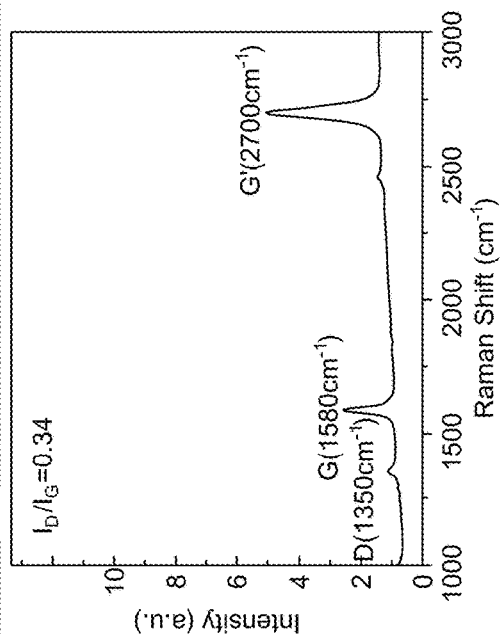
Figure 3C:
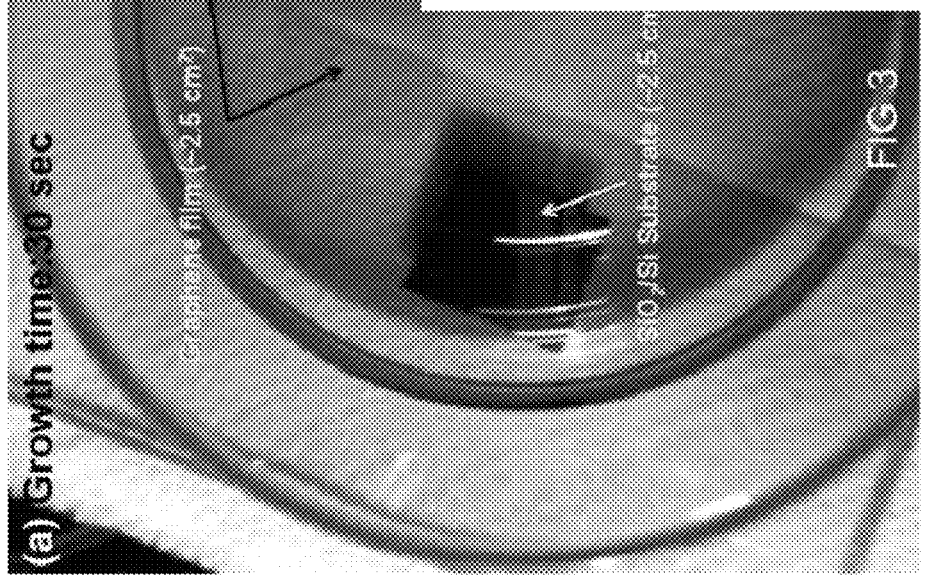
FIG. 3C presents Raman spectroscopy profiles corresponding to the synthesized graphene films of the example embodiments of FIGS. 3A and 3B.

FIGS. 3A-3B are optical images of example embodiments of CVD grown ultra-thin graphene films. For example, the figures show optical images of example embodiments of a graphene film synthesized at about 900° C. for about 30 sec using CVD. The corresponding Raman spectrum of the synthesized graphene film is also illustrated as an inset (FIG. 3C). The low intensity of the disorder-induced D band (about 1350 $cm^-$) was observed by plotting $I_D/I_G$, the D to G (about 1580 $cm^{-1}$) peak intensity ratios, where G denotes the symmetry-allowed graphite band, obtaining $I_D/I_G$ of approximately 0.3. Some weak D band intensity was also observed away from graphene edges, suggesting the existence of sub-domain boundaries in areas with a constant number of graphene layers. The single Lorentzian profile of the G' band (about 2700 cm-1) observed is hallmark of monolayer graphene. It may be seen from the Raman spectrum that the synthesized graphene film is approximately the same in dimension of the donor substrate.

Example Graphene Based Devices

Notably, the quest for improved electronic devices, leading to smaller, faster, and yet cheaper devices, is an engine driving the modern electronic industry. Since the electron transport in graphene is described by the Dirac equation, certain embodiments of the graphene-film material disclosed herein may allow access to quantum electrodynamics in a simple condensed-matter experiment. For example, the high measured carrier mobility in graphene suggests an entirely new concept for possible nanoscale ballistic electronic devices. Electrostatically induced field-effect devices, which are the back-bone of the microelectronic industry, are being also envisioned on graphene, as well as field-effect transistors (FETs) made in graphene.

Figure 4:
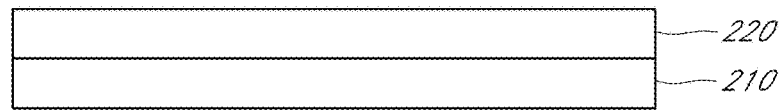
FIG. 4 is an example structure used in a graphene based device in accordance with certain embodiments described herein.

Certain embodiments as disclosed herein include graphene based devices including the structure 200 shown in FIG. 4. The graphene based device can include a substrate 210 and an electrode 220 disposed on the substrate 210. The substrate 210 can include any substrate including but not limited to those as described herein. The electrode 220 can include a graphene film as disclosed herein. For example, the electrode 220 can include a graphene film 220 comprising between about one layer to about 10 layers of graphene. The graphene film 220 can also extend over an area of at least about 6 cm2. In some embodiments, the graphene film comprises between about one layer to about 5 layers of graphene. Also, in some embodiments, the graphene can extend over an area to about 25 $cm^2$, to about 50 $cm^2$, to about 100 $cm^2$, to about 150 $cm^2$, to about 200 $cm^2$, to about 350 $cm^2$, to about 500 $cm^2$, to about 750 $cm^2$, to about 1000 $cm^2$, to about 1500 $cm^2$, or to about 1750 $cm^2$. The graphene can have a crystallinity of at least about 95%, at least about 97%, at least about 98%, or at least about 99%. Various example embodiments of graphene based devices are disclosed herein.

Example Graphene Based Dielectric Capacitors

Even though three-dimensional storage electrodes each having an electrode surface of a hemisphere shape have been applied to nitrogen-oxide (NO) capacitors for dynamic random access memories (DRAM's), which employ a $Si_3N_4$ film currently deposited as a dielectric using di-chloro-silane (DCS), the heights of the NO capacitors are continuously increased so as to secure a sufficient capacitance.

The charging capacitance of a capacitor is proportional to a surface area of an electrode and a dielectric constant of a dielectric material and reversely proportional to a space between the electrodes, the thickness of the dielectric.

Meanwhile, NO capacitors are limited for use in securing a charging capacitance required for a next generation DRAM of no less than 256 Mbit. Accordingly, in order to secure a sufficient charging capacitance, the development of capacitors employing a dielectric film, such as alumina ($Al_2O_3$) or ($HfO_2$) as a dielectric material, has been pursued.

In addition, although $HfO_2$ dielectric films have a dielectric constant of about 20 and are more beneficial than the $Al_2O_3$ dielectric films from a standpoint of securing a charging capacitance, $HfO_2$ dielectric films are problematic in that, because their crystallization temperature is lower than that of the $Al_2O_3$ dielectric films, leakage current is abruptly increased when a subsequent high temperature thermal process of about 600° C. or more is performed. As a result, $HfO_2$ dielectric films are not easily applied to a memory product.

For at least these reasons, $HfO_2/Al_2O_3$ capacitors having a dual dielectric film structures, $HfO_2/Al_2O_3/HfO_2$ capacitors of triple dielectric film structure, and similar devices have been developed. Capacitors may be formed from these materials by laminating a layer of an $Al_2O_3$ film that generates a very low leakage current level and one or two layers of an $HfO_2$ film having a higher dielectric constant as compared to the $HfO_2$ film.

On the other hand, Aluminum nitride (AlN) has been acknowledged as an important ceramic material for the applications as electrical substrates and packaging materials owing to its highest band gap (about 6.2 eV), excellent thermal conductivity (about 0.823-2.0 W/cm K), good electrical resistance, low dielectric loss, high dielectric constant similar to $Al_2O_3$ (about $\varepsilon=9$), high piezoelectric response, and good thermal expansion similar that of silicon (Si), about $4\times10^{-6}$/K.

Although many studies have been reported in literature on carrier transport in graphene field effect devices, certain embodiments disclosed herein discuss the capacitive behavior of graphene. For example, certain embodiments of a graphene based device as disclosed herein include a dielectric capacitor 300. The graphene/insulator/semiconductor back-gate system can be described as a metal-insulator-semiconductor capacitor. However, under electric fields, graphene does not behave as a classical metal contact. Rather, graphene manifests itself as a capacitor.

Figure 5:
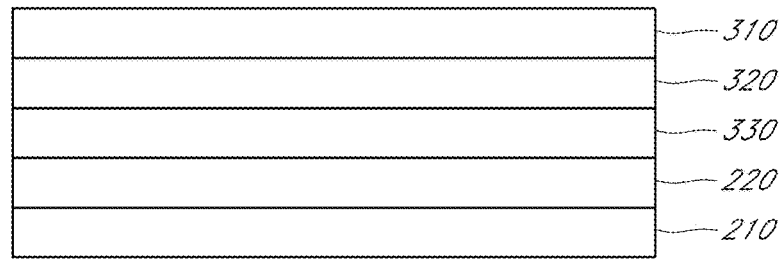
FIG. 5 is an example graphene based dielectric capacitor in accordance with certain embodiments described herein.

As shown in FIG. 5, the dielectric capacitor 300 can include a substrate 210 and an electrode 220 disposed on the substrate 210 as shown in FIG. 4. The substrate 210 can include any substrate including but not limited to those as described herein. The electrode 220 can include a graphene film as disclosed herein. The dielectric capacitor 300 can further comprise a dielectric material 330 disposed over the graphene film 220, and a second electrode 320 disposed over the dielectric material 330.

In various embodiments, the second electrode 320 may be disposed on a second substrate 310. The second electrode 320 may comprise a second graphene film, e.g., a graphene film as described herein. For example, the second graphene film can comprise between about one layer to about 10 layers of graphene and extending over an area of at least about 6 cm2. In some embodiments, the second graphene film comprises between about one layer to about 5 layers of graphene. The graphene of the second graphene film can extend over an area to about 25 $cm^2$, to about 50 $cm^2$, to about 100 $cm^2$, to about 150 $cm^2$, to about 200 $cm^2$, to about 350 $cm^2$, to about 500 $cm^2$, to about 750 $cm^2$, to about 1000 $cm^2$, to about 1500 $cm^2$, or to about 1750 $cm^2$.

The dielectric material 330 can be any dielectric material used in dielectric capacitors, e.g., alumina ($Al_2O_3$), hafnium oxide ($HfO_2$), or aluminum nitride (AlN), or a combination thereof. FIGS. 6A and 6B disclose example embodiments of graphene based structures that can be used in dielectric capacitors in accordance with certain embodiments described herein. The illustrated structures can be used in ultra-capacitors.

FIG. 6A shows a film of $HfO_2/Al_2O_3$ as the dielectric material. As shown in FIG. 6A, a CVD synthesized large-area graphene film 10 (e.g., current collectors) may be transferred on a $SiO_2$/Si wafer 12 for use as a substrate onto which dielectric, thin films 14 of $HfO_2/Al_2O_3$ may be deposited using atomic layer deposition (ALD). Subsequently, another large area graphene film 10 may be transferred over the dielectric film 14 to produce a sandwich like structure 30 as shown in FIG. 6A.

FIG. 6B shows AlN nanowires (NWs) 15 as the dielectric material. AlN nanowires 15 can be synthesized in a CVD furnace using low cost aluminum (Al) as a raw powder. The diameter of the synthesized AlN may be within the range between about 50 nm to about 80 nm. The AlN NWs may be dissolved in ethanol and spin coated on the substrate comprising graphene film 10 over a $SiO_2$/Si wafer 12. A second graphene film 10 may be transferred on the top of the mesh of AlN NWs 15 to produce the sandwich structure shown in FIG. 6B.

Figure 6C:
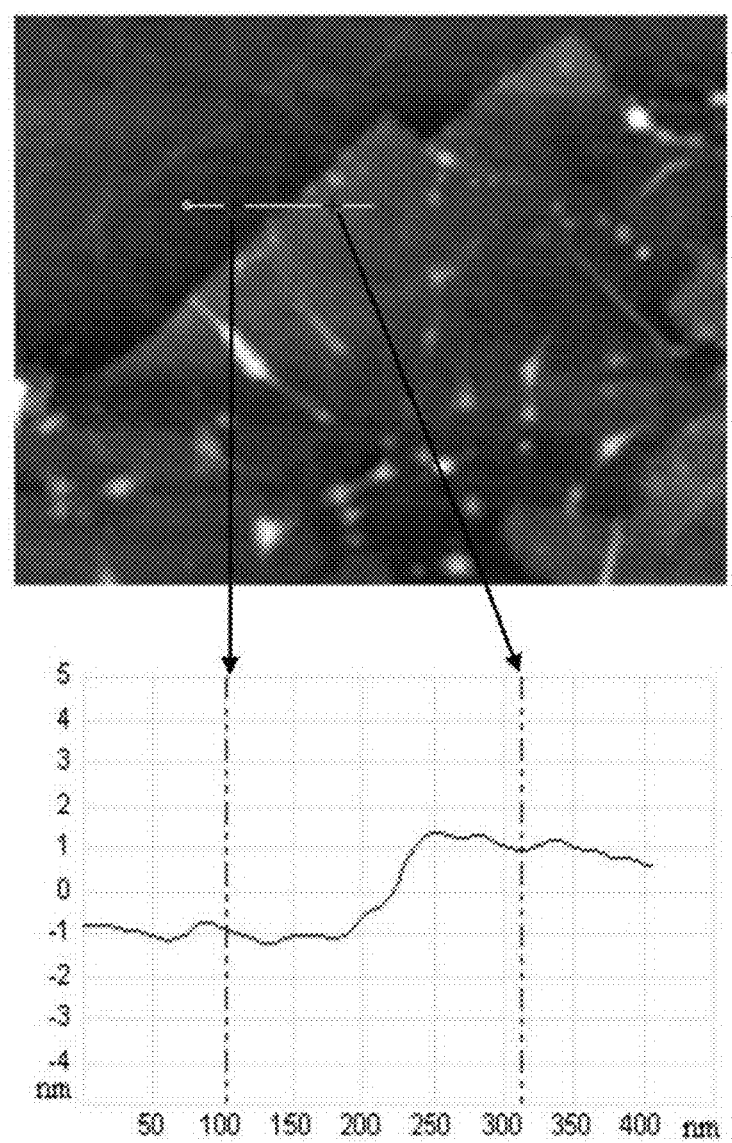
FIG. 6C is an atomic force microscope (AFM) image illustrating the morphology of an example of few layer graphene prepared according to certain embodiments of the present disclosure.

The capacitance of the proposed graphene-based dielectric capacitors may be measured and compared. FIG. 6C is an atomic force microscope (AFM) image illustrating the morphology of an example of few layer graphene prepared according to certain embodiments of the present disclosure. Approximately 2-3 layers, possessing a total thickness of about 1.5 nm, are illustrated.

Figure 6D:
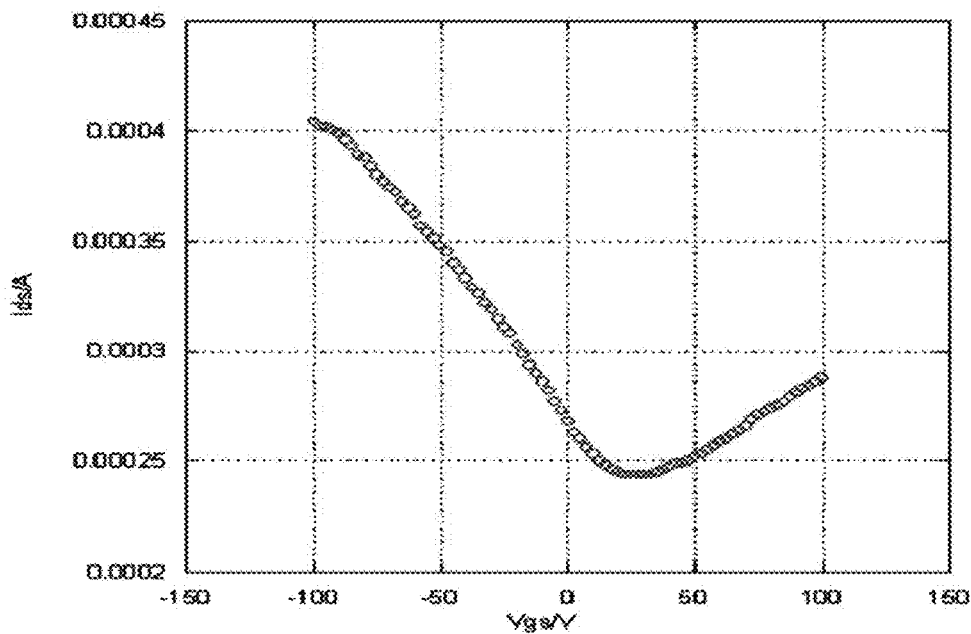
FIGS. 6D-6E are plots illustrating the source-drain current vs. gate voltage ($I_{ds}$-$V_{gs}$) measurements for example graphene structures prepared in accordance with certain embodiments described herein.
Figure 6E:
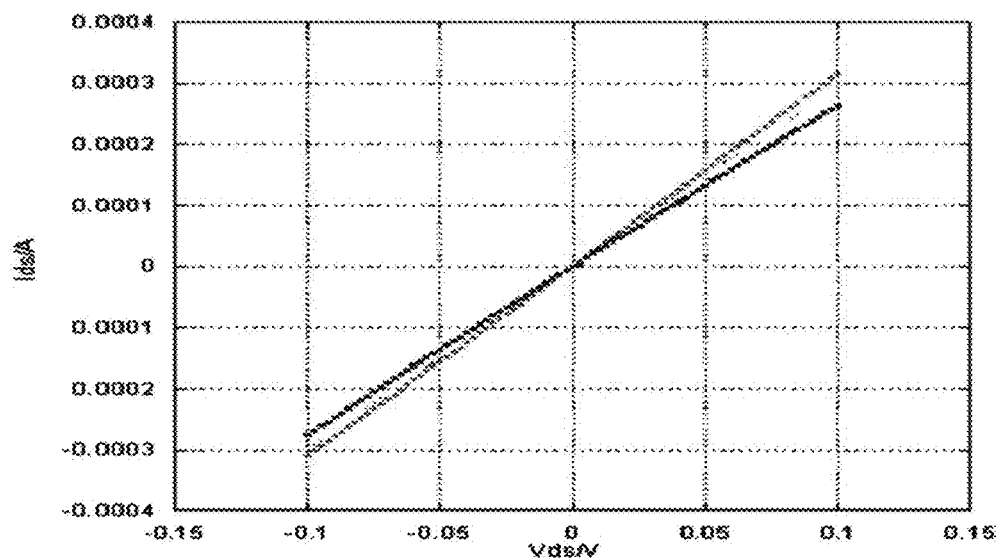

FIG. 6D is a plot illustrating the source-drain current vs. gate voltage ($I_{ds}$-$V_{gs}$) measurements for the example graphene structure prepared in FIG. 6C. The Dirac Voltage of the structure of FIG. 6C is measured to be about 10 V. The measured electron and hole mobility are also found to be different, with the hole mobility found to be much larger than the electron mobility. For example, the electron mobility was measured to be about 695 $cm^2$/Vs, while the hole mobility was measured to be about 1391 $cm^2$/Vs. FIG. 6E shows a plot of the $I_{ds}$-$V_{ds}$ response corresponding to the few layer graphene structure of FIG. 6C. According to the measured $I_{ds}$-$V_{ds}$ response, the sheet resistance is determined to be about 320 $\Omega/cm^2$.

Example Graphene Based Electrochemical Capacitors

Electrochemical capacitors (e.g., supercapacitors, ultracapacitors) are energy storage devices that combine the high energy storage capability of batteries with the high power delivery capability of capacitors. Electrochemical capacitors have been developed to provide power pulses for a wide range of applications including transportation, consumer electronics, medical electronics, and military devices.

For example, electrochemical double layer capacitance (EDLC) devices are electrical energy storage devices that store and release energy by nanoscopic charge separation at the electrochemical interface between an electrode and an electrolyte. It is understood that, as the energy stored is inversely proportional to the thickness of the double layer, these capacitors have a higher energy density compared to conventional dielectric capacitors.

However, improvements in performance (e.g., energy and power densities, safety, cycle life, etc.) of electrochemical capacitors is needed to satisfy increasing performance demands for these applications. For example, the maximum energy ($E_{max}$) and power ($P_{max}$) of an electrochemical capacitor are given by:

$$E_{max}=(CU^2)/2 \qquad \text{Eq. (1)}$$

$$P_{max}=U^2/(4R) \qquad \text{Eq. (2)}$$

where C is capacitance, U is cell voltage, and R is total equivalent series resistance (ESR) of the capacitor. Overcoming limitations of presently available electrodes (e.g., low electrolyte accessibility and low capacitance) and electrolytes (e.g., narrow electrochemical window, flammability, toxicity, volatility, and thermal instability) are needed to develop high performance electrochemical capacitors with high energy and power densities, capable of safe operation, and possessing long lifetimes.

In the past few years, high-surface area activated carbons (ACs) have been used as electrode materials in commercial electrochemical capacitors. While these ACs possess a high specific surface area (1000-2000 $m^2g^{-1}$) they have a limited capacitance due to their relatively low mesoporosity and low electrolyte accessibility. Thus, development of electrode materials having an appropriate balance between surface area and mesoporosity has been a limitation in the development of advanced electrochemical capacitors.

Since their discovery in 1991 [see, e.g., S. Iijima, *Nature* 354 (1991) 56.], carbon nanotubes (CNTs) have become an important class of electrode material for various electrochemical devices, including electrochemical capacitors. In spite of their moderate surface area compared to ACs, CNTs possess relatively high capacitances (e.g., about 102 $F^{g-1}$ for multi-walled nanotubes and about 180 $F^{g-1}$ for single-walled nanotubes) due to their large mesoporosity and high electrolyte accessibility.

Figure 7:
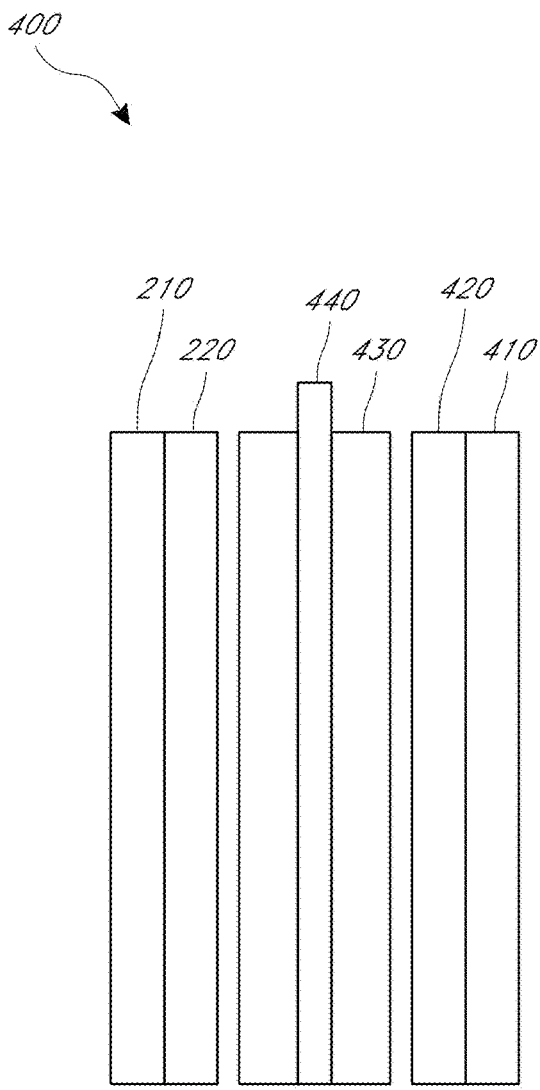
FIG. 7 is an example graphene based electrochemical capacitor in accordance with certain embodiments described herein.

Certain embodiments as disclosed herein include an electrochemical capacitor 400 as shown in FIG. 7. The electrochemical capacitor 400 can include a first substrate 210 and a first electrode 220 disposed on the first substrate 210. The first substrate 210 can include any substrate including but not limited to those as described herein. The first electrode 220 can include a graphene film as disclosed herein. The electrochemical capacitor 400 can further include a second electrode 420. In some embodiments, the second electrode 420 can be disposed on a second substrate 410. The second substrate 410 can include any substrate including but not limited to those as described herein. The second electrode 420 can include a graphene film as disclosed herein. The electrochemical capacitor 400 can further include an electrolyte 430 and a separator 440 disposed within the electrolyte 430 and between the first electrode 220 and the second electrode 420.

Examples of electrolytes for the electrochemical capacitor may include, but are not limited to, NaOH, KOH, $H_2SO_4$, KCl, NaCl, ethylene glycol, $Li_2SO_4$, $LiPF_6$, [EMIM][$Tf_2N$], trihexyl(tetradecyl)phosphonium, bis(trifluoromethylsulfonyl)imide, trihexyl(tetradecyl) phosphonium dicyanamide and other similar electrolytes. For example, ionic liquid [EMIM][$Tf_2N$](1-ethyl-3-methylimidazoliumbis (trifluoromethlsulfonyl)imide) may be used as electrolyte. Embodiments of separators for the electrochemical capacitor may include, but are not limited to, polytetrafluoroethylene (PTFE), filter paper, cellulose membrane, sulfonated tetrafluoroethylene based fluoropolymer-copolymers (e.g. commercially available as Nafion®-DuPont), and regular printing paper. For example, a PTFE (polytetrafluoroethylene) membrane may be used as separator for the electrochemical capacitor.

Figure 8A:
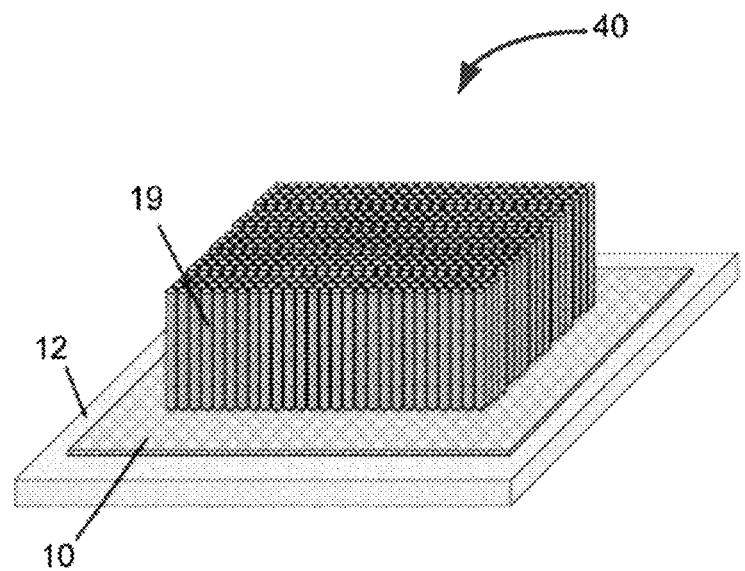
FIG. 8A is a schematic illustration of example structure that can be used in electrochemical capacitors in accordance with certain embodiments described herein.

FIG. 8A is a schematic illustration of example structure that can be used in electrochemical capacitors in accordance with certain embodiments described herein. For example, the example structure can be used in CNT/graphene-based hybrid ultracapacitors. As shown in FIG. 8A, the example structure 40 includes a $SiO_2$/Si wafer substrate 12 and an electrode including a graphene film 10 disposed on the substrate 12. The electrode can further include a plurality of CNTs 19 disposed over the graphene film 10. In some embodiments, a large-area graphene film 10 synthesized by CVD (e.g., a current collector) may be transferred on the $SiO_2$/Si wafer 12. This wafer 12 may be further used as a substrate for the growth of the CNTs 19.

For example, CNTs 19 may be grown on the wafer 12 by first depositing a catalyst on the surface of the wafer 12. Examples of the catalyst may include, but are not limited to, Iron (Fe), Nickel (Ni), Cobalt (Co), Copper (Cu), Tin (Sn), Gold (Au), Rare Earth Metals, metal alloys, and dielectric layers. In some embodiments, the deposition may be performed by a deposition system such as electron beam (e-beam) evaporators and a vacuum sputtering system. The catalyst may be deposited at a thickness within the range between about 1 nm to about 5 nm.

In various embodiments, the CNTs can be aligned with one another. For example, FIG. 8A is a schematic illustration of an example of vertically aligned CNTs 19 on a graphene film 10 prepared according to some embodiments of the present disclosure. In certain embodiments, hybrid ultracapacitors can utilize vertically aligned CNT on graphene as the electrodes to achieve high surface area for the electrolyte accessibility, as well as excellent electron mobility. So configured, various embodiments of CNT/graphene-based hybrid ultracapacitors can exhibit high charge transport capability and, hence, high power density. It is expected that certain embodiments of the CNT/graphene-based hybrid ultracapacitors may demonstrate a relatively high cell voltage, high energy density, and high power density as compared with current electrochemical technologies.

To synthesize vertically aligned CNT 19 arrays by CVD on the graphene film 10, the catalyst coated wafer 12 may be inserted into a furnace (e.g., quartz tube furnace) at a temperature selected within the range between about 150° C. to about 600° C. in air for a time period within the range between about 1 min to about 20 min. Subsequently, a mixture of gases may be injected into the furnace at a temperature selected within the range between about 600° C. to about 1100° C. (e.g., about 750° C.), and for times within the range between about 5 min to about 30 min (e.g., about 10 minutes, about 15 minutes, about 20 minutes, or about 25 minutes), to grow aligned CNTs 19 on the graphene film 10. The length of the CNTs 19 can be controlled depending the growth time.

The gas mixture may include argon (Ar), hydrogen ($H_2$), and methane ($CH_4$). Ar may be provided in a concentration ranging between about 50% to about 90% on the basis of the total volume of the gas mixture. $H_2$ may be provided in a concentration ranging between about 20% to about 50% on the basis of the total volume of the gas mixture. $CH_4$ may be provided in a concentration ranging between about 2% to about 30% on the basis of the total volume of the gas mixture. For example, the gas mixture may comprise about 50% Ar, about 30% $H_2$ and about 20% $CH_4$.

Figure 8B:
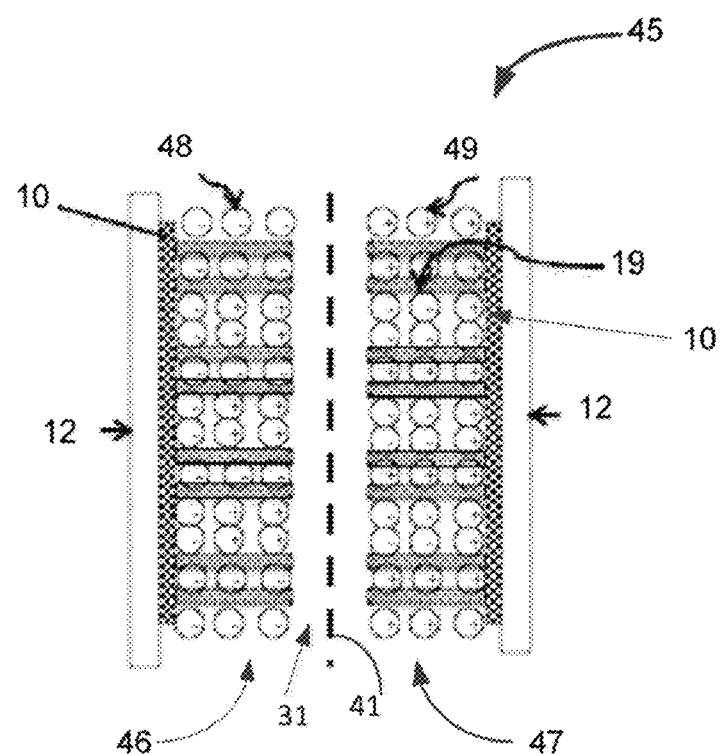
FIG. 8B is a schematic illustration of an example electrochemical capacitor device comprising CNTs/graphene film electrodes prepared according to certain embodiments of the present disclosure.

FIG. 8B is a schematic illustration of an example electrochemical capacitor device comprising CNTs/graphene film electrodes prepared according to embodiments of the present disclosure. The device can be an ultracapacitor. As shown in FIG. 8B, the device 45 can include an anode 46 and a cathode 47. The anode 46 can include a first electrode comprising a graphene film 10 disposed on a $SiO_2$/Si wafer substrate 12. The cathode 47 can also include a graphene film 10 disposed on a $SiO_2$/Si wafer substrate 12. Both the anode 46 and cathode 47 can include a plurality of carbon nanotubes 19 disposed over the graphene film 10. As described herein, the carbon nanotubes 19 can be aligned with one another. In various embodiments, the CNTs 19 are vertically aligned (with respect to the top surface of the substrate).

The electrochemical capacitor 45 can further include an electrolyte 31 and a separator 41 disposed within the electrolyte 31 and between the two electrodes 46 and 47. For example, the separator 41 can be a PTFE membrane soaked in the electrolyte 31 and sandwiched between two CNTs 19/graphene 10/$SiO_2$/Si wafers 12 to fabricate the example cell assembly 45 as shown in FIG. 8B. The cell may be further packed with two polypropylene plates and sealed, e.g., with epoxy (not shown).

Without being bound by theory, improvements in the capacitance of embodiments of the disclosed electrodes may be achieved due to the small inner diameters of the CNTs 19 on the graphene film 10. For example, this design provides the ionic liquids (ILs) (e.g., IL anions 48 and IL cations 49) with access to both the external and internal surfaces of CNTs 19 and enhances the overall surface area. Thus, improved double-layer capacitance for the fabricated electrode, as illustrated in FIG. 8B, is provided.

Example Graphene Based Solar Cells

Photo-electrochemical solar cells are more evolved from first- and second-generation solar cells as they do not rely on traditional p-n junctions to separate electrons/holes. As discussed in detail below, embodiments of a carbon-based, photo-electrochemical solar cell have also been developed from p-type amorphous carbon a-C obtained from camphor.

Fullerene (C60) and CNTs have been intensively studied in photo-electrochemical solar cells as photoactive electrodes. Moreover, dye-sensitized solar cells (DSSCs), a special type of photo-electrochemical solar cell, are extremely promising owing to their relatively low cost and ease of manufacture. In a typical liquid-state DSSC, the dye works to absorb energy and to provide the current. A wide band gap semiconductor (e.g. $TiO_2$) positioned in a conduction band between the anode and an electrolyte, may separate the charge. In this process, a redox reaction is catalyzed by a counter electrode, which combines sufficient conductivity and thermal stability as well as corrosion resistance and electrocatalytic activity.

Over the past decades, indium tin oxide (ITO) and fluorine tin oxide (FTO) have been widely used as window electrodes in optoelectronic devices, especially in organic and dye-sensitized solar cells. However, these metal oxides have some disadvantages. For example, indium (In) is relatively rare and is in limited availability. Furthermore, both ITO and FTO are unstable in the presence of acids or bases. Additionally, both ITO and FTO are susceptible to ion diffusion into polymer layers and exhibit limited transparency in the near-infrared region. Also, FTO devices exhibit current leakage caused by FTO structure defects. For at least these reasons, there is a continued need for electrode materials that exhibit one or more of good stability, high transparency, and excellent conductivity to improve the performance of optoelectronic devices.

Figure 9:
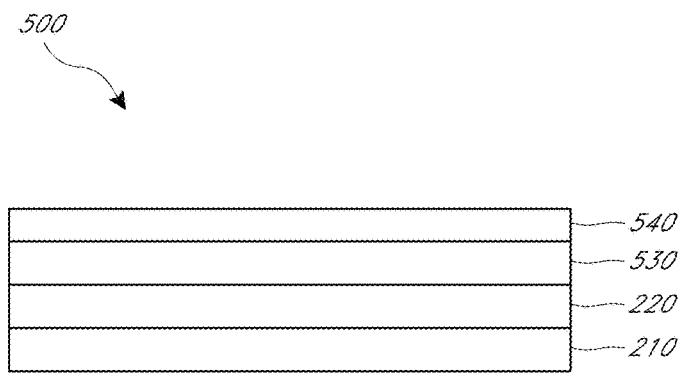
FIG. 9 is an example graphene based solar cell in accordance with certain embodiments disclosed herein.

FIG. 9 shows an example graphene based solar cell 500 in accordance with certain embodiments disclosed herein. The solar cell 500 can be a dye-sensitized solar cell and can include a substrate 210 and an electrode 220 disposed on the substrate 210. The substrate 210 can be any substrate including but not limited to those described herein. The electrode 220 can include a carbon film, e.g., a graphene film as disclosed herein.

For example, carbon nanotube networks can be used as transparent conductors in organic solar cells. The nanotube networks are flexible and can be deposited on surfaces a variety of ways. With treatment, nanotube films can also be highly transparent in the infrared, possibly enabling efficient low band gap solar cells.

The beneficial characteristics of carbon films as window electrodes include:
 (i) excellent conductivity,
 (ii) good transparency in both the visible and near-infrared regions,
 (iii) ultra-smooth surface with tunable wettability, and
 (iv) high chemical and thermal stabilities.

In accordance with certain embodiments described herein, ultra-thin graphene films can be an alternative to metal oxides (e.g., ITO, FTO, etc.) for use as window electrodes for solid-state DSSCs. Moreover, monolayer graphene is highly transparent owing to its small thickness (e.g., only one atom thick). For example, monolayer graphene absorbs about 2.3% of incident white light. Graphene is also highly conductive and extremely strong. Graphene films (e.g., films having a thickness selected within the range between about 1 nm to about 10 nm obtained from thermally reduced graphite oxide) have been found to exhibit a relatively high conductivity of about 550 S/cm (about 1250 S/cm for polycrystalline graphite) and a transparency of more than about 70% over wavelengths within the range between about 1000 nm to about 3000 nm. These remarkable electronic and optical properties qualify graphene as a window electrode for applications in solar cells.

As shown in FIG. 9, the solar cell 500 can further include a hole transport material 530 and a film contact 540. The hole transport material 530 can include one or more photo-excited polymers disposed over the graphene film. In some designs, the photo-excited polymer of the hole transport material 530 may be employed as the active layer to cover the IR and the UV solar spectra. Examples of the photo-excited polymer may include, but are not limited to, P3HT, P3OT, and MHE-PPV (e.g., P3HT:PCBM). By employing a photo-excited polymer blend, such as P3HT:PCBM, it is possible to harvest the low energy photons that can pass through, without exciting any particles which is a desirable factor for a DSSC. The film contact 540 may be further fabricated on top of the hole transport material 530. Examples of the film contact may include, but are not limited to, $CaF_2$, $LiF_4$, and other similar films.

Figures 10A, 10B:
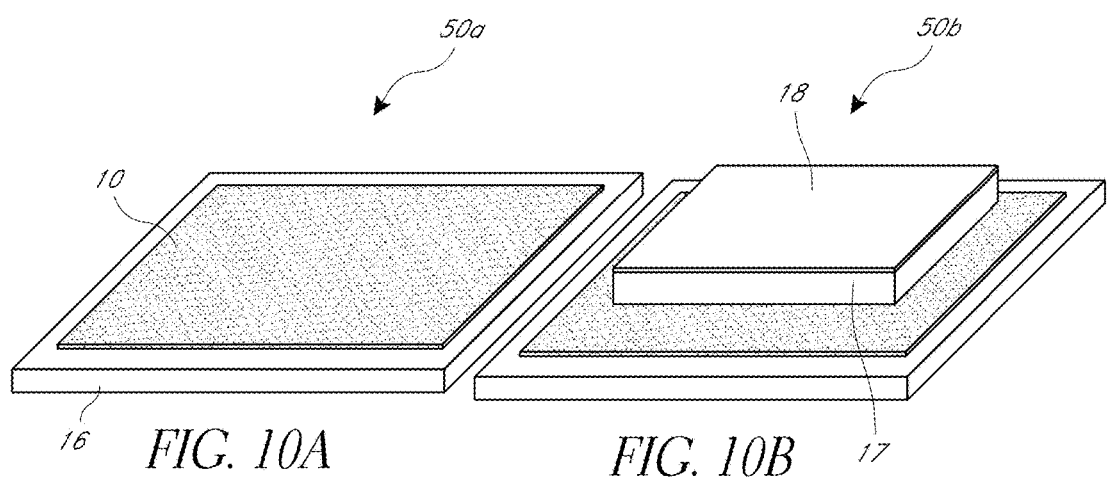
FIG. 10A is a schematic illustration of an example of a CVD grown graphene film prepared according to various embodiments of the present disclosure.
FIG. 10B is a schematic illustration of an example of dye-sensitized solar cell (DSSC) device prepared according to various embodiments of the present disclosure.

FIG. 10A is a schematic illustration of an example of a CVD grown graphene film prepared according to various embodiments of the present disclosure. A large area graphene film 10 can be disposed on a quartz glass 16.

FIG. 10B is a schematic illustration of an example solar cell device 50*b* prepared according to various embodiments of the present disclosure. The solar cell device can be dye-sensitized solar cell (DSSC) device using the CVD synthesized large-area graphene 10 as a window electrode. The graphene film 10 is disposed over a quartz glass substrate 16 (e.g., aluminosilicate glass). As a hole transport material, a mixture of P3HT and PCBM 17 may be spin coated on the graphene film 10 as a anode. A $LiF_4$/Al film contact 18 (as a cathode) can be fabricated on the top of the P3HT+PCBM layer 17. It may be noted that, in optoelectronic devices, proper contact between electrode and p/n type material can be essential for charge collection, which is excellent in this proposed design. Corresponding block and band diagrams of the fabricated DSSC are shown in FIGS. 10C and 10D. As shown in FIG. 10C, a graphene film 10 is disposed over the aluminosilicate glass 16. PEDOT:PSS 17*a* and P3HT:PCBM 17*b* are disposed over the graphene film 10 as a photo-excited polymer. The film contact including lithium fluoride (LiF$_4$) 18a and aluminum (Al) 18b are disposed over the photo-excited polymer P3HT:PCBM 17b.

Figure 10F:
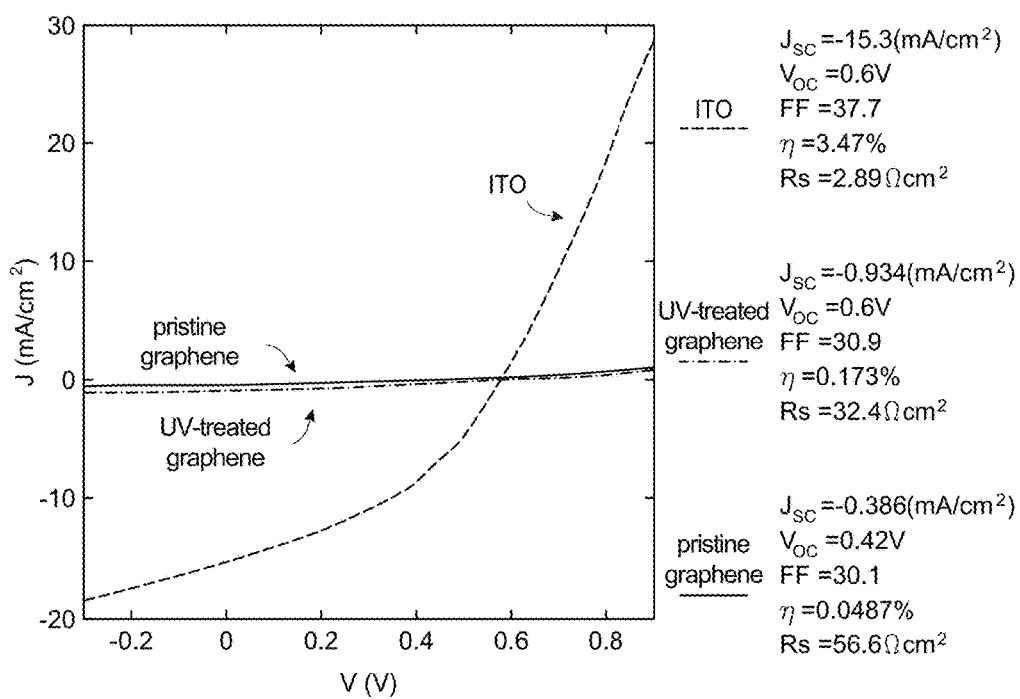
FIG. 10F is a plot comparing the J-V response of solar cell devices respectively comprising ITO, pristine, plasma-cleaned graphene, and UV-treated graphene as the anode electrode in graphene-based devices being prepared according to certain embodiments of the present disclosure.

In addition, FIG. 10E is a schematic illustration of an example of a patterned multi-DSSC device prepared according to certain embodiments of the present disclosure. An array 50d of DSSC devices can be produced on a single large-area graphene electrode to achieve maximum efficiency of energy conversion. In FIG. 10F, the J-V characteristics of three different solar cells are given; the J-V measurement result of solar cell device having ITO as the anode electrode, the J-V measurement result of the solar cell device having pristine graphene as the anode electrode, and the J-V measurement result of solar cell device having UV-treated graphene as the anode electrode.

With further reference to the example solar cell shown in FIG. 9, the window electrode 220 can be a p-n junction and the graphene film can include a p-type portion and an n-type portion. In current solid-state semiconductors, a solar cell is made from two doped crystals, one doped with n-type impurities (n-type semiconductor), which has extra free electrons, and the other doped with p-type impurities (p-type semiconductor), which is lacking free electrons. When placed in contact, some of the electrons in the n-type portion will flow into the p-type to "fill in" the missing electrons, also known as an electron hole. Eventually enough will flow across the boundary to equalize the Fermi levels of the two materials. The result is a region at the interface, the p-n junction, where charge carriers are depleted and/or accumulated on each side of the interface. Moreover, the advantage of such n-p junctions is that less scattering of electrons is expected when electrons are tunneled through p-type oxide as electrons are the minority carriers. When placed in the sun, photons in the sunlight can strike the bound electrons in the p-type side of the semiconductor, giving them more energy, a process known technically as photoexcitation. In silicon, sunlight can provide enough energy to push an electron out of the lower-energy valence band into the higher-energy conduction band.

In fact, CNT networks and intrinsic graphene films as well as other traditional transparent conductors are exclusively n-type. Thus, the availability of a p-type transparent conductor could lead to new cell designs that simplify manufacturing and improve efficiency.

In certain embodiments, doping can be an approach to tailor the electronic properties of the semiconductor materials. For example, after doping with N or B atoms, carbon nanotubes (CNTs) may become n-type or p-type, respectively. Doping can also dramatically alter the electrical properties of graphene. Substitutional doping can modulate the band structure of graphene, leading to a metal-semiconductor transition.

In certain embodiments of the present disclosure, a p-n junction graphene electrode system and methods of fabrication are presented in FIGS. 11A-11D. For example, these electrodes may be employed as window electrodes in DSSCs. As shown in FIG. 11A, a CVD grown large-area p-n junction graphene film can be prepared on a quartz glass substrate 16. The window electrode can be a p-n junction 52 and the graphene film can include a p-type portion 54 and an n-type portion 53.

An in-situ substitutional boron (B)-doped p-type graphene film 54 may be synthesized using CVD and attached with the intrinsic n-type graphene film 53 to fabricate p-n junction 52 graphene electrode for solar cell devices. In certain embodiments, the presence of B catalyzes the graphitization process. The maximum concentration of boron that can be substitutionally positioned in the graphite lattice is about 2.35 at. %. The presence of boron as a substitutional species results in a contraction of the $d_{002}$ spacing. However, the presence of B as an interstitial species restricts ordering of carbon layer planes. In the case of B-doped graphites, interstitial B leads to expansion of the c-axis, while substitutional B leads to c-axis contraction. The B-C bond is about 0.5% longer than the C-C bond resulting in significant relaxation of the structure of B-doped bilayer dominating its energetics. Moreover, the interplanar separation reduces by almost 2.7% in B-doped bilayer graphene that leads the probability of achieving thinnest graphene film in a large scale.

An ex-situ B doping may provide interstitial B atoms in graphene film. Thus, interestingly, in-situ B doping of graphene film in CVD provides two major advantages: (i) synthesis of substitutionally B-doped p-type graphene film and (ii) ultra-thin film uniformity of graphene in a large-scale wafer due to the c-axis contraction of carbon lattice during graphitization process.

In-situ B-doped p-type graphene electrode: A BCl$_3$ gas cylinder 13 can be plugged in the CVD system. See e.g., FIG. 2B. The vapor pressure of boron tri-chloride (BCl$_3$) at room temperature is sufficient to drive a mass flow controller. Therefore, the flow of BCl$_3$ may be controlled directly by a mass controller during the B-doped graphene growth in-situ. During the flow of mixture gases such as those described above (e.g., Ar:H$_2$:CH$_4$=500:500:10 SCCM) in the quartz tube at temperatures selected within the range between about 600° C. to about 1100° C., the reactant species carbon absorbed on the Ni film on SiO$_2$/Si substrates as shown in FIG. 2B. Carbon atoms precipitated out of the Ni film to form graphene film during the cooling of the substrate to room temperature. The BCl$_3$ gas can be introduced right at the time of cooling step begins. Thus, B atoms can substitute carbon atoms during the graphene film formation on the Ni film during cooling. The amount of substituted B atoms (up to about 20%) can be tuned by the amount of BCl$_3$ gas supplied as well as the reaction time and temperature. The B-doped graphene can be characterized using Raman spectroscopy and XPS profiles depending on the process conditions.

Finally, a sandwich p-n junction 52 graphene film can be fabricated by transferring the synthesized B-doped graphene film 54 on intrinsic n-type graphene film 53, as shown in FIG. 11A. By applying proper light trapping schemes, hybrid DSSCs can be produced with high efficiency as shown in FIGS. 11A-11D, similar to the procedure described above. For example, a photo-excited polymer 17 (e.g., P3HT/PCBM) can be disposed over the p-type graphene film 54, and a film contact 18 (LiF$_4$/Al) can be disposed over the photo-excited polymer 17. The corresponding block diagram of this DSSC 55d is shown in FIG. 11D.

Besides the selection of materials for different components of a DSSC, the device design also plays a significant role in device performance. Thus, different cell designs for DSSCs are illustrated this disclosure.

One dimensional (1-D) nanostructures are promising for photovoltaic devices due to several performance and processing benefits, such as a direct path for charge transport and large surface areas for light harvest offered by the geometry of such nanostructures. For example, the mobility of electrons in 1-D nanostructures is typically several orders of magnitude higher than that in semiconductor nanoparticle films commonly used in DSSCs.

By combining optical transparency with a large surface for dye loading, the introduction of a nanoparticle (NP) film (such as TiO$_2$) or nanorod/tube arrays (such as ZnO and CNTs) may be used to fabricate DSSCs. The NP film exhibits relatively slow electron diffusion, matched by the exceedingly slow charge interception by adjacent reduction-oxidation (redox) couple iodine ($I^-/I3^-$).

Even sixteen years after its inception, a complete understanding of the competition between transport of the electron through the nanoparticle and nanorod/tube versus interception by reduction-oxidation (redox) couple iodine ($I^-/I3^-$), which is important to the efficient operation of existing DSSCs, remains elusive. While the NP and/or nanorod/tube film is still present in the most efficient DSSCs to date, new materials and nanoscale architectures are attracting attention. Thus, embodiments of several alternative architectures for improving the efficiency of DSSCs are discussed here.

With further reference to the example solar cell shown in FIG. 9, the electrode 220, e.g., the window electrode, can further include a plurality of carbon nanotubes (CNTs). For example, FIG. 12A is a schematic representation of such a structure and can be used in DSSC devices. As shown in FIG. 12A, the example structure 60a includes quartz glass 16, graphene film 10 disposed over the quartz glass 16, and carbon nanotubes 19 disposed over the graphene film 10.

Windows/back electrodes made from CNTs can be yet another important application in solar cells. Thin, transparent layers comprising bulk metallic CNTs have been proposed for providing lateral (in-plane) electrical conductivity for collecting current from the front surface of thin-film solar cells. The thickness of the CNT films would be chosen so that the layer would contribute to the lateral electrical conductivity, yet would be as nearly transparent as possible to incident light.

Furthermore, among donor-acceptor-type used in organic solar cells so far, a promising material combination is poly(3-octylthiophene)(P3OT), poly(3-hexylthiophene) (P3HT) and fullerene derivative (6,6)-phenyl C61-butyric acid methyl ester (PCBM). PCBM can form film-like structures with high electron mobility. Investigation of carbon-based organic solar cells has been conducted towards developing alternative low-cost, lightweight, flexible devices.

Two carbon materials, fullerenes (C60) and CNTs, are generally involved, particularly by combining with p-conjugated polymers serving as photo-active materials. It understood that C60 is a stronger electron acceptor and is more efficient in charge separation. Semiconducting CNTs can be a suitable replacement for C60 by forming ideal heterojunctions. Work function (F) of CNTs is in the range of 4.5-5.1 eV, which is close to the valence band of P3OT/P3HT. Therefore, CNTs can help to improve exciton dissociation by providing field at the CNTs/polymer interface and provide efficient hole or electron transportation.

In accordance with certain embodiments, the carbon nanotubes 19 can be aligned with one another. For example, as shown in FIG. 12A, vertically aligned CNTs 19 (electron transportation) grown on ultra-thin and/or large area graphene film 10 (back electrode as electron collector) can be considered as an alternative to metal oxides window electrodes (ITO, FTO, etc.) for solid-state DSSCs.

In some embodiments of the synthesis of vertically aligned CNTs 19 on graphene film 10 using CVD technique discussed above, a large-area graphene film 10 may be transferred on a substrate 16 (e.g., quartz glass) that is used as a substrate for CNT 19 growth. Vertically aligned CNT arrays 19 may be synthesized by CVD on graphene film 10 that were pre-deposited with approximately 3 nm thick iron (Fe) catalysts using E-beam evaporator. The catalyst coated substrate may be inserted into quartz tube furnace and held at about 450° C. in air for about 15 min, followed by flowing a mixture of gases of about 50% Ar, 30% $H_2$ and 20% $CH_4$ between about 600° C. to about 1100° C. (e.g., at about 750° C.) for about 5-30 min to grow aligned CNTs 19 on the graphene film 10 as shown in FIG. 12A.

Figure 12E:
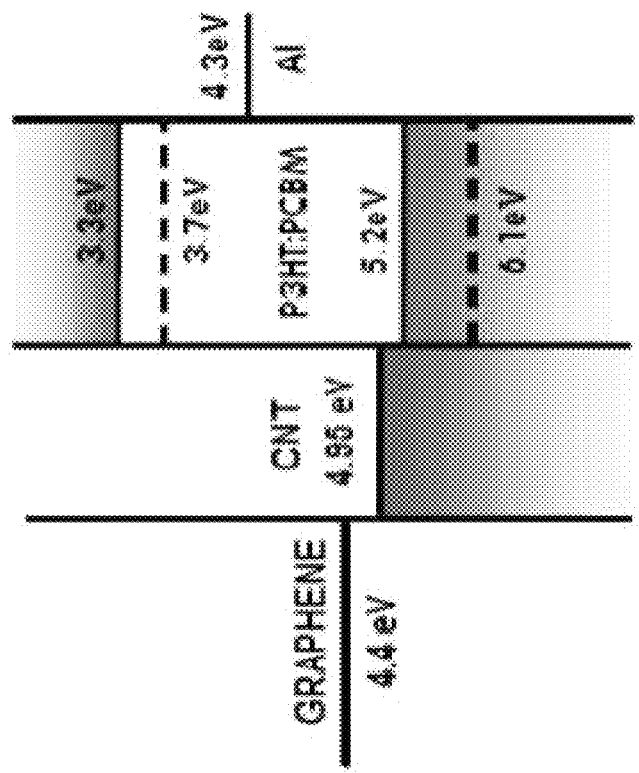
FIG. 12E is a schematic band diagram of an example DSSC device having CNTs/graphene film prepared according to various embodiments of the present disclosure.
Figure 12D:
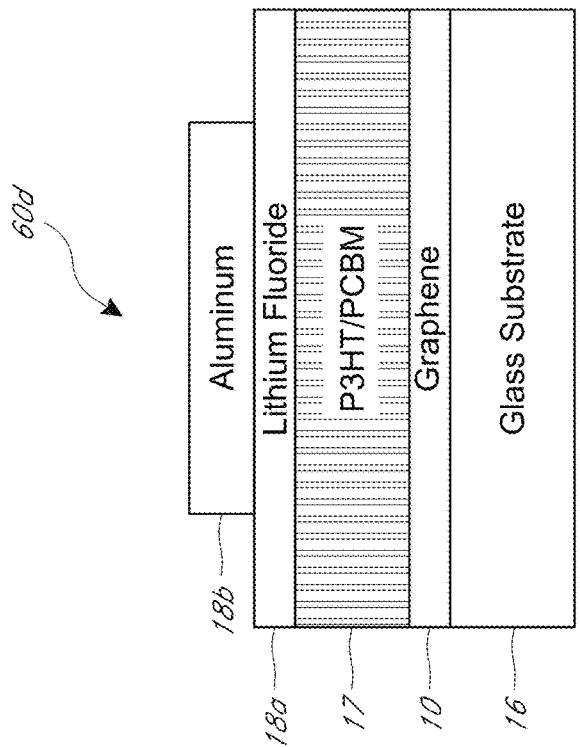
FIG. 12D is a schematic block diagram of an example DSSC device having CNTs/graphene film prepared according to certain embodiments of the present disclosure.

As shown in FIG. 12B, to fabricate a graphene-CNT-based hybrid DSSC 60b, a mixture of P3HT+PCBM solution 17 may be drop cast on the aligned CNT 19/graphene 10/quartz 16 substrate followed by making cathode contact of $LiF_4$/Al 18 on the top of the cell. Moreover, to achieve maximum efficiency of energy conversion, an array 60c of DSSC devices (as shown in FIG. 12C) can also be produced on a single large-area graphene electrode ground similar to the DSSC designs shown in FIG. 10E and 11C. Corresponding block and band diagrams of the proposed DSSC are shown in FIGS. 12D and 12E.

Figures 13A, 13B, 13C, 13D:
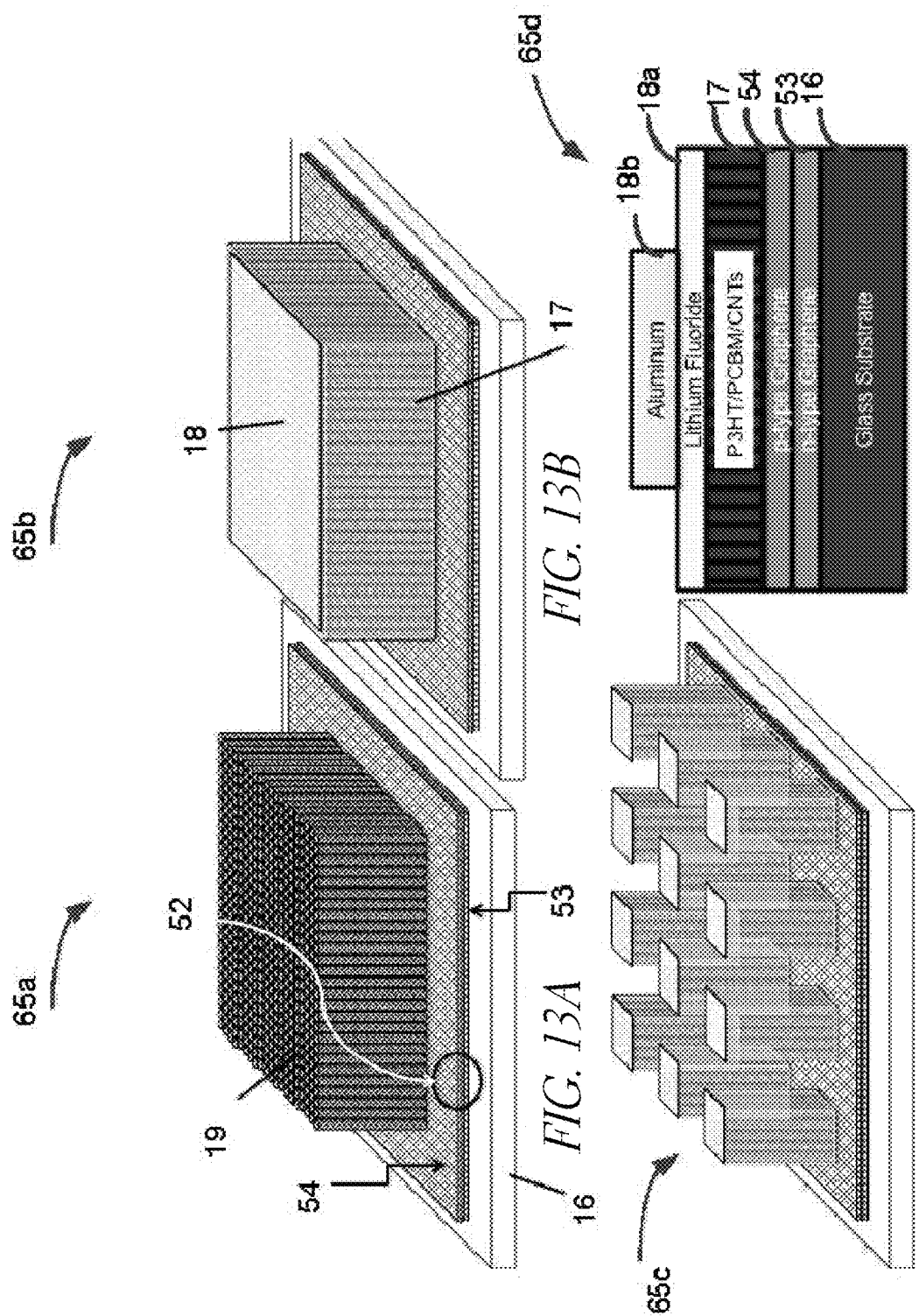
FIG. 13A is a schematic representation of an example of vertically aligned CNTs grown on p-n junction graphene film prepared according to certain embodiments of the present disclosure.
FIG. 13B is a schematic representation of an example of a hybrid DSSC device having CNTs/p-n junction graphene film prepared according to certain embodiments of the present disclosure.
FIG. 13C is a schematic representation of an example of a hybrid multi-DSSC device having a single CNTs/p-n junction graphene film prepared according to various embodiments of the present disclosure.
FIG. 13D is a schematic block diagram of an example of a hybrid DSSC device having CNTs/p-n junction graphene film prepared according to certain embodiments of the present disclosure.

It is also possible to synthesize CNTs 19 on a p-n junction 52 sandwich structure of a graphene electrode, as shown in FIG. 13A. The CNTs/graphene can be prepared on quartz glass and used as a window electrode in a DSSC device. FIG. 13B is a schematic representation of an example of such a hybrid DSSC device 65b. Furthermore, an array 65c of CNT/graphene-based hybrid DSSCs can be produced as shown in FIG. 13C. A corresponding block diagram of the proposed DSSC 65d is shown FIG. 13D.

With further reference to the example solar cell shown in FIG. 9, the electrode 220 can further include a plurality of nanowires. The solar cell can be a DSSC or other types of excitonic solar cells. Using a dense array of long, thin nanowires as a dye scaffold (density within the range from $0.01/\mu m^2$ to $0.8/\mu m^2$), it can be possible to increase the DSSC dye loading (and so its absorption of red light) while simultaneously maintaining very efficient carrier collection. Moreover, the rapid transport provided by a nanowire anode can be favorable for cell designs that use non-standard electrolytes, such as polymer gels or solid inorganic phases, in which recombination rates are high compared with the liquid electrolyte cell.

FIGS. 14A and 14B represent schematic diagrams of an example DSSC device to illustrate how this topology could improve the understanding and performance of DSSCs and other types of excitonic solar cells. For example, as shown in FIG. 14A, the example DSSC 70 includes quartz glass 16, graphene film 10 disposed over the quartz glass 16, and ZnO nanowires 79 disposed over the graphene film 10.

In certain embodiments, zinc oxide (ZnO) can be used as a component in ultraviolet light emitting diodes and an electron-transporting layer in organic and dye-sensitized solar cells (DSSCs), due to a wide band gap energy of about 3.3 eV, a high exciton binding energy of about 59 meV, and relative ease of quality control. Various ZnO nanostructures have been fabricated by wide range of methods to enhance device performance. In high-performance nanowire photo-anodes, it is desirable to have a large surface area for dye adsorption, comparable to that of a nanoparticle film.

In some embodiments, ZnO nanowire arrays 79 are prepared using high-aspect-ratio gold (Au) seed particles on graphene film 10 from a ZnO source using CVD. The nanowire arrays 79 may be employed in DSSC devices 70 as an electron transporting layer.

Figure 14C:
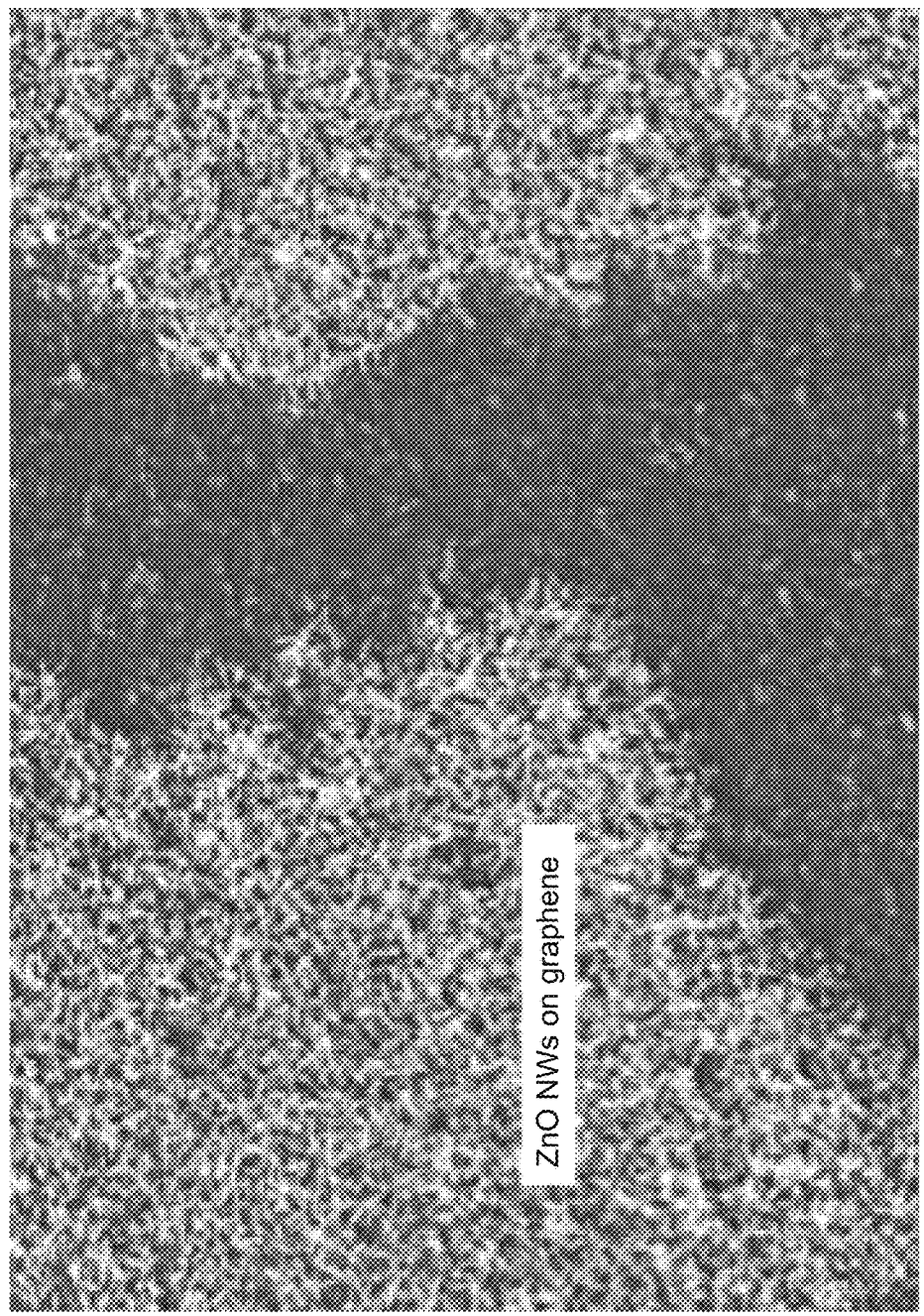
FIG. 14C is a scanning electron microscope (SEM) image of an example of ZnO NWs grown on a graphene film prepared according to certain embodiments of the present disclosure.

FIG. 14C illustrates a scanning electron microscopy (SEM) image of ZnO nanowires grown on graphene film using an embodiment of a CVD growth technique. As shown in the enlarged image (FIG. 14D), the diameter of the ZnO nanowires are selected within the range between about 50 nm to about 80 nm, with a relatively high aspect ratio (e.g., about 2 to about 50). The diameter and length of the ZnO nanowires can be controlled depending on the growth parameters.

Figure 14D:
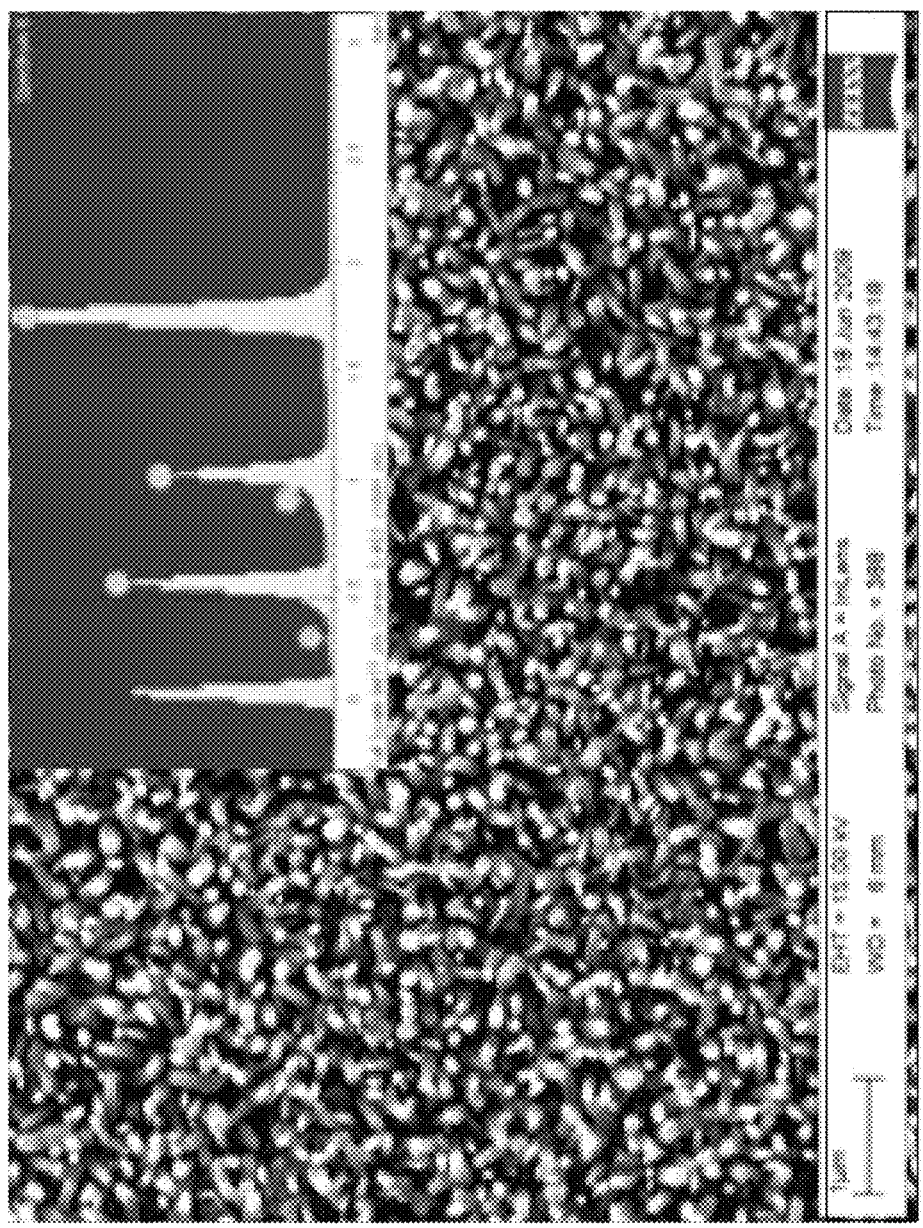
FIG. 14D is an enlarged SEM image and electron diffraction spectrum (EDS) of an example of ZnO NWs grown on a graphene film using a CVD technique according to certain embodiments of the present disclosure.

The inset electron diffraction spectroscopy (EDS) profile taken from FIG. 14D confirmed the existence of C, Zn, and O elements. Finally, as shown in FIG. 14A, a mixture of P3HT+PCBM solution 17 can be drop cast on the aligned ZnO nanowires 79/graphene 10/quartz 16 substrate followed by making cathode contact of $LiF_4$/Al 18 on the top to fabricate embodiments of a DSSC device 70.

Example Graphene Based Multi junction Tandem Solar Cells

Figures 15A, 15B:
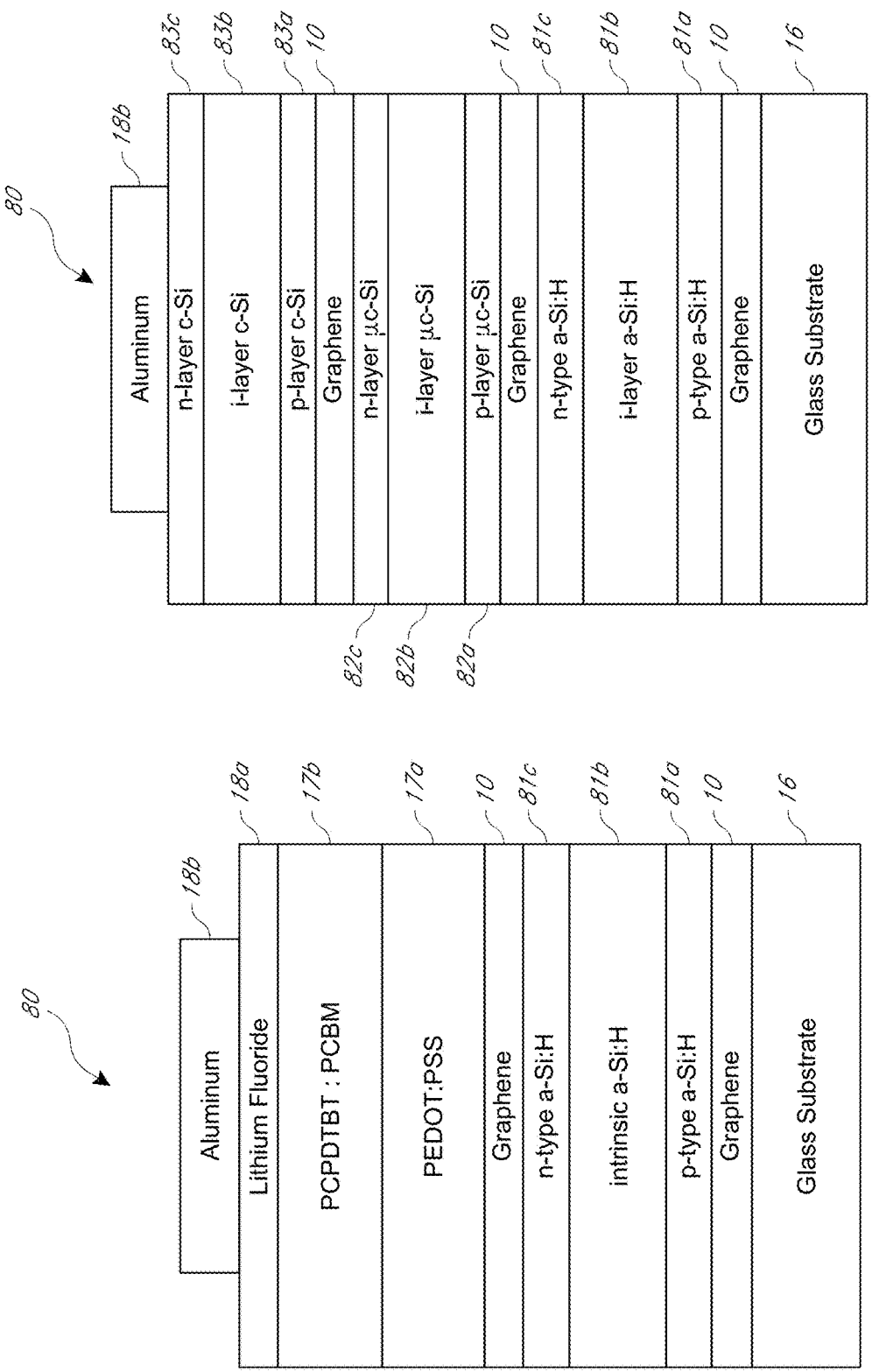
FIG. 15A is a schematic representation of an example hybrid multi-junction tandem solar cell device prepared according to various embodiments of the present disclosure.
FIG. 15B is a schematic representation of an example hybrid triple-junction tandem solar cell device prepared according to various embodiments of the present disclosure.

With further reference to the example solar cell shown in FIG. 9, the device can be a multi junction tandem solar cell or part of a multi junction tandem solar cell. The device can include at least one p-n junction or at least one p-i-n junction. For example, as shown in FIG. 15A, the hybrid multi junction tandem solar cell 80 can comprise a graphene film 10 disposed over a glass substrate 16. The solar cell 80 can comprise a p-i-n junction. The p-i-n junction can comprise amorphous silicon, crystalline silicon, microcrystalline silicon, or a combination thereof. The example solar cell 80 in FIG. 15A comprises a p-type hydrogenated amorphous silicon 81 a, an intrinsic hydrogenated amorphous silicon 81b, and an n-type hydrogenated amorphous silicon 81c. Another graphene film 10 can be disposed over the n-type hydrogenated amorphous silicon 81c.

Amorphous silicon (a-Si or α-Si) is the non-crystalline allotropic form of silicon. After the invention of this material, its thin film fabrication capability and unique electrical properties made it desirable for solar cell applications. More than 30 years have passed since the first solar cell from amorphous silicon has been reported. In early studies of amorphous silicon, it was determined that plasma-deposited amorphous silicon contained a significant percentage of hydrogen atoms bonded into the amorphous silicon structure. These atoms were discovered to play a significant role in the improvement of the electronic properties of the material. Amorphous silicon is generally known as "hydrogenated amorphous silicon," or a-Si:H. This material is relatively simple and inexpensive to fabricate and exhibits a relatively high energy absorption spectra and cost efficiency. As a result, this material is highly suitable for use in solar cell applications and has been the subject of many research efforts to detail its optoelectronic properties.

The suitability of a-Si can be explained by its chemical properties. Amorphous silicon is an alloy of silicon with hydrogen. The distribution of bond length and bond angles disturbs the long range of the crystalline silicon lattice order and consequently changes the optical and electronic properties. The optical gap increases from about 1.8 eV to about 2.1 eV.

The effective energy gap of amorphous Si with respect to diffusion potential, and consequently with respect to photo voltage, in p-n- and p-i-n-structures is smaller than the effective band gap for light absorption. The edges of the valence and conduction band are not well defined but exhibit a change in density of states. Charge carrier transport can occur at the mobility edge at energy levels that have still low absorption. This causes a material-inherent reduction of maximum obtainable efficiency.

Solar cells include p-i-n junction a-Si:H structures. The doping process may be accomplished during plasma growth of a-Si. In order to achieve n-type doping during growth, a gas such as phosphorus trihydride ($PH_3$) may be added to the silane gas mixture. The plasma which dissociates silane also dissociates $PH_3$. As a result, phosphorus (P) atoms bond to 3 silicon neighbors and creating a dangling bond. This dangling bond is neutralized by a hydrogen atom.

For p-type doping, di-borane ($B_2H_6$) and tri-methyl gallium ($Ga(CH_3)_3$) may be added to the gas mixture. In this gas mixture, boron (B) and gallium (Ga) atoms make p-type doping. They also bond to 3 silicon neighbors possess a dangling bond. As above, the dangling bond may also be neutralized by a hydrogen atom. Because of the dangling bonds, without hydrogen neutralization, doping is relatively inefficient in a-Si.

As shown in FIG. 15A, fabrication of various embodiments of the solar cell 80 may begin with transfer of a CVD synthesized large-area graphene 10 on quartz glass 16. For active layer p-i-n junction of a-Si:H is deposited in the PECVD chamber. During this deposition first silane and hydrogen gasses are mixed with trimethyl gallium and diborane gasses in order to deposit p-type a-Si:H layer 81a. n this layer Ga and B atoms are the p-type dopants. In deposition of intrinsic-layer, only silane and hydrogen gasses are pumped into the chamber. In certain embodiments, in order create a high field in the intrinsic layer 81b of the pin structure the cells are thin, of the order of a few hundred nanometers where it is chosen as 500 nm in the example design. The last step of deposition is the n-type a-Si:H layer 81c deposition. To achieve n-type doping, phosphorus trihydride gas is added to the silane-hydrogen mixture. In this layer, P atoms are n-type dopants. On the top of the solar cell, a metal electrode, e.g., Al 18b, may be deposited via thermal evaporation. By applying proper light trapping schemes, thin single junction cells can be produced with high stabilized efficiency.

The mobility of charge carriers in amorphous silicon is generally quite low. So, in a solar cell device, collection of photo-generated carriers has to be supported by an internal electrical field. Furthermore, defect formation is related to the recombination process. Moreover, highly stabilized efficiency and limited use of the solar spectrum are the limiting factors of the basic p-i-n junction a-Si:H solar cells. In the light spectrum amorphous silicon can cover only one fifth of the whole spectrum. In order to overcome this disadvantage, embodiments of different graphene-based hybrid DSSCs structures are shown in FIGS. 15A and 15B.

In these example DSSCs structures, ZnO thin films are substituted with graphene. Although, ZnO films are also suitable for tandem solar cell structures because of their large transmittance spectrum and easy deposition on glass substrates, graphene has many advantages over ZnO thin films. However, transmittance of graphene is very similar to that of ZnO. Also in monolayer graphene structures, it has better transmittance then ZnO. Graphene has another optical advantage over ZnO such that under UV exposure graphene films become thinner, so more transparent to sunlight.

In comparison, the mobility of ZnO is around 180 $cm^2V^{-1}s^{-1}$, and that of graphene is around tens of thousands $cm^2V^{-1}s^{-1}$. The thin film resistivity of ZnO is highly dependent on the film thickness, as the film thickness decreases, transmittance increases linearly but the resistance increases exponentially. So there is a limitation in the film thickness of ZnO. In the case of graphene, both resistivity and the transmittance are linearly dependent on the film thickness.

The general strategy to improve the efficiency and the usage of the spectrum is to use a tandem cell. In a multi-cell structure introducing cells with different bandgaps can make better use of the solar spectrum, and at the same time, improve the stabilized efficiency of the devices. Also, a reduction of the thickness of the single cells allows the electric field to increase and carrier collection to improve.

Figure 15C:
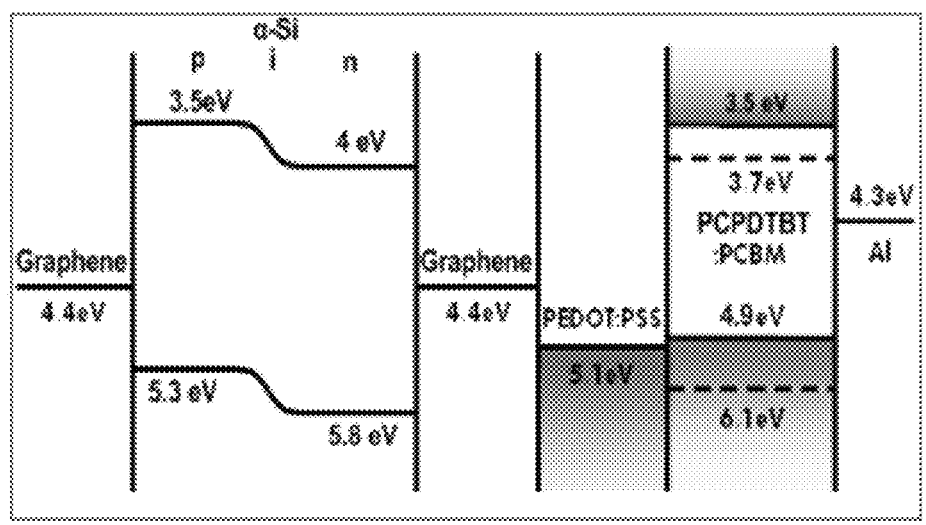
FIG. 15C is a schematic band diagram of an example hybrid multi-junction tandem solar cell device prepared according to various embodiments of the present disclosure.

Thus, some embodiments of a hybrid tandem structure is illustrated in FIGS. 15A and 15B. In FIG. 15A, the example DSSC device 80 is fabricated from a high bandgap solar cell, which is a-Si cell. In FIG. 15B, the illustrated cell 85 is chosen as a lower bandgap bulk heterojunction (BHJ) solar cell. The band diagram corresponding to this design is also shown in FIG. 15C.

Among other photo-excited polymers, PCPDTBT:PCBM is chosen in the active layer of the BHJ layer to cover the IR and the UV of these solar spectrum, where a-Si has no absorbance at those ranges. In other words, by choosing PCPDTBT:PCBM polymer blend 17b in BHJ cell, it is also possible to harvest the photons with low energies that can pass through the a-Si solar cell without exciting any particles.

Another aspect of this design is the contact material between two cells. In accordance with certain embodiments, graphene 10 is chosen to decrease the surface interaction between two cells. Also, compared with commonly used oxides at the interface of the tandem cells, such as ITO, ZnO or $TiO_x$, its suitable work function, cost-efficiency and unique electrical properties makes it suitable for the interface contact.

In addition, FIG. 15B discloses a silicon tandem solar cell. In this design, a triple junction structure is used. As discussed above, the goal of using tandem structures is to cover more of the spectrum of sunlight. It has been recognized that a p-i-n junction of a-Si:H 81, covers the lower half of the visible light spectrum. Depositing the second cell, p-i-n junction of microcrystalline silicon (μc-Si) 82, as a tandem over the first one 81 increases the coverage all over the visible range in the light spectrum. But there is significant amount of sunlight in the IR range still not covered. By depositing the third cell, p-i-n of crystalline silicon (c-Si) 83, almost the entire sunlight spectrum is covered. These individual cells are put in an order from higher band gap to lower band gap to maintain an efficient absorption on each cell. Between the cells, graphene thin films 10 can be used to reduce surface interactions.

Example Graphene Based Embodiments

Figure 16A:
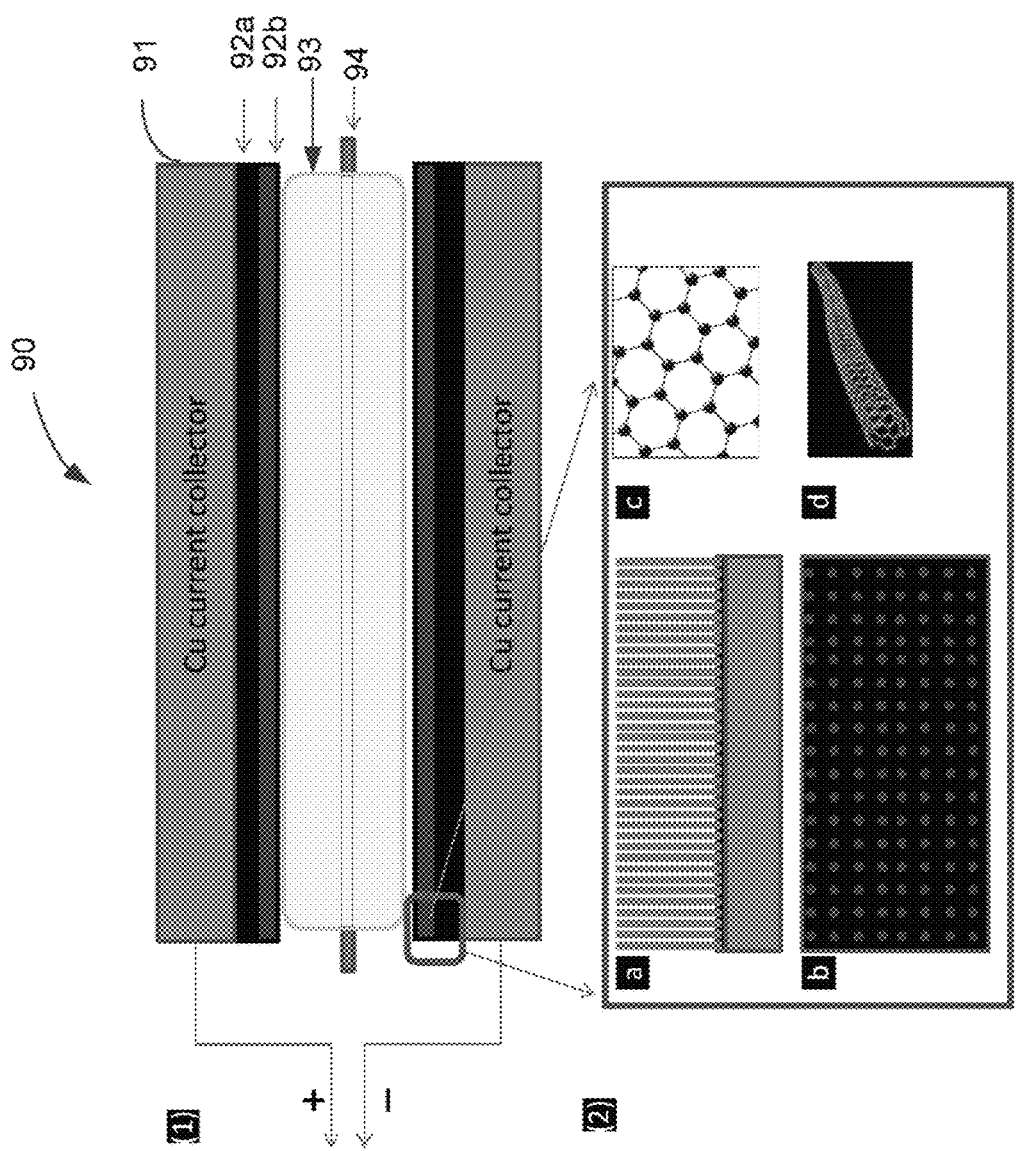
FIG. 16A is a schematic illustration of (1) an example test cell assembly based on a pillared graphene nanostructure (PGN) capacitor; (2) a magnified schematic of the pillared graphene nanostructure of (1), including a (a) side-view schematic of the PGN structure; (b) top-view schematic of the PGN structure; (c) schematic of graphene layers; and (d) schematic of carbon nanotubes.

An example embodiment of an electrode test cell assembly based on a pillared graphene nanostructure (PGN) capacitor comprising carbon nanotubes on a graphene film was fabricated and shown in FIG. 16A. FIG. 16A shows (1) an example test cell assembly based on a pillared graphene nanostructure (PGN) capacitor; (2) a magnified schematic of the pillared graphene nanostructure of (1), including a (a) side-view schematic of the PGN structure; (b) top-view schematic of the PGN structure; (c) schematic of graphene layers; and (d) schematic of carbon nanotubes. Graphene CNT hybrid films grown on 25 um copper (e.g., about 99.8%) were attached onto glass slides. The copper acts as a current collector 91 and the pillared graphene nanostructure (PGN) films comprising graphene film 92a and carbon nanotubes 92a act as active electrodes. The active area of overlap by the PGN electrodes was about 1 cm².

Both glass slides were assembled with a separator 94 (Celgard 3501) sandwiched in between. The separator was soaked with electrolytes 93. Then they were assembled with parafilm wrapped around. The extended current collectors 91 were connected to an electrochemistry cell (e.g., Gamry reference 600) for measurement of Current density as a function of voltage, galvanostatic charge-discharge, and electrochemical impedance spectroscopy (EIS). The cell assembly and all the measurement were implemented in Ar filled glove box (oxygen and water contents below about 1 and about 1 ppm, respectively). 2 M $Li_2SO_4$ was used for aqueous electrolyte 93. M tetraethylammonium tetrafluoroborate (TEA BF4, electrochemical grade >99%,Sigma Aldrich) in acetonitrile (anhydrous, 99.8%, Sigma Aldrich) or in propylene carbonate (anhydrous, 99.7%, Sigma Aldrich) was used for the organic electrolyte 93.

Figure 16C:
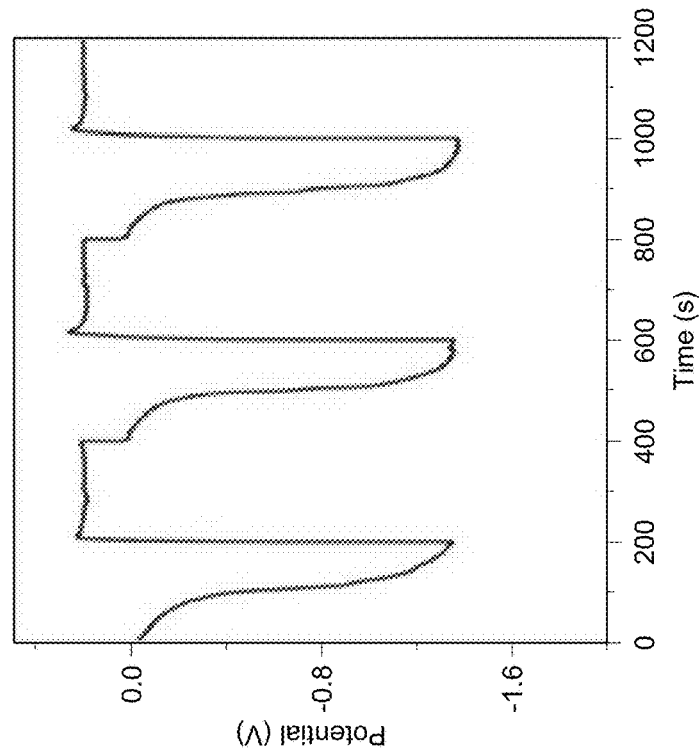
FIG. 16C illustrates a charge and discharge curve for an example of PGN at about 3.5 mA/cm$^2$ using an electrolyte of 2 M $Li_2SO_4$.
Figure 16B:
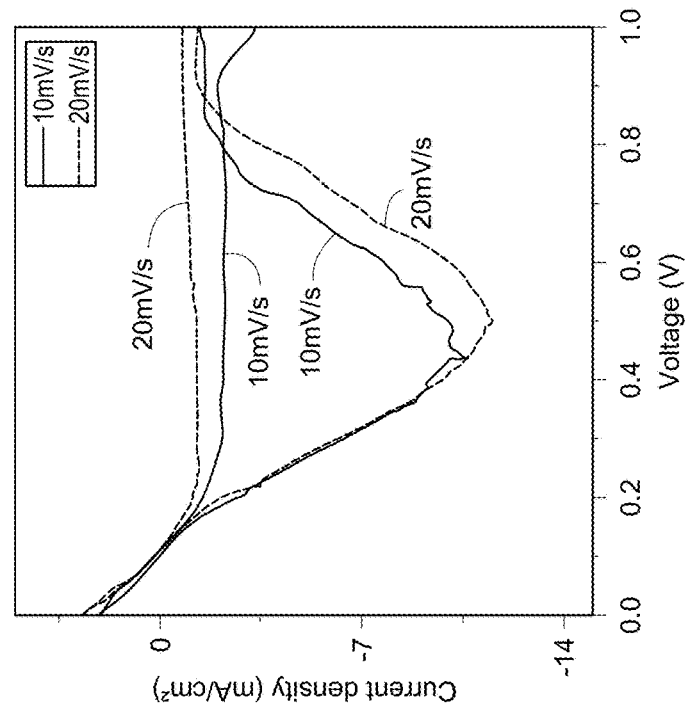
FIG. 16B is plot of the current density vs. voltage (C-V) response of an example of a PGN film having an area of approximately 1 cm$^2$ at scan rates of 10 mV/s and 20 mV/s.
Figure 16D:
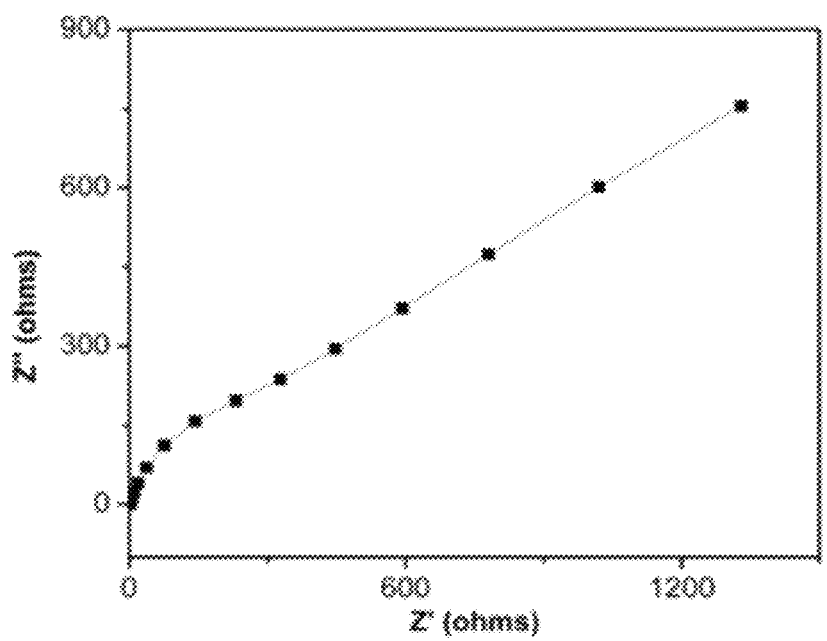
FIG. 16D is a Nyquist plot of an example of PGN in an approximately 2 M $Li_2SO_4$ electrolyte for the frequency range of about 0.1 Hz to about 1 MHz.

Current density as a function of voltage (C-V) were acquired at voltage ramp rates of 10 mV/s, 20 mV/s, and 100mV/s, with range of 0-1V for aqueous electrolyte and 0-3V for organic electrolyte. FIG. 16B is plot of the C-V response of an example of a PGN film having an area of approximately 1 cm² at scan rates of 10 mV/s and 20 mV/s. The galvanostatic charge-discharge given in FIG. 16C was done under constant current of 3.5 mA/cm² and 0.02 mA/cm². EIS was implemented using a sinusoidal signal with mean voltage of 0 V and amplitude of 10 mV with a frequency range of about 0.1 Hz to about 1 MHz given. FIG. 16D is a Nyquist plot of the example PGN in an approximately 2 M $Li_2SO_4$ electrolyte for the frequency range of about 0.1 Hz to about 1 MHz.

Figure 17B:
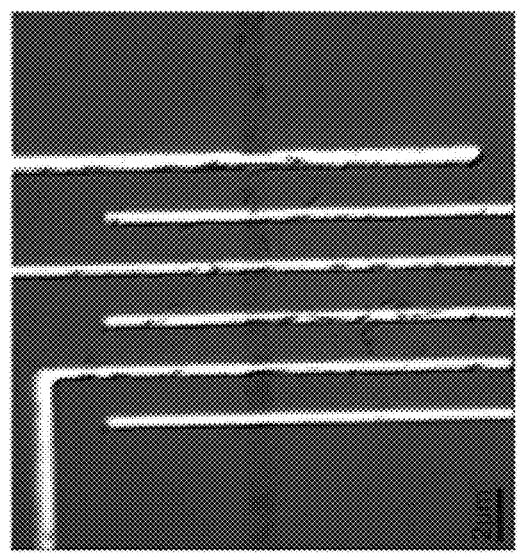
FIG. 17B is an optical microscope image of an example graphene ribbon fabricated from a CVD grown large area graphene sheet prepared according to certain embodiments of the present disclosure.
Figure 17A:
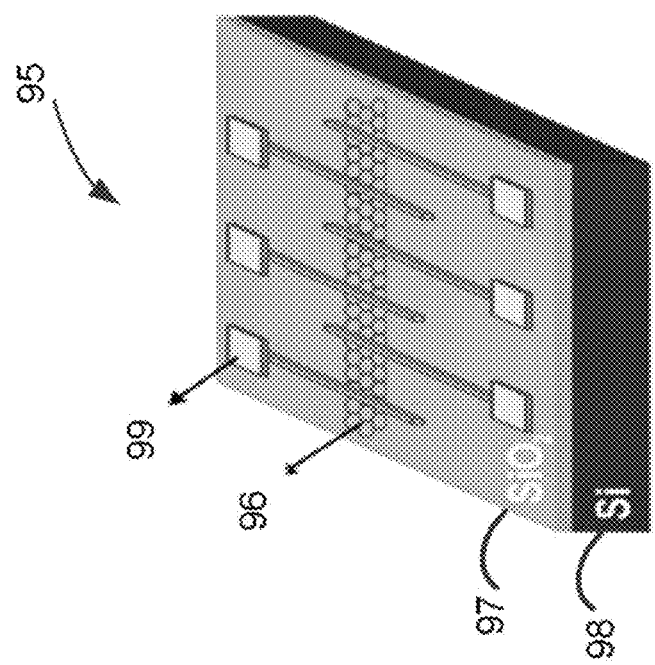
FIG. 17A is an illustrative 3-D schematic of an example embodiment of a graphene ribbon interconnect.

According to certain embodiments of the present disclosure, graphene ribbon interconnect devices were fabricated from large area few-layer graphene sheets grown by chemical vapor deposition. As illustrated in FIG. 17A, the schematic of a single device 95 is given. The graphene layers 96 were transferred onto a substrate of $SiO_2$ 97 disposed over a Si wafer 98 for device fabrication and characterization. The graphene layers 96 were patterned and etched into stripes using photolithography and reactive ion etching. Ni/Au electrodes 99 were used. In FIG. 17B, an optical microscope image of the device on top of the $Si/SiO_2$ substrate is shown.

Figure 17C:
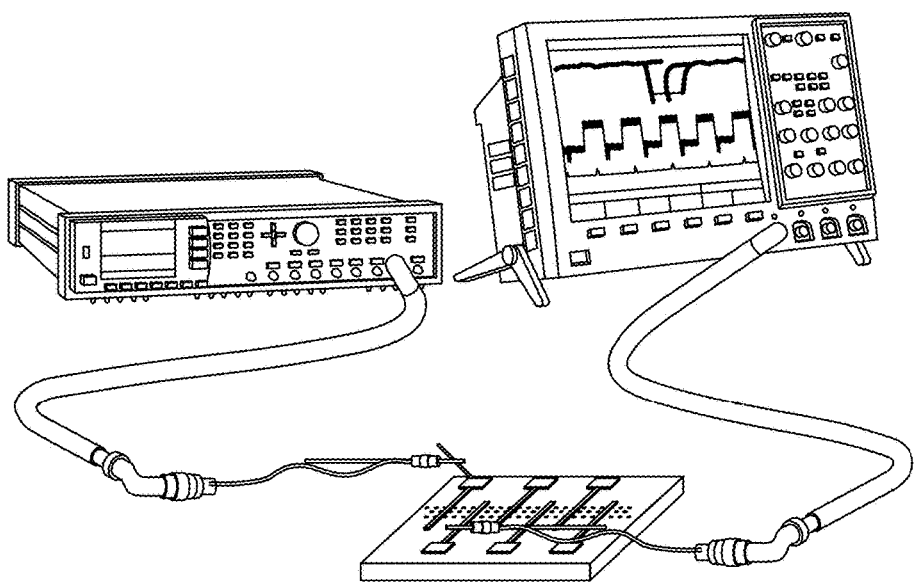
FIG. 17C is a schematic illustration of a data transmission measurement setup for generating a substantially uniformly distributed binary sequence. An Agilent 81150A waveform generator and Agilent 7000 series oscilloscope are illustrated.

A substantially uniformly distributed binary sequence was generated and uploaded to an Agilent 81150A Waveform Generator. Binary sequence was repeatedly transmitted with a frequency selected according to the data transmission rate. Signals transmitted through the GRIs and test equipment were collected using an Agilent 7000 Series digital oscilloscope. An example embodiment of the measurement setup is illustrated in FIG. 17C.

Figures 17D, 17E:
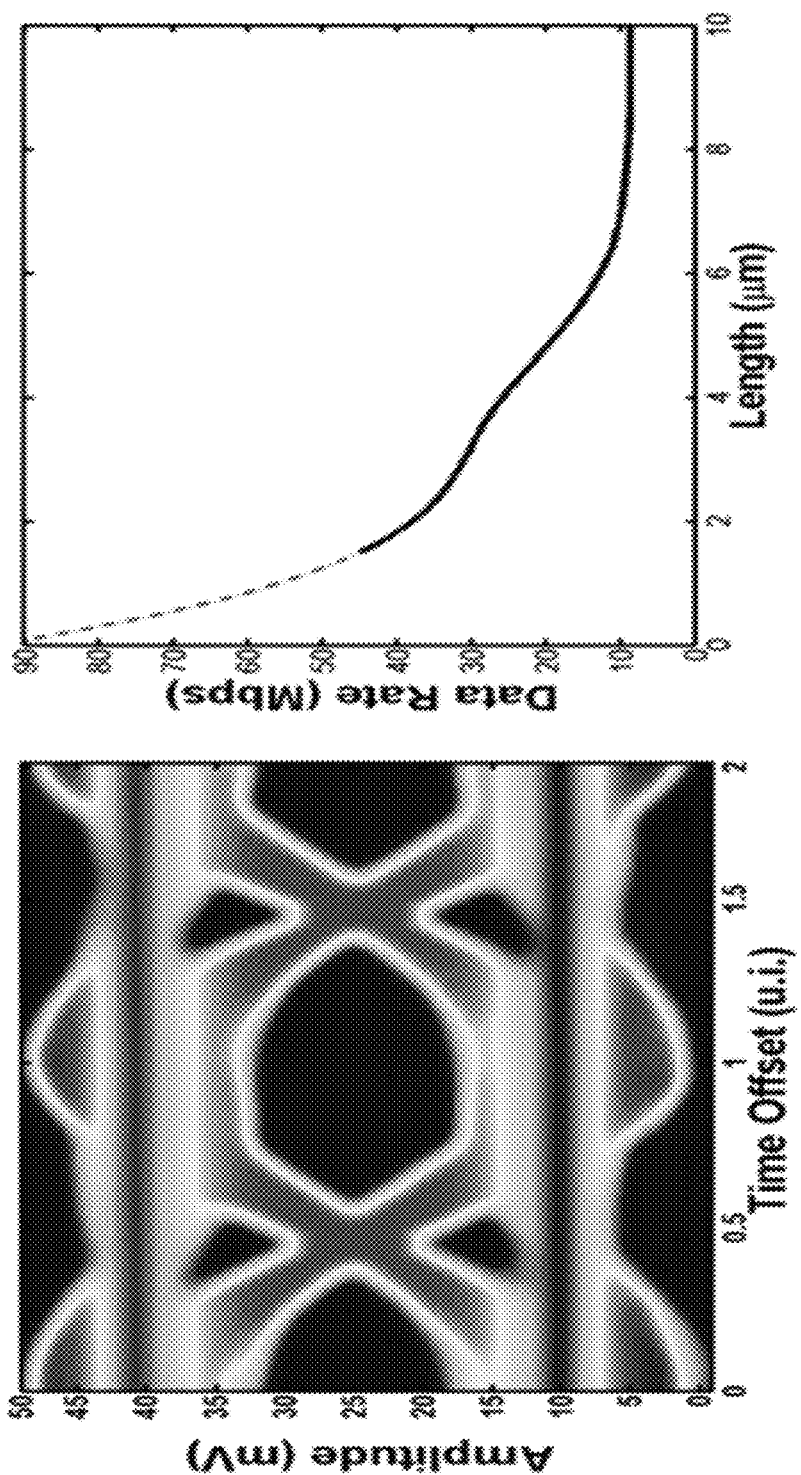
FIG. 17D is a schematic illustration of an eye diagram illustrating the digital data transmission performance of the graphene ribbon interconnects of the example embodiment of FIG. 17B. Two symbols per trace formed from approximately 16800 symbols at about 50 Mbps are illustrated.
FIG. 17E is a plot of data rate versus length for the example graphene ribbon interconnects of FIG. 17B.

An eye diagram approach was used to investigate the digital data transmission performance of the graphene ribbon interconnects. The eye diagram for two-symbols per trace were measured on a GRI which is 1.5 μm in length and 1 μm in width at 50 Megabits per second (Mbps) data rate and the resultant data FIG. 17D. To understand the effect of interconnect length on data transmission, measurement and analysis presented above were repeated for the rest of the contacts fabricated (FIGS. 17A and 17B) on several graphene ribbons having same geometries and sizes. The performance of the graphene ribbon interconnects significantly increases as the length decreases (FIG. 13E).

Example Graphene Based Bio-Mimicking Devices

Figure 18A:
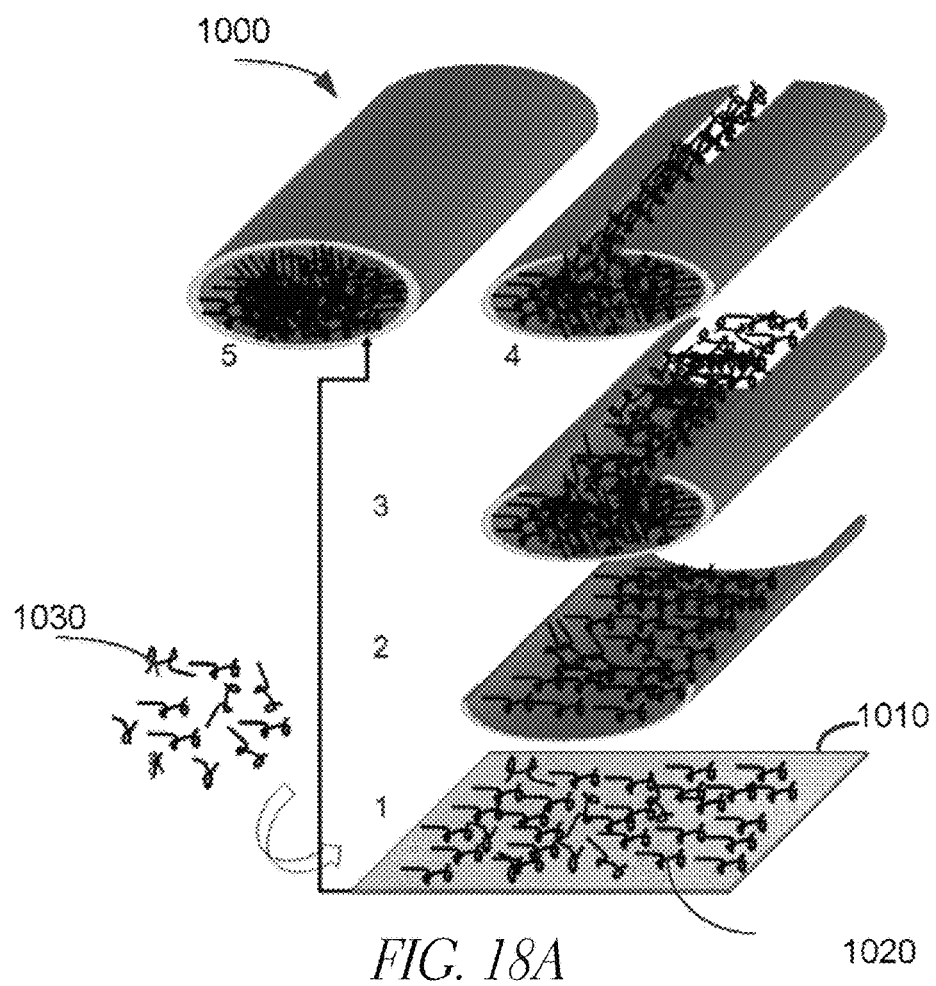
FIG. 18A is a schematic illustration of an example of the wrapping of biological factors including DNA molecules, protein molecules, enzymes, viruses or live cells inside graphene layers: (1) CVD grown graphene film can be functionalized with proteins, nanoparticles, self-assembled monolayers; (2-4) sequential wrapping of ssDNA or RNA with functionalized graphene film; and (5) cigar-like ssDNA strands wrapped in graphene film.

Certain embodiments described herein disclose a graphene based bio-mimicking device. For example, FIG. 18A shows an example structure 1000 that can be used in graphene based bio-mimicking devices. The graphene based bio-mimicking device can comprise a graphene film 1010 as disclosed herein. In some embodiments, the graphene film 1010 can comprise between about one layer to about 10 layers of graphene. For example, the graphene film 1010 can comprise between about one layer to about 5 layers of graphene. In addition, the graphene film 1010 can extend over an area of at least about 6 cm². In various embodiments, the graphene can extend over an area from about 6.45 cm² (about 1 in²) to approximately wafer scale (e.g., to about 25 cm², to about 50 cm², to about 100 cm², to about 150 cm², to about 200 cm², to about 350 cm², to about 500 cm², to about 750 cm², to about 1000 cm², to about 1500 cm², or to about 1750 cm²). As also disclosed herein, the graphene can have a crystallinity of at least about 95%, at least about 97%, at least about 98%, or at least about 99%. The device 1000 can include oligonucleotides, proteins, or inorganic molecules wrapped within the graphene film 1010.

For example, as shown in FIG. 18A, some embodiments of the present disclosure proved nanostructures 1000 based on graphene 1010 wrapping of oligonucleotides 1020 (DNA and/or RNA, e.g. from ssDNA and/or RNA library 1030) for bio-mimicking structures, such as nanoparticles, nanowires, and nanostructures in general. This is process can be analogous to a cigar wrapping process. Such nanostructures 1000 may be similar to oligonucleotides or nanoparticles trapped in carbon nanotubes. Such nanostructures 1000 can also be analogous to oligonucleotides as the core material in the center of the Tobacco Mosaic Virus (TMV). At the nanoscale, a minimum energy configuration may be obtained when the graphene sheet(s) 1010 wrap around the oligonucleotides 1020; thereby minimizing the total energy of the system. The curvature of the nanostructure 1000 and the diameter of the bio-mimicking nanostructure 1000 could be manipulated by varying the pH of the environment, by applying an electrical field, by mechanical manipulation using the microcantilever or nanocantilever of a scanning probe microscope, by applying environmental pressure within a pressure chamber such as an autoclave, by changing the temperature of the environment, by applying a magnetic field, by functionalizing the surface with self-assembled monolayers. The bio-mimicking nanostructures 1000 could be used to infect microorganisms such as *Escherichia coli* (aka *E. Coli*) via the wrapped or encapsulated oligonucleotides 1020.

The bio-mimicking nanostructures 1000 may be used for studies in molecular biology, microbiology, towards delivery of nucleotides for infection and mutation, as drug delivery vehicles (such as cancer drugs), as vehicles to deliver cancer therapeutics, as vehicles to carry payloads of nanoparticles and functionalized nanoparticles, as platforms to study genomics, as platforms to transport DNA or RNA to specific binding sites for self-assembly processing.

In some further embodiments, the bio-mimicking device can further include nanoparticles, protein, or enzyme groups on a surface of the graphene film 1010. For example, the bio-mimicking nanostructures 1000 could be modified to have charged or neutral nanoparticles such as Au, Pt, Pd, InAs, Si, InSb, InP, Ge, SiGe, oxide nanoparticles, etc. or protein or enzyme groups, etc. immobilized on the surface of the graphene sheet 1010 via electrostatic or covalent attachment. Such modified nanostructures 1000 could serve as memory devices where a bias voltage can be applied to the nanostructure in a cross-bar arrangement to transfer charges from the central oligonucleotide (RNA or DNA) 1020 to the surface nanoparticles, or vice versa. The transferred charge would be stable until a reverse bias is applied to remove the charge. Such nanostructures 1000 could be examined for number of cycles for charge storage and removal and retention time.

The bio-mimicking nanostructures 1000 could be used as a part of the active layer or as apart of the hole-collecting electrode or as a part of the electron-collecting electrode within photovoltaic cells for solar energy conversion or for charge storage devices or capacitors. The dielectric properties of the devices could be altered by encapsulating different oligonucleotides, proteins, or inorganic molecules during or after the wrapping process towards more general wrapped nanostructures, analogous to nanotubes. Accordingly, certain embodiments of bio-mimicking devices as described herein can be a part of a memory device, photovoltaic cell, or a capacitor.

Figure 18B:
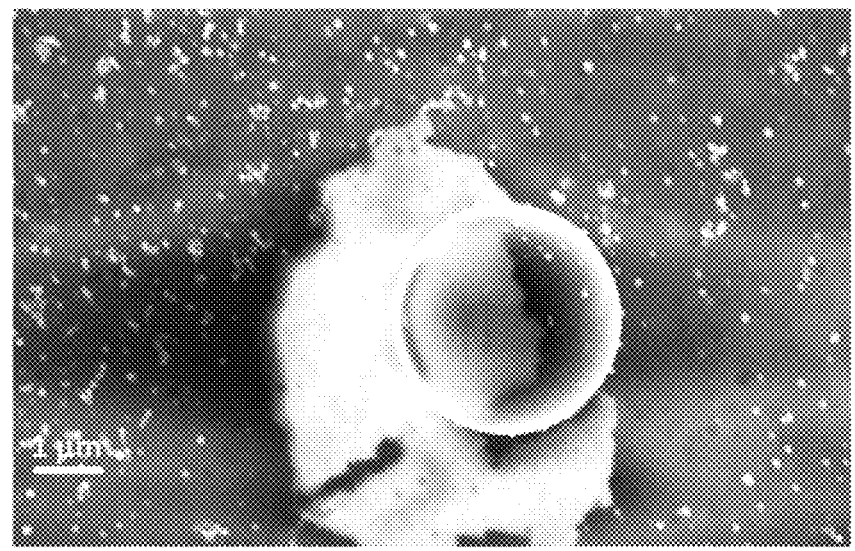
FIG. 18B is an SEM image of an example large area graphene layer, prepared according to various embodiments of the present disclosure, where the large area graphene layer partially covers a polymer bead on a glass substrate.

FIG. 18B is an SEM image of an example large area graphene layer, prepared according to various embodiments of the present disclosure, where the large area graphene layer partially covers a polymer bead on a glass substrate.
Example Method of Fabricating a Pillared Graphene Nanostructure As a part of synthesis and tune pillared graphene nanostructure, it is beneficial to develop a methodology for depositing and patterning arrays of catalyst nanoparticles on the substrate. The catalyst particles may be used as seeds for growing carbon nanotubes through chemical vapor deposition. Therefore, catalyst particles may be considered as important in determining the resultant nanostructures in certain embodiments. The interest here lies in producing and patterning arrays of catalyst particles with controlled size and separation distance which result in controlled diameter and separation distance of grown carbon nanotubes, and eventually controlled amount of final surface area. Accordingly, in accordance with certain embodiments described herein, methods of fabricating a pillared graphene nanostructure comprising carbon nanotubes on a graphene film are disclosed.

Figure 19:
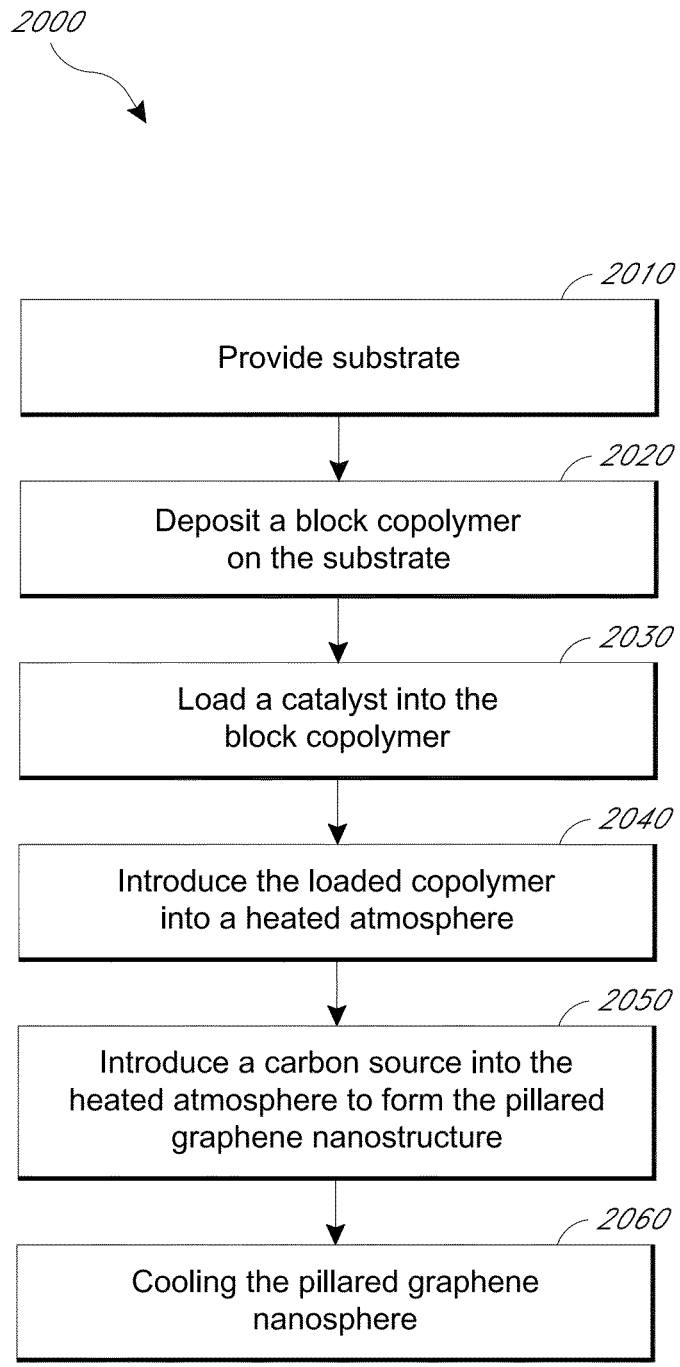
FIG. 19 is a flowchart of an example method of fabricating a pillared graphene nanostructure in accordance with certain embodiments described herein.

FIG. 19 is a flowchart of an example method 2000 of fabricating a pillared graphene nanostructure in accordance with certain embodiments described herein. The method 2000 can fabricate a pillared graphene nanostructure comprising carbon nanotubes on a graphene film as described herein and as used in various example devices as described herein. The method 2000 can include providing a substrate, depositing a block copolymer on the substrate, and loading a catalyst into the block copolymer as disclosed in operational blocks 2010, 2020, and 2030 respectively. The method 2000 can further include introducing the loaded copolymer into a heated atmosphere (e.g., a heated atmosphere of Ar+H$_2$), introducing a carbon source into the heated atmosphere to form the pillared graphene nanostructure, and cooling the pillared graphene nanostructure, as shown in operational blocks 2040, 2050, and 2060 respectively.

With respect to providing a substrate as shown in operational block 2010, the substrate can include any of the substrates disclosed herein, including but not limited to those disclosed with reference to method 100 shown in FIG. 1. As shown in operational block 2020, a block copolymer (BCP) can be deposited on the substrate. BCPs are a class of self-assembling materials and BCPs may be employed to fabricate nanometer-scale structures, as they spontaneously assemble a range of well-defined and ordered structures, depending on the volume fractions of the components. In addition, the molecular weight of the copolymer provides control over the size and separation distances of the microdomains, and the specific functionality can be incorporated into the structure by varying the chemical nature of the copolymer. In accordance with certain embodiments, block copolymers can be used as templates and scaffolds of desired nanostructures (herein, catalytic metal nanoparticles).

To develop well defined, well ordered cylindrical microdomains in a BCP film coated on top the substrate, appropriate volume fractions and molecular weights of the polymer blocks can be selected. Selecting the volume fraction and molecular weights of the polymer blocks may provide control over the morphology (e.g., cylindrical in this case), as well as the size/separation distance of BCP microdomains, respectively. With correct selection of the volume fraction and molecular weights of the polymer blocks, BCP domains can spontaneously assemble into a range of well-defined cylinders of minor polymer block, in a matrix of major polymer block.

In some embodiments, depositing the BCP can comprise dissolving the BCP to form a polymer solution, spin coating the solution onto the substrate, and solvent annealing the spin coated solution. For example, poly (styrene-b-4-vinylpyridne) (PS-b-P4VP) block copolymers may be dissolved in toluene/tetrahydrofuran in room temperature to make an approximately 0.5 wt % polymer solution. This solution may be spin-coated at about 2500 rpm onto a silicon wafer upon which an approximately 300 nm thick layer of silicon dioxide has been previously grown (e.g., thermally grown). The as-spun copolymer films may exposed to tetrahydrofuran (Fisher) vapor at about room temperature for about 3 hrs to perform solvent annealing, which increases the mobility of copolymer micelles and results in highly ordered microstructures over large areas with few defects in block copolymer thin films in certain embodiments.

Figure 20B:
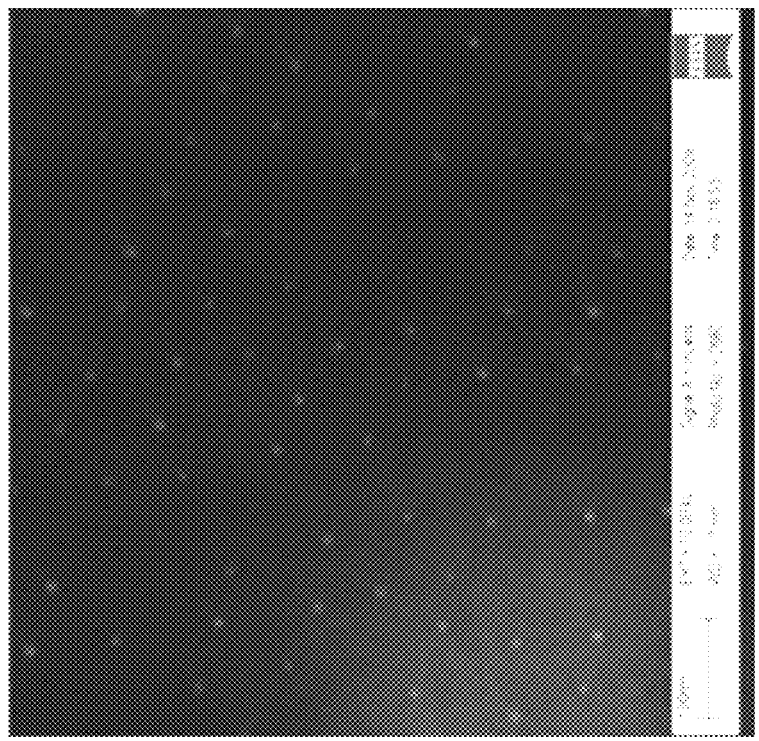
FIGS. 20A and 20B are SEM images of example embodiments of Au catalyst particles prepared using block copolymer (BCP) templates.
Figure 20A:
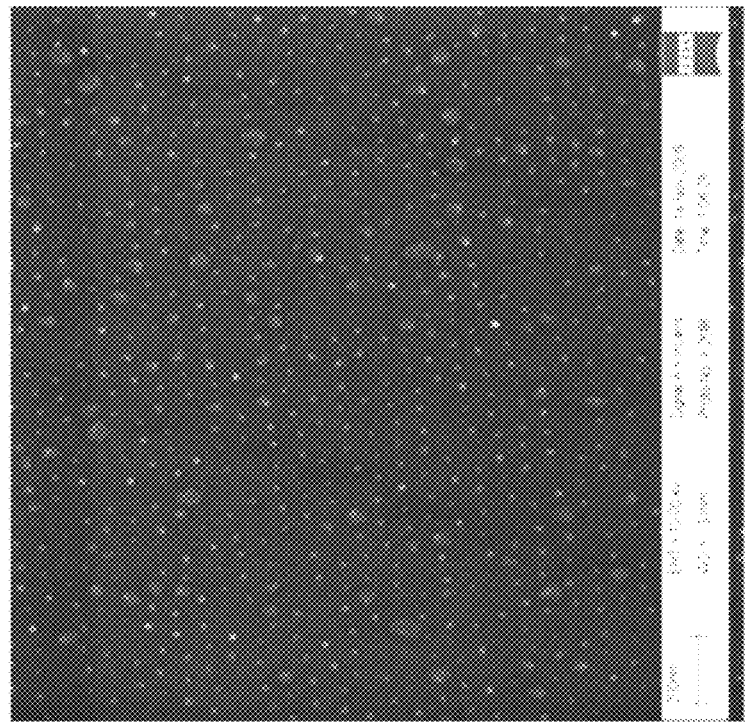

FIG. 20A is an SEM image of an example embodiment of Au catalyst particles prepared using block copolymer (BCP) templates. FIG. 20B is an SEM image of an example embodiment of Au catalyst particles prepared using block copolymer (BCP) templates at a higher magnification.

With respect to loading a catalyst into the BCP as shown in operational block 2030, upon alignment of BCP microdomains by solvent annealing, the copolymer film may be loaded with a catalyst. The catalyst can comprise ions of a transition metal. Loading the catalyst into the BCP can comprise introducing the copolymer into a solution of the catalyst in salt form. For example, iron ions may be loaded into the copolymer film by through dipping the copolymer film in an ethanol solution of an iron salt (e.g., $FeCl_3$). In various embodiments, this process results in selective incorporation of iron ions onto the poly (4-vinylpyridine) block. In various embodiments, the chemical nature of minor block, poly (4-vinylpyridine), achieved through proper selection of the polymer blocks, can ensure selective absorption of the catalytic ions to cylinders and not into the matrix (e.g., the major block) of the BCP film. FIG. 20C is a schematic top view illustration of an example embodiment of cylindrical block copolymer patterns. The arrows indicate catalyst ions being loaded into the cylindrical domains. Side lines 2100 indicate minor block micro-domains (e.g. poly-vinylpyrrolidone (PVP) domains).

Figure 20E:
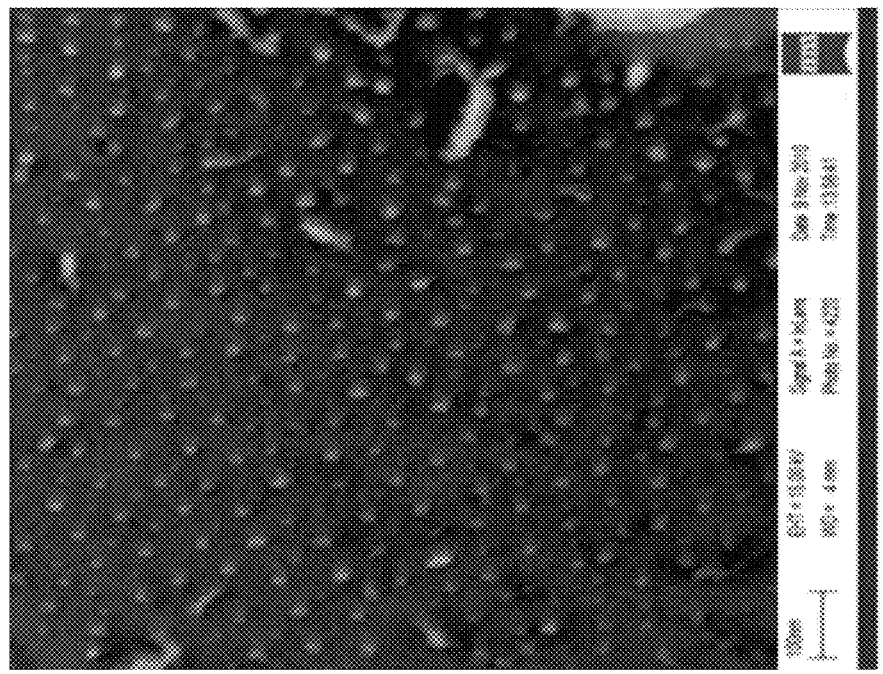
FIGS. 20D-20F are SEM images of example embodiments of Fe catalyst particles prepared using block copolymer (BCP) templates. The average diameter and separation distance of Fe particles is 10 nm and 30 nm respectively.
Figure 20D:
Figure 20F:
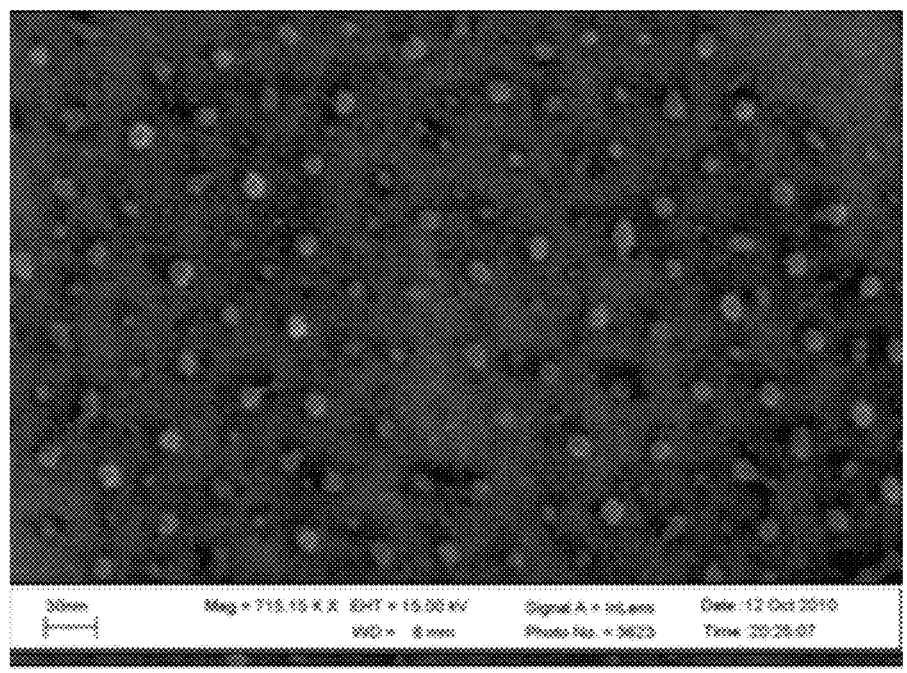
Figure 21D:
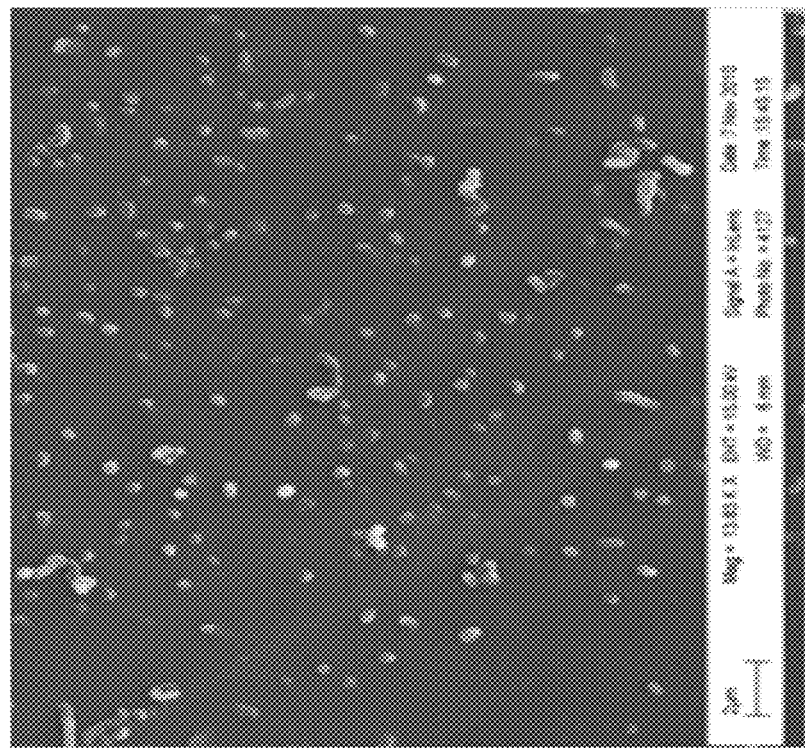
Figure 21C:
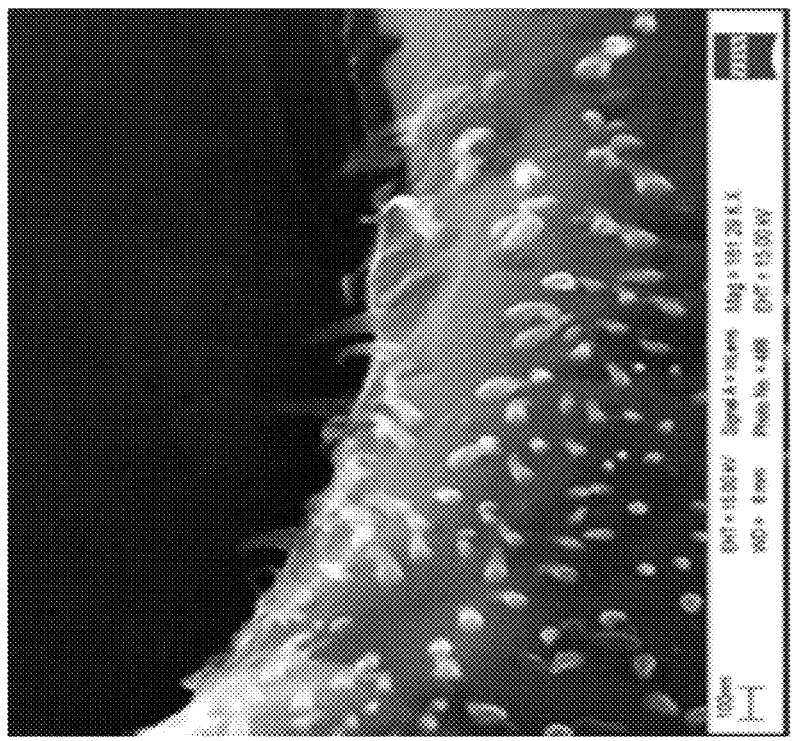

Due to the fact that transition metals, such as iron, nickel and cobalt, possess partially filled d orbitals, they form coordination bonds with electron-rich ligands such as the nitrogen functional group in pyridine. For example, FIGS. 20D, 20E, and 20F are SEM images of Fe catalyst particles prepared using block copolymer templates at different magnifications. The average diameter and separation of the Fe particles are about 10 nm and about 30 nm, respectively.

In some embodiments, the loaded copolymer may be removed from the substrate and transferred to a different substrate for PGN growth, e.g., a substrate comprising a deposited metal layer. For example, the metal loaded copolymer films may be floated off from the substrate using an approximately 1 wt % HF solution and subsequently transferred to a substrate having a layer of Cu previously deposited thereon. The substrate so configured can function as CNT seeds for growing PGN. The copolymer film may be further subjected to hydrogen annealing at about 400° C. for about 1 hr to remove polymer residues and to reduce iron ions to zero-valent iron.

As shown in operational block 2040, the loaded copolymer can be introduced into a heated atmosphere of about 600° C. to about 1100° C., e.g., about 750° C. of $Ar+H_2$. A carbon source, e.g., $C_2H_2$ or $CH_4$, can be introduced into the heated atmosphere to form the pillared graphene nanostructure as shown in operational block 2050. In some embodiments, the carbon source can be introduced for about 5 minutes to about 30 minutes. Without being bound by theory, the vapor-liquid-solid concept can be adopted to explain the initiation and growth of CNTs. In this model, the molecular decomposition of hydrocarbons occurs according to the reaction: $C_nH_m \rightarrow nC+m/2H_2$. Carbon molecules solution then happens at one side of catalyst particles (nucleation sites). Subsequently catalytic particles become supersaturated and carbon starts to precipitate from solution in active nucleation sites. At this point the interaction between substrate and metallic catalysts can define the details of growth mechanism; where strong interaction produces base-growth and weak interaction yields tip-growth. SEM and TEM observations revealed the growth mechanism of CNT pillars on the graphene layer through a VLS tip-growth. See, e.g., FIGS. 21A-21D.

Figure 22B:
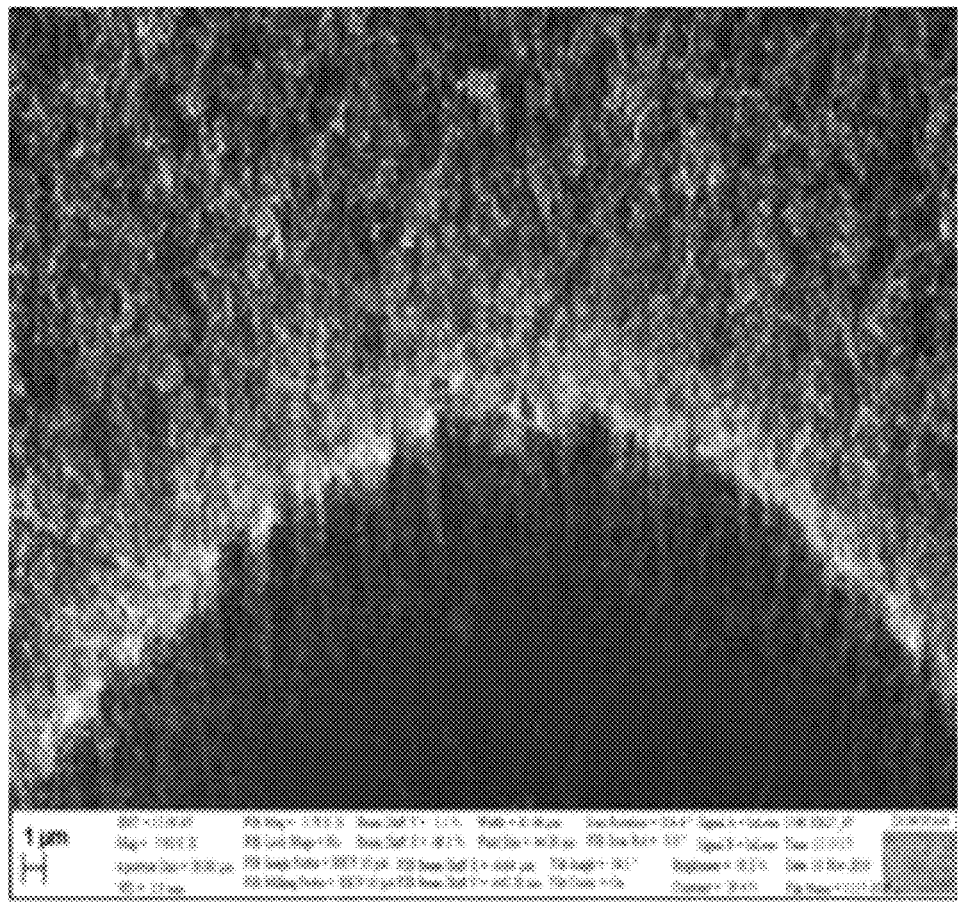
FIG. 22B is an SEM image of an example embodiment of dense CNT forests.

In some embodiments, to establish a reliable recipe for the growth of PGN arrays, CNTs were grown on top of $Si/SiO_2$ substrate. FIGS. 22A is an SEM micrograph of an example embodiment of CVD grown CNTs using BCP patterned arrays of iron particles as catalysts. The block copolymer used for this growth was poly (styrene-b-4-vinylpyridne) (PS-b-P4VP) with a molecular weight of about 68.5 kg/mol (about $M_n$, PS=47.6 kg/mol, about $M_n$, PVP=20.9 kg/mol) and molecular weight distribution of about $M_w/M_n$=1.14 (Polymer Source). After decoration of the growth substrate with patterned catalytic particles, it is deployed into fused silica tube and heated to about 750° C. under about 200 sccm of Ar and about 100 sccm of $H_2$ at atmosphere pressure. Once the temperature is stabilized at about 750° C. (after about 5 min), about 100 sccm of $C_2H_2$ may be introduced into the tube for about 20 min to 30 min to initiate the synthesis of CNTs. Upon completion of the synthesis, the feed of $C_2H_2$ flow is stopped and furnace is cooled to the about 400° C. at the rate about 60° C./min and under the protection of hydrogen flow. FIG. 22B shows the SEM micrograph of the dense CNT forest grown by the above-mentioned procedure.

For the synthesis of dense PGN array, an example experimental procedure is shown in FIG. 23A. The example procedure begins with the e-beam evaporation of a about 600 nm thick Cu film on a $SiO_2/Si$ substrate followed by e-beam evaporation of about 1-2 nm thick Fe catalyst on the deposited copper film, or using the explained BCP strategy for decorating copper film with Iron particles. In the example CVD growth process, the fused silica tube is loaded with the growth substrate and heated to about 750° C. in flowing about 500 sccm of Ar and 100 sccm of $H_2$ atmosphere respectively, precisely controlled by using mass flow controllers (MFCs). Once the temperature is stabilized at about 750° C., about 50 sccm of $C_2H_2$ or $CH_4$ is introduced into the tube for about 5 to about 20 min to initiate the synthesis of PGN.

Figure 23B:
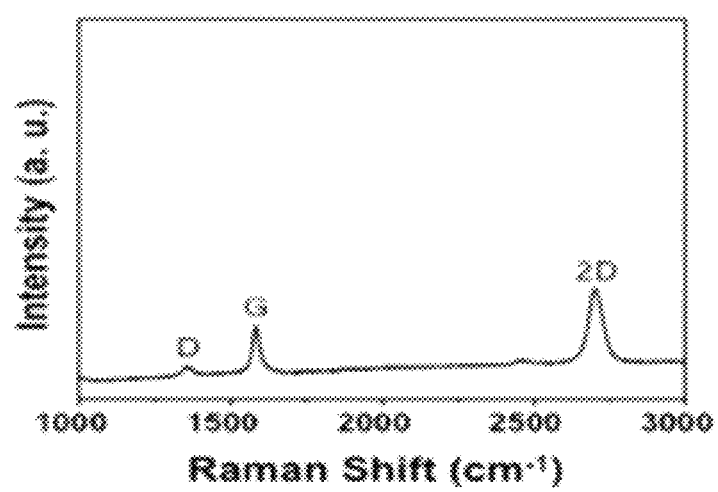
FIG. 23B is a Raman spectrum of an example of a CVD grown graphene of a PGN structure formed according to certain embodiments of the present disclosure.

With respect to cooling the pillared graphene nanostructure as shown in operational block 2060, after completing synthesis for the desired amount of time, the mass flow controllers (MFCs) for $C_2H_2$ or $CH_4$ flow are turned off, followed by cooling the furnace to the room temperature. In some embodiments, the PGN can be transferred to a desired substrate. In the example embodiment, the PGN layers are removed from the Cu film by etching in a 1 M aqueous $FeCl_3$ solution, followed by subsequent cleaning with an aqueous HCl (5%) and D.I. water solution. Subsequently, a substrate (quartz or $SiO_2$/Si) is brought into contact with the PGN layer to collect it from the D.I. water solution. The Raman spectrum collected from the graphene surface confirmed the presence of D (about 1300 $cm^{-1}$ to about 1400 $cm^{-1}$), G (about 1560 $cm^{-1}$ to about 1620 $cm^{-1}$), and 2 D (about 2660 $cm^{-1}$ to about 2700 $cm^{-1}$) bands as shown in FIG. 23B, which had similar characteristics reported herein for CVD grown mono- to bi-layer graphene layers.

Figure 24A:
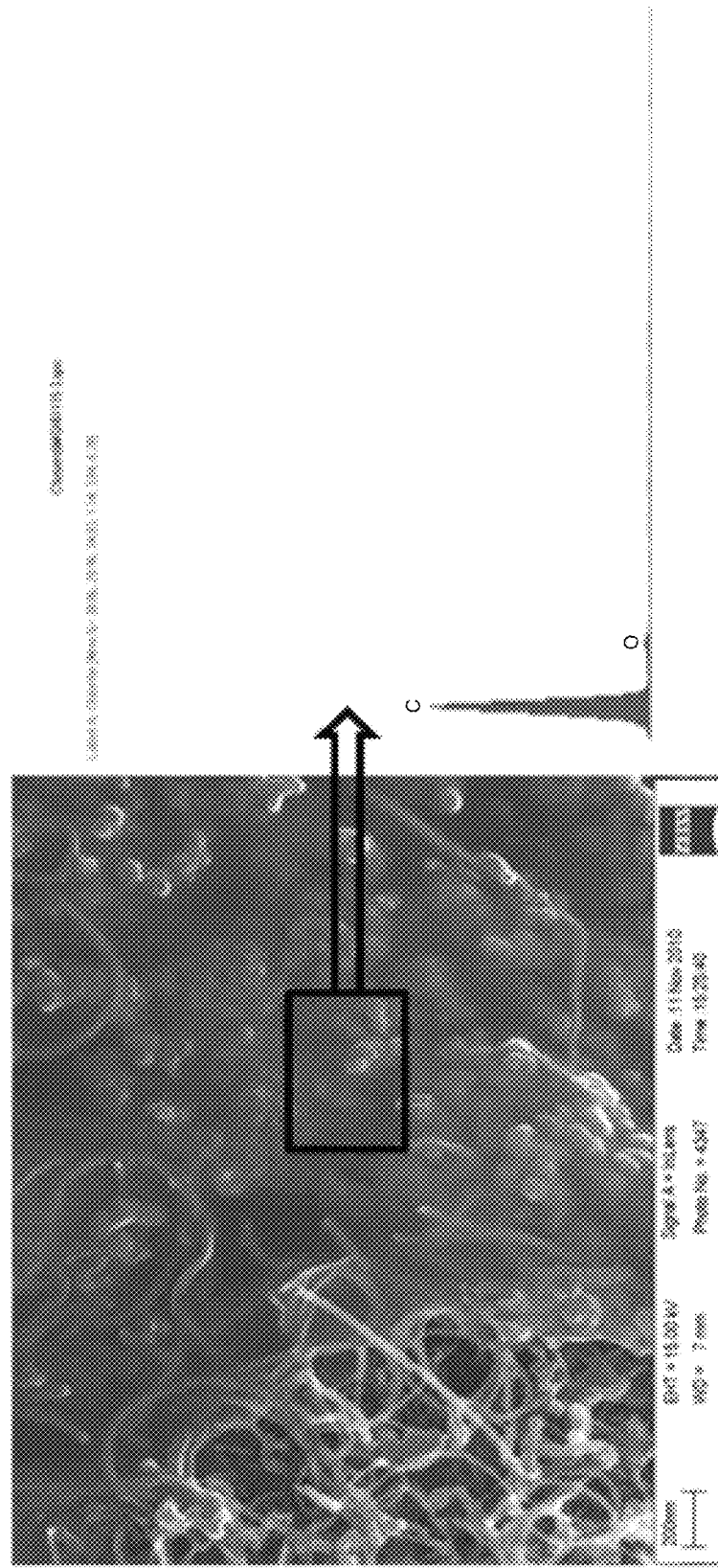
FIG. 24A is an SEM image of a bottom view of an example of a synthesized PGN formed according to certain embodiments of the present disclosure.
Figure 24C:
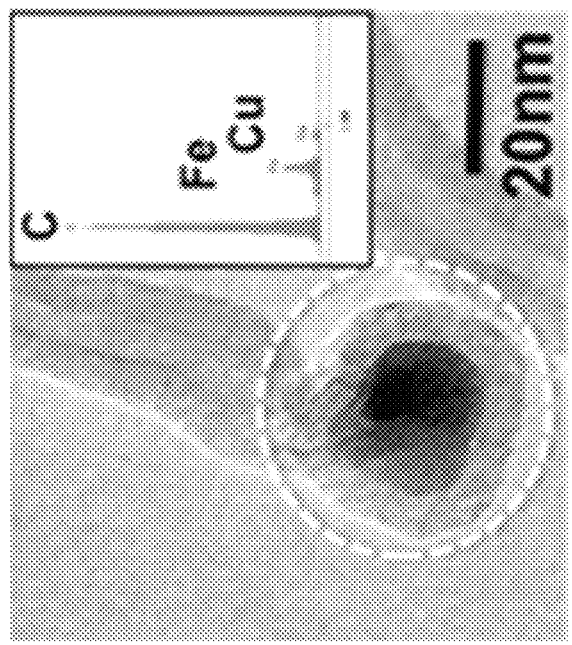
FIG. 24C is a TEM image of an example embodiment of a Fe catalyst particle on the tip of a CNT (dashed circle).
Figure 24B:
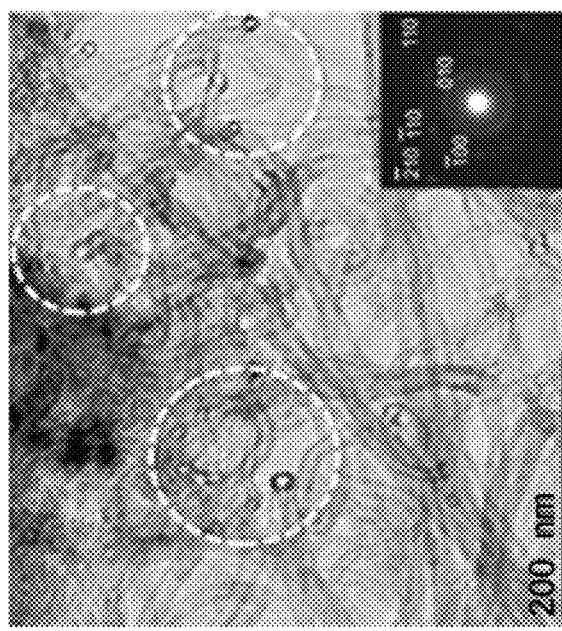
FIG. 24B is an enlarged TEM image of the bottom view of the PGN of the example of FIG. 24A.

FIG. 24A shows SEM micrograph of bottom view of synthesized PGN. To take this image, a double side carbon tape used to peel the PGN structure from copper substrate and monitor the back side. The graphene floor and CNTs grown from it is visible on the image. FIG. 24B is an enlarged TEM micrograph of the bottom view of the PGN. This is a significant observation of the interface between CNT pillars and graphene of the PGN. The root of individual CNTs is directly connected to the graphene surface. The circular hollow patterns in the interface of a CNT and graphene layer are also visible, as shown with the dashed circles in FIG. 24B.

The inset electron diffraction pattern in FIG. 24B includes concentric rings which are expected since multi-walled carbon nanotubes are concentric tubes of cylindrically rolled graphene layers. The embedded typical six-fold symmetrical spots are made possible due to the mono- or bi-layer graphene film. The clear lattice fringe on the interface confirmed seamless crystalline interface of the two carbon allotropes. The inset EDS spectrum in FIG. 24C taken from Fe catalyst particle on the tip of a CNT (dashed circle) confirmed the existence of C, Fe, and Cu elements. The Cu peak appeared due to the TEM Cu grid used for holding the PGN. TEM observations also revealed the growth mechanism of CNT pillars on the graphene layer through a vapor-liquid-solid mechanism.

Figure 25B:
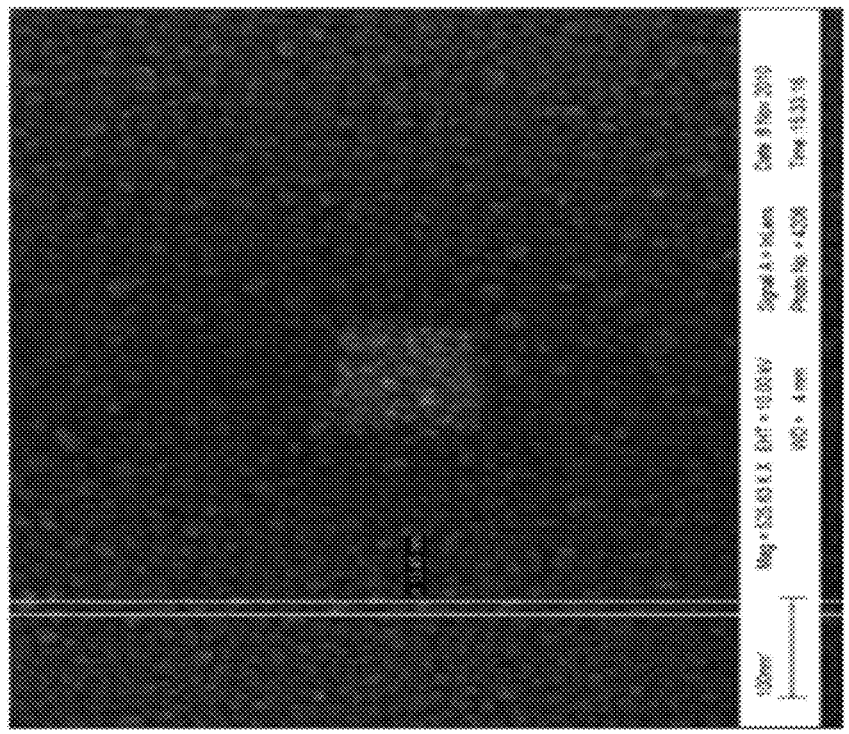
FIG. 25B is an SEM image of an example of e-beam evaporated Fe layers having thickness of approximately 1 nm to approximately 5 nm that have been subjected to annealing at about 700° C. for approximately 30 seconds.
Figure 25A:
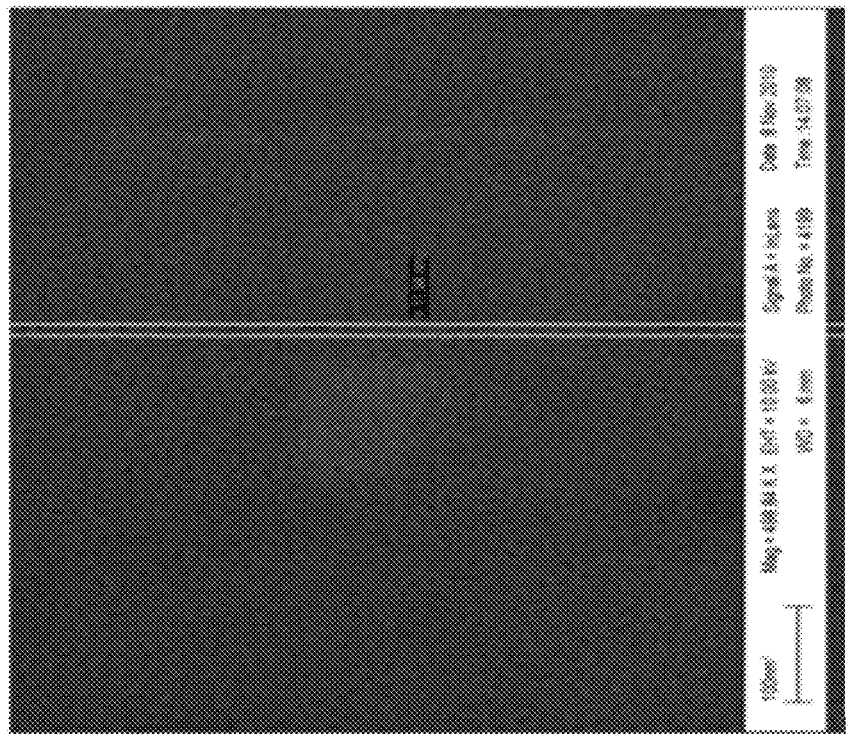
FIG. 25A is an SEM image of an embodiment of e-beam evaporated Fe layers having a thickness of approximately 3 nm, without annealing.
Figure 25C:
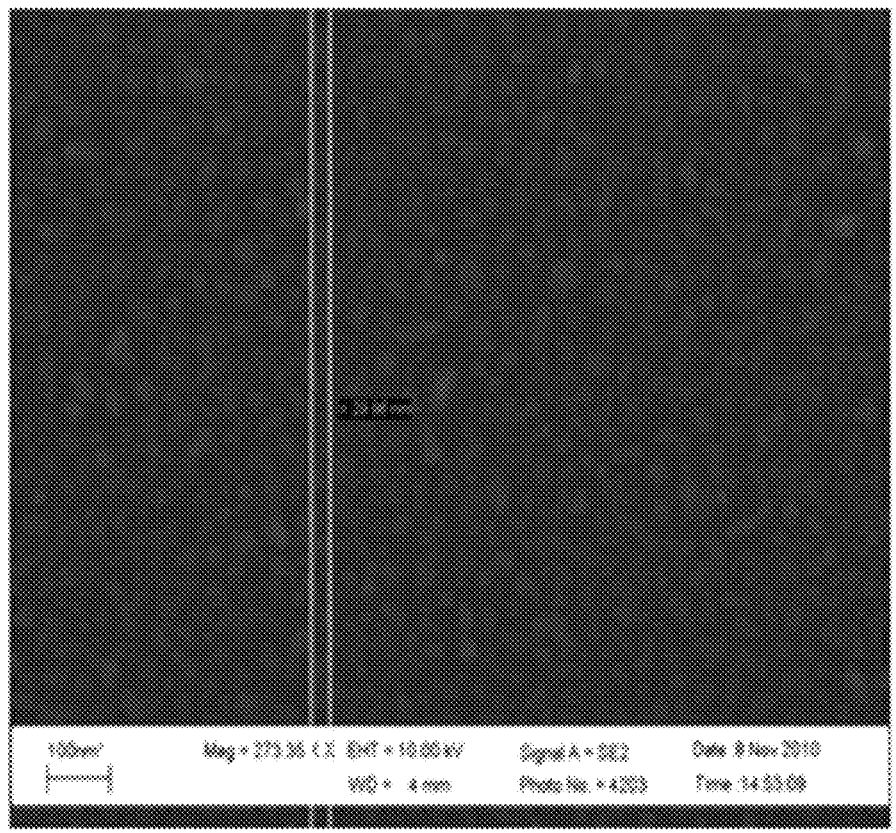
FIG. 25C is an SEM image of an example of e-beam evaporated Fe layers of approximately 3 nm thick after 30 sec. annealing at about 900° C.

In certain embodiments, the method 2000 further comprises controlling the size and separation of the carbon nanotubes by controlling the size and separation of the loaded catalyst. To control the size and morphology of the physically deposited (by e-beam evaporator) catalyst particles, Rapid Thermal Processing (RTP) method has been used. FIGS. 25A, 25B, and 25C show e-beam evaporated Fe layers of 3 nm thickness with: (A) no annealing; (B) about 30 seconds annealing at about 700 C; and (C) about 30 seconds annealing at 900 C. The results indicate increase in size and separation distance of Fe particles with annealing temperature. It may be observed that control over size and separation of catalyst nanoparticles that are prepared and patterned by BCP method, as opposed to simple evaporation followed by annealing, is provided through choice of polymer blocks and their molecular weight.

Figure 26B:
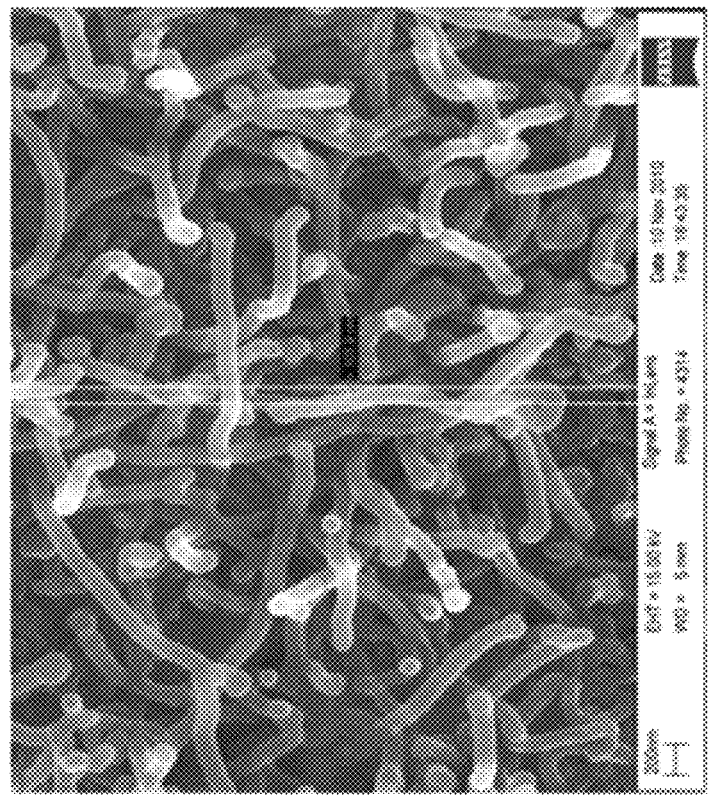
FIGS. 26A and 26B are SEM images of examples embodiments of CNTs synthesized with e-beam evaporated catalysts (average diameter of the CNTs is approximately 100 nm).
Figure 26A:
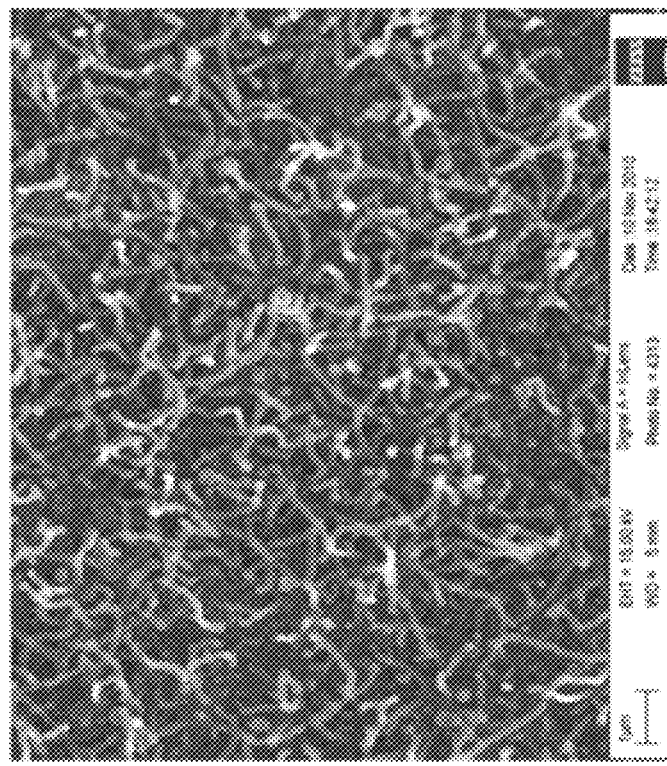
Figure 26D:
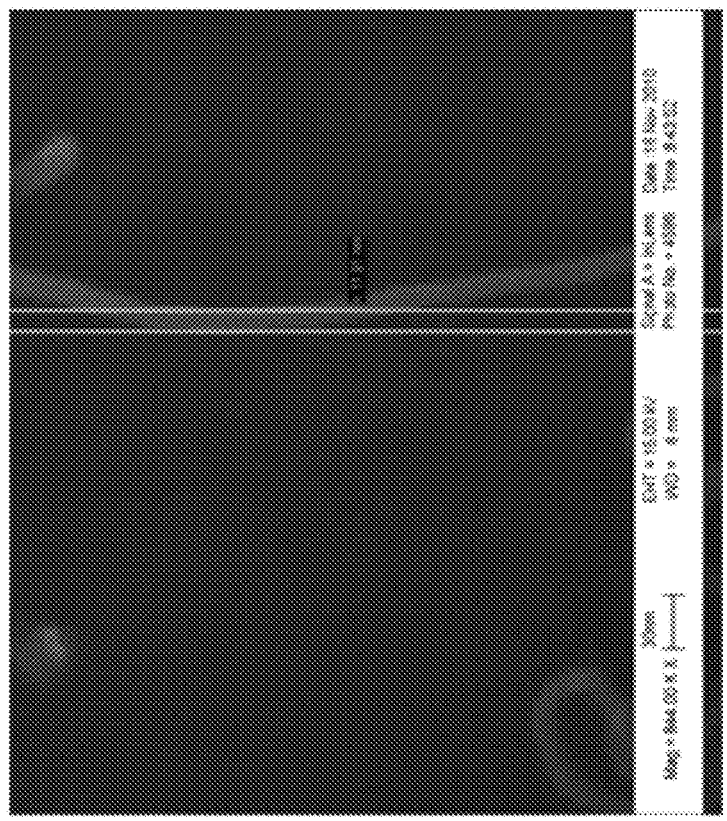
FIGS. 26C and 26D are SEM images of example embodiments of CNTs synthesized with BCP templates (average diameter of the CNTs is approximately 12 nm).
Figure 26C:
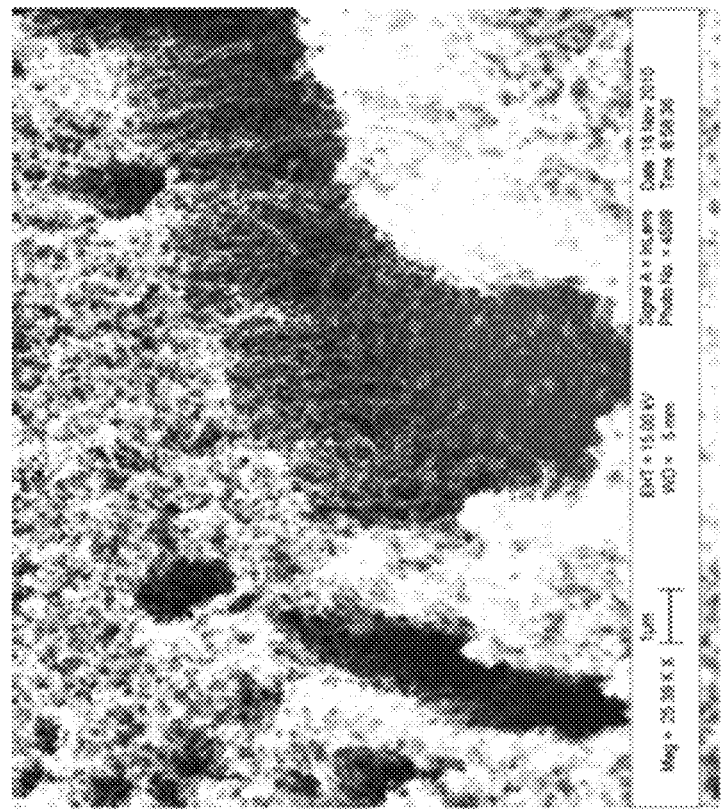

In certain embodiments, control over the diameter of carbon nanotubes is one the important factors for successful synthesis of desired PGN structures. The size of the metallic catalysts used for CVD process can have a direct impact on the diameter of grown CNTs. Here two different methods for preparation of catalytic particles are employed. In an embodiment of a first method, an approximately 3 nm multilayer of Fe and Ni has been e-beam evaporated on top the growth substrate and annealed for about 1 min at about 750° C. In an embodiment of a second method, block copolymer template is used to produce and pattern Fe nanoparticles of about 10 nm diameter and about 30 nm separation distances. FIGS. 26A and 26B show the SEM images of CNTs at different magnifications, with average diameter 100 nm, which are synthesized using first method catalyst particles and have an average diameter of about 100 nm; whereas FIGS. 26C and 26D show SEM images of CNTs grown from second method catalysts at different magnifications with average diameter of about 12 nm. It can be seen that BCP synthesized catalysts yield thinner CNTs with better alignment in the growth direction. Note that other growth parameters, such as supply of carbon feed and growth temperature, also can play a significant role in the control of CNT diameters.

Figure 27B:
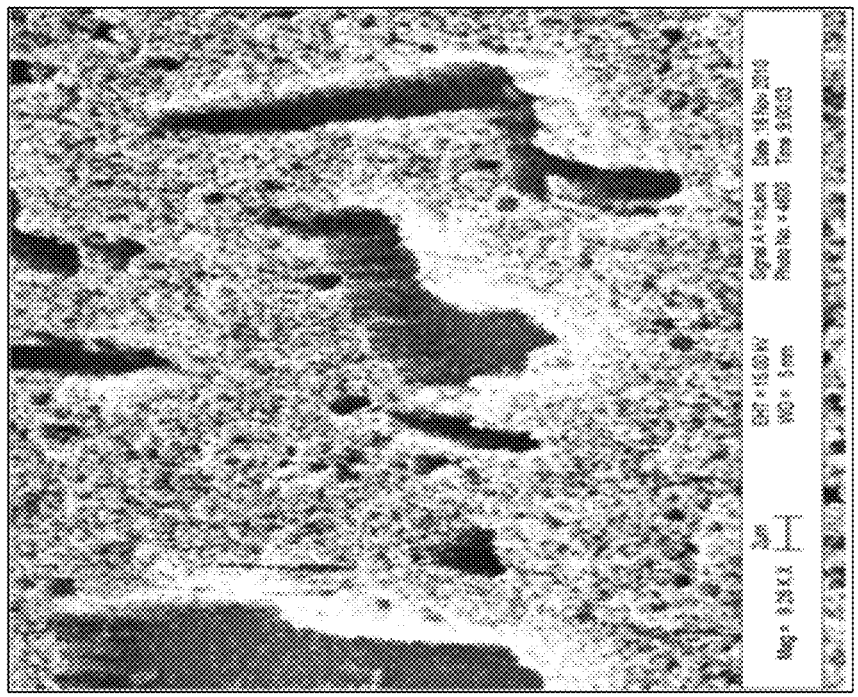
FIG. 27B is SEM image of an example embodiment of CNTs grown from block copolymer (BCP) patterned iron (Fe) nanoparticles.
Figure 27A:
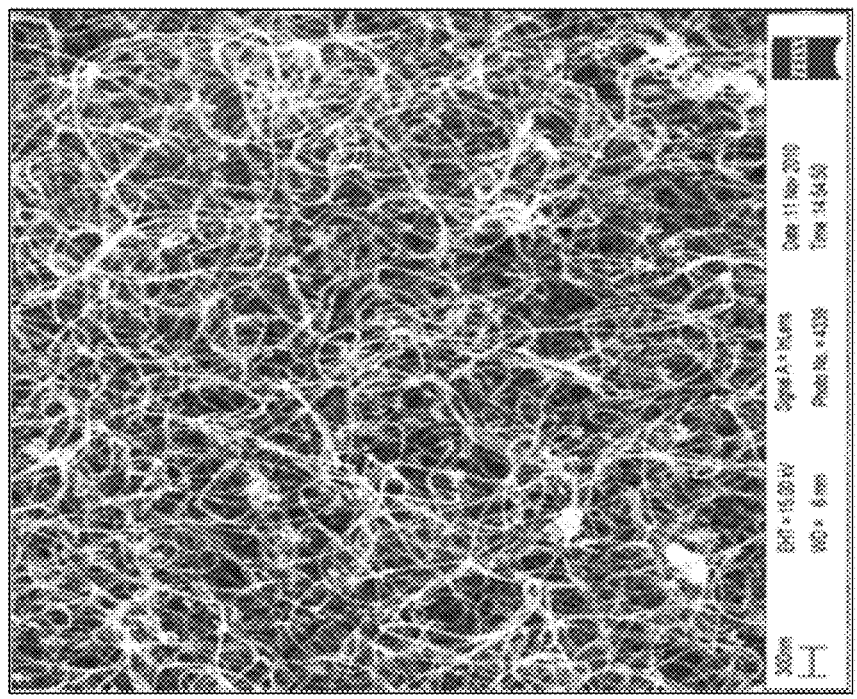
FIG. 27A is an SEM image of an example embodiment of CNTs grown from e-beam evaporated Fe particles.
Figure 28A:
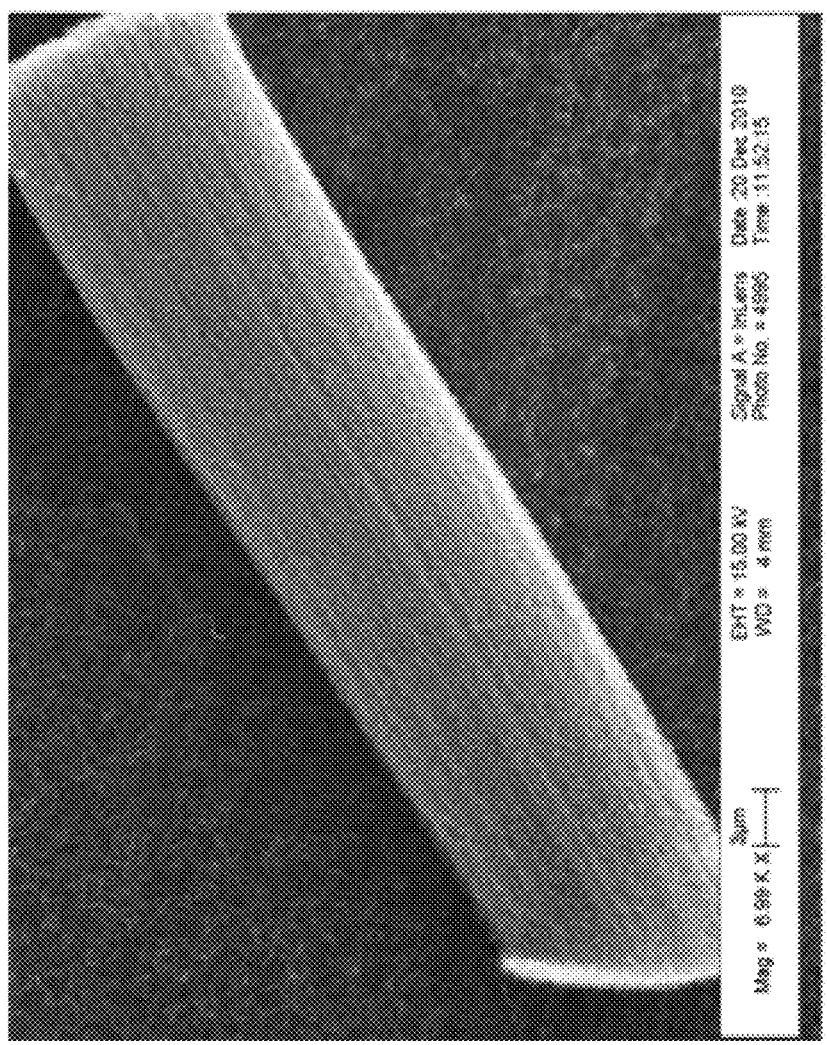
FIGS. 28A-28E are SEM images of example embodiments of CNTs grown from block copolymer (BCP) patterned iron (Fe) nanoparticles.
Figure 28B:
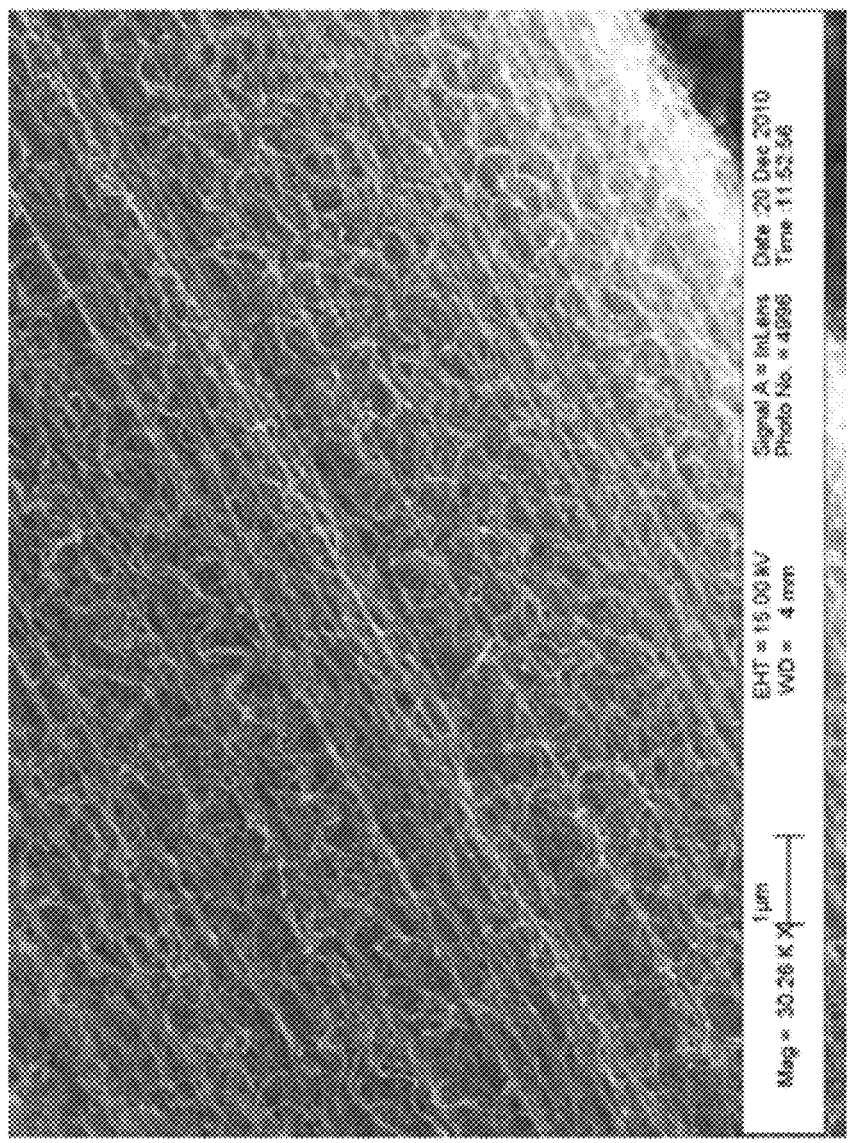
Figure 28C:
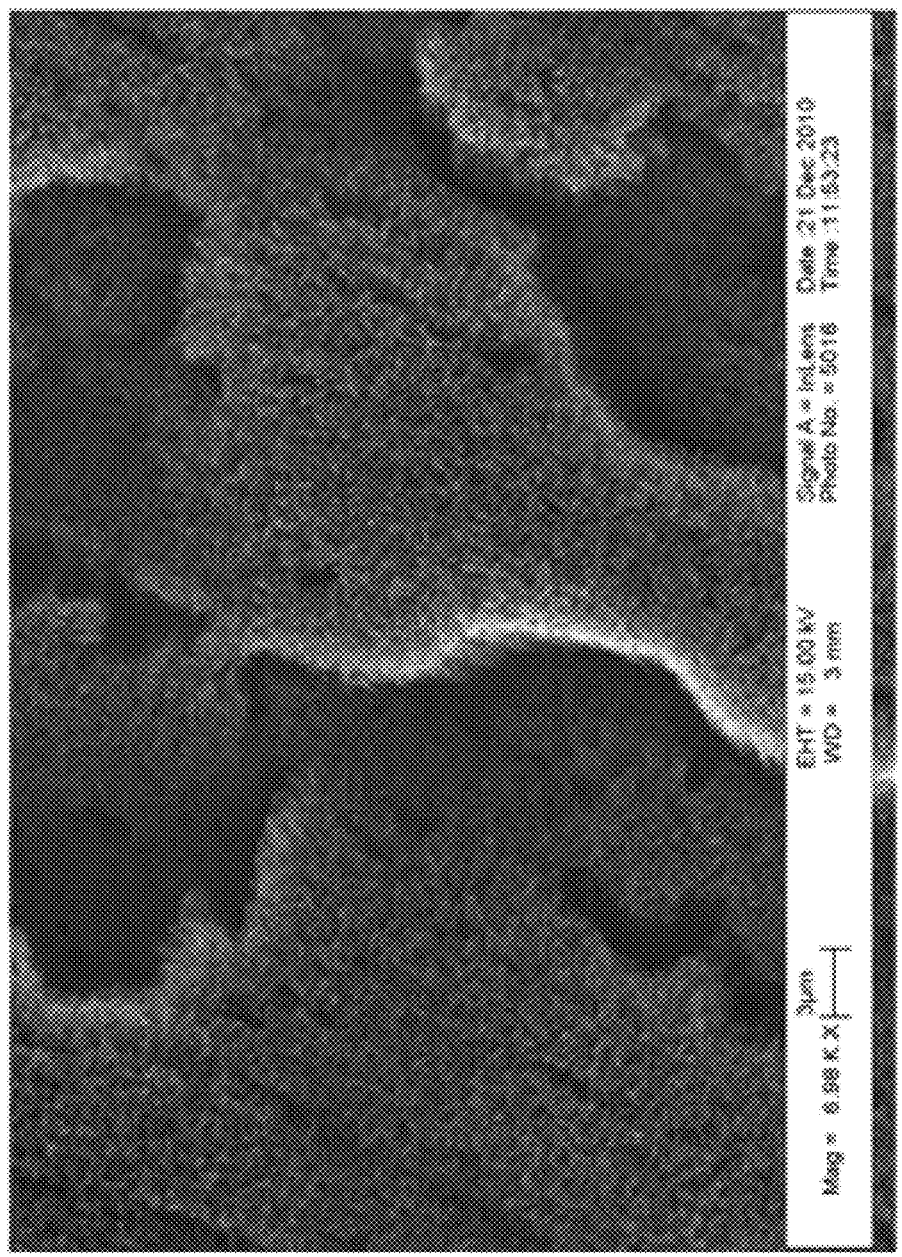
Figure 28D:
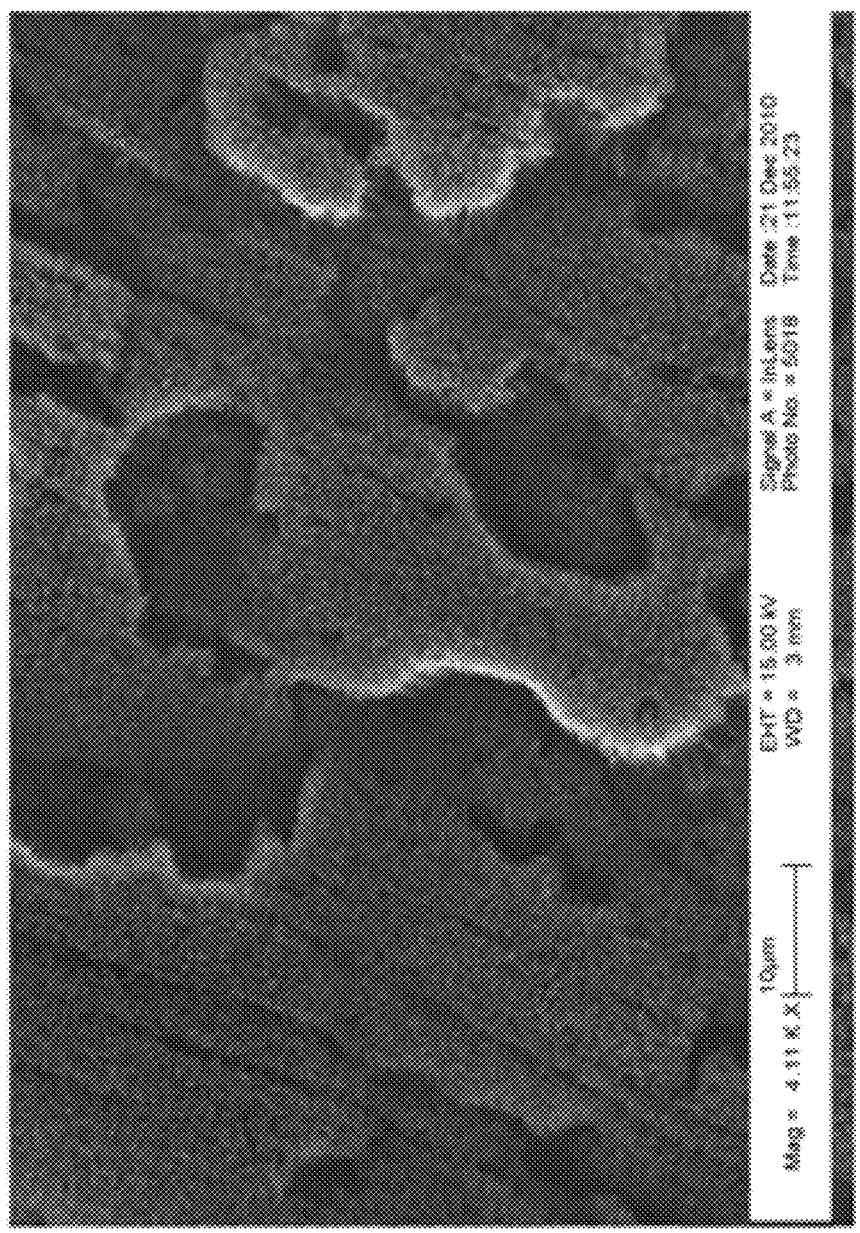
Figure 28E:
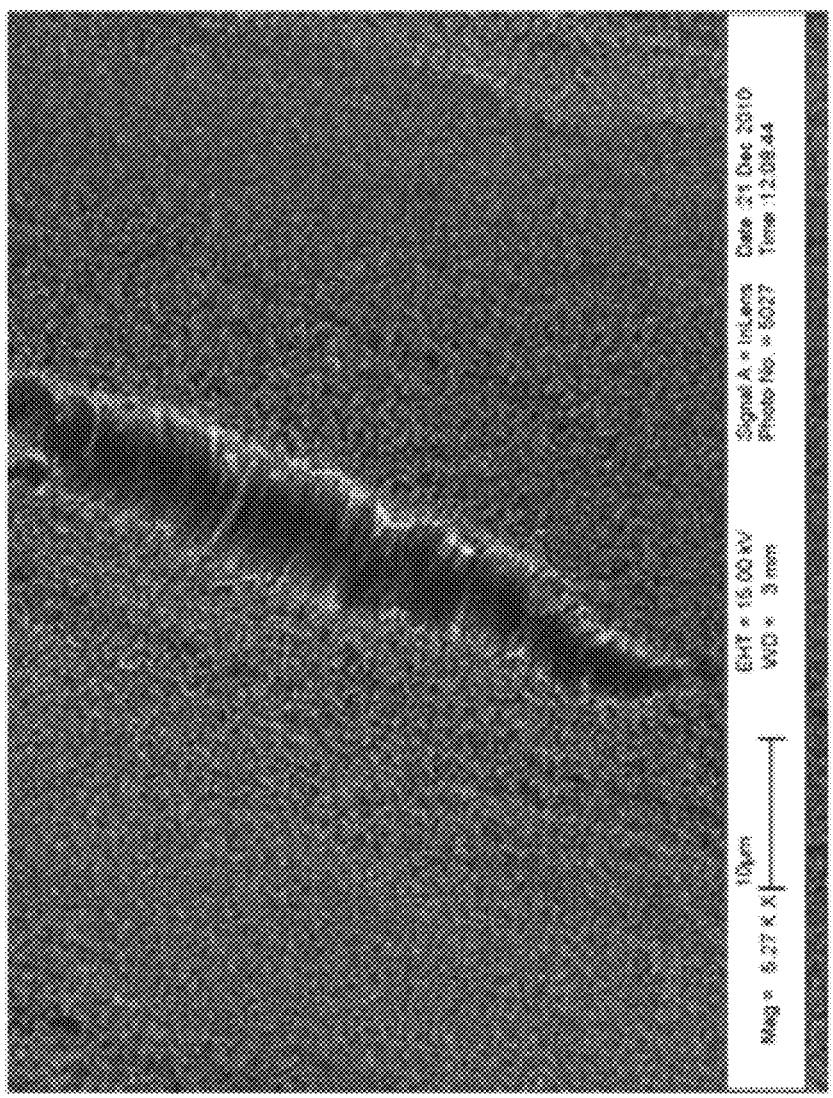
Figure 29A:
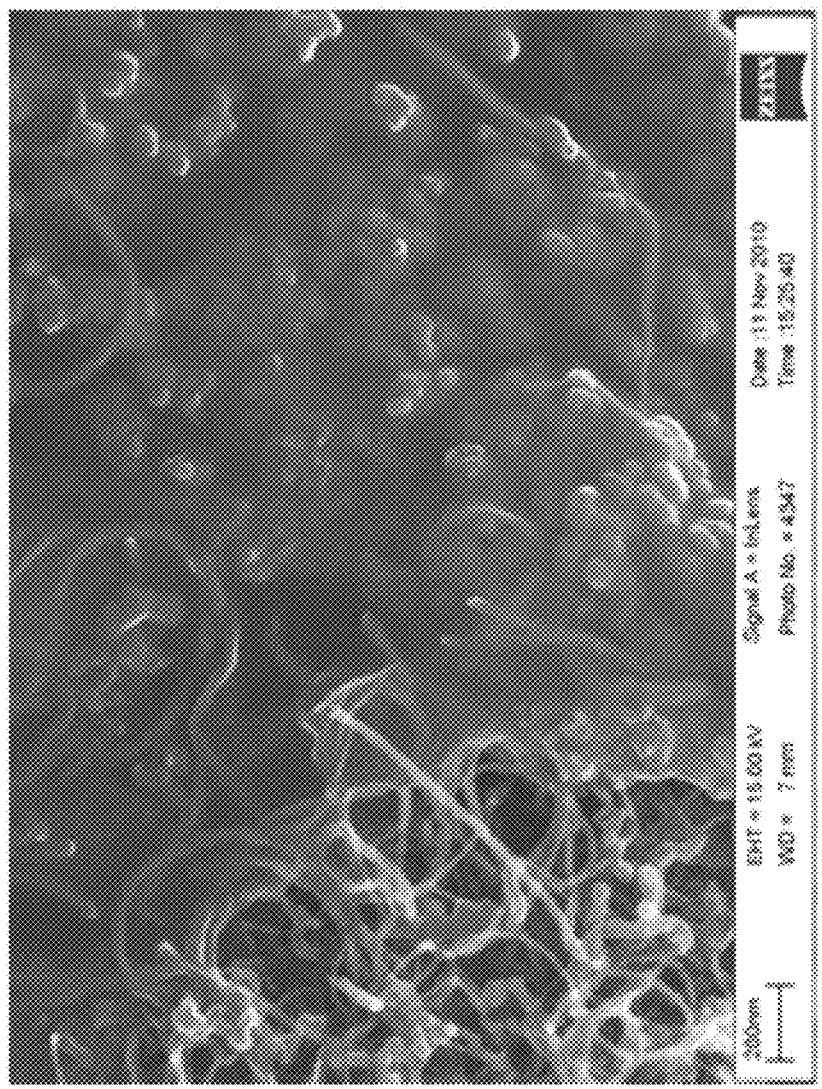
FIGS. 29A-29F are SEM images taken from the back of example embodiments of PGN samples.
Figure 29B:
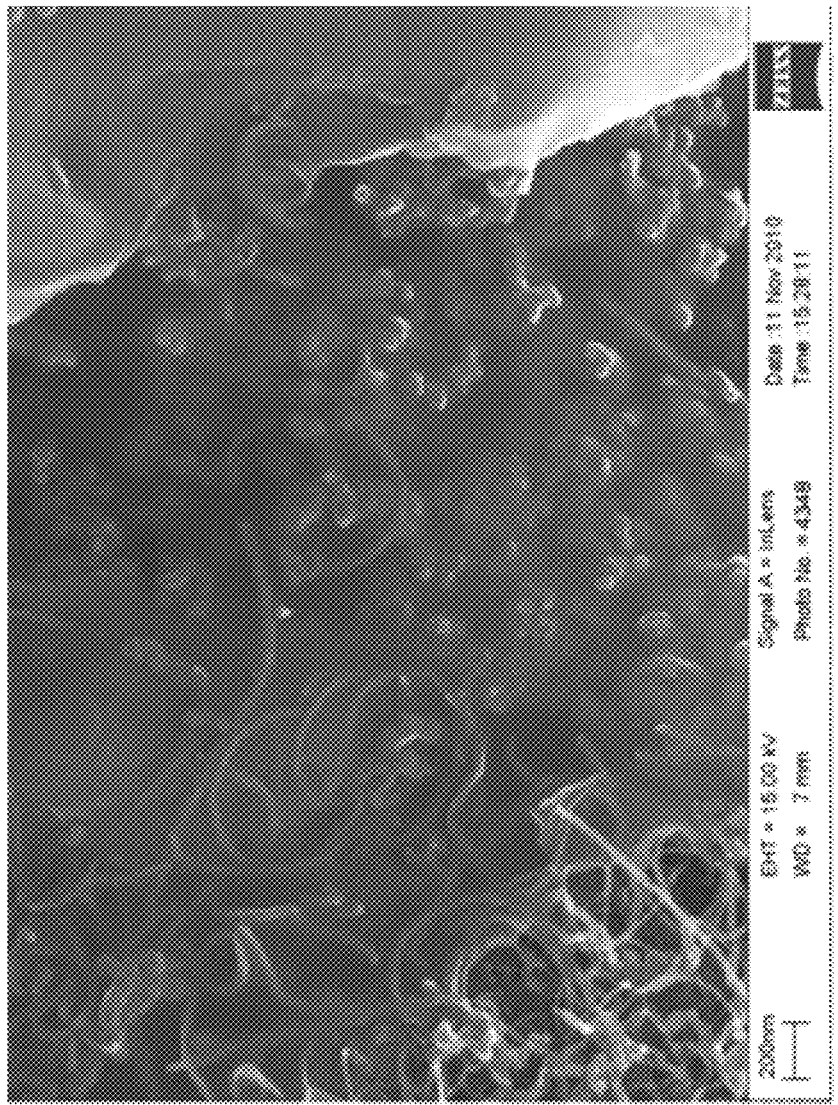
Figure 29C:
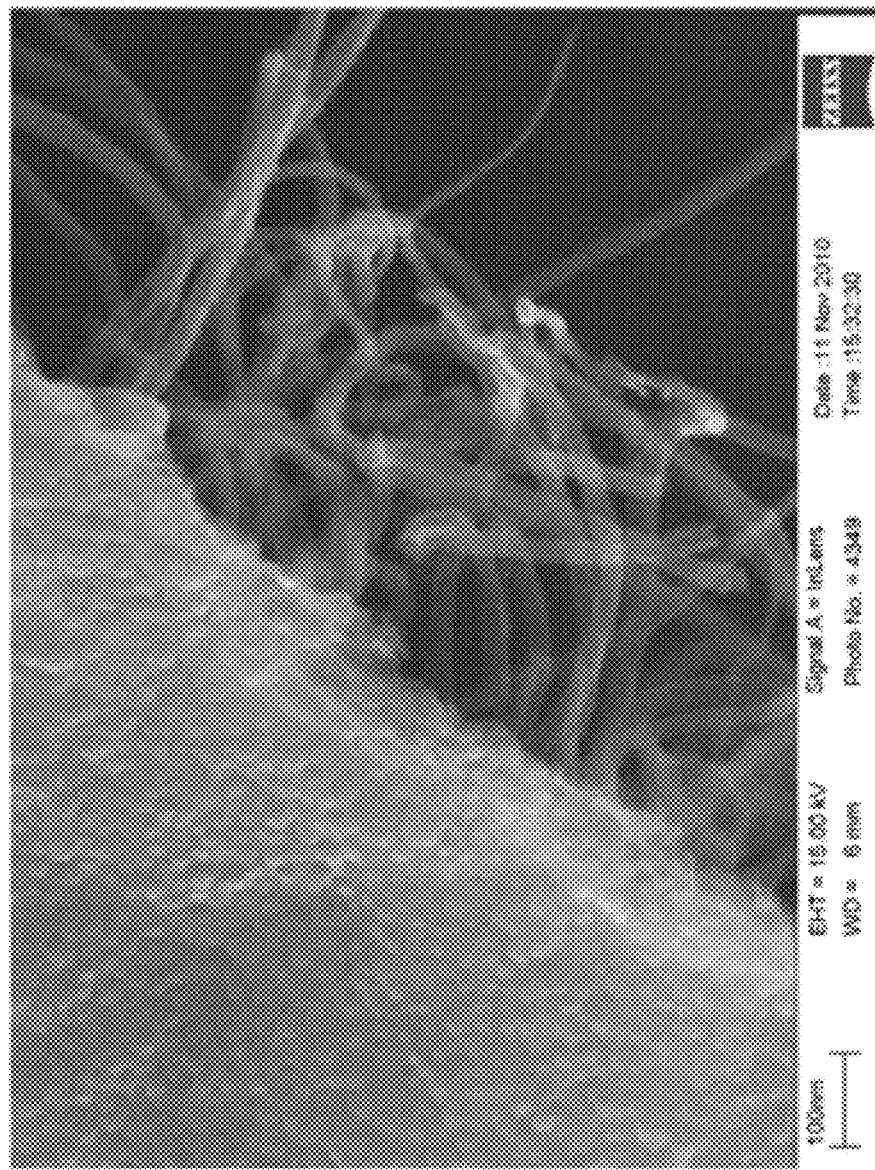
Figure 29D:
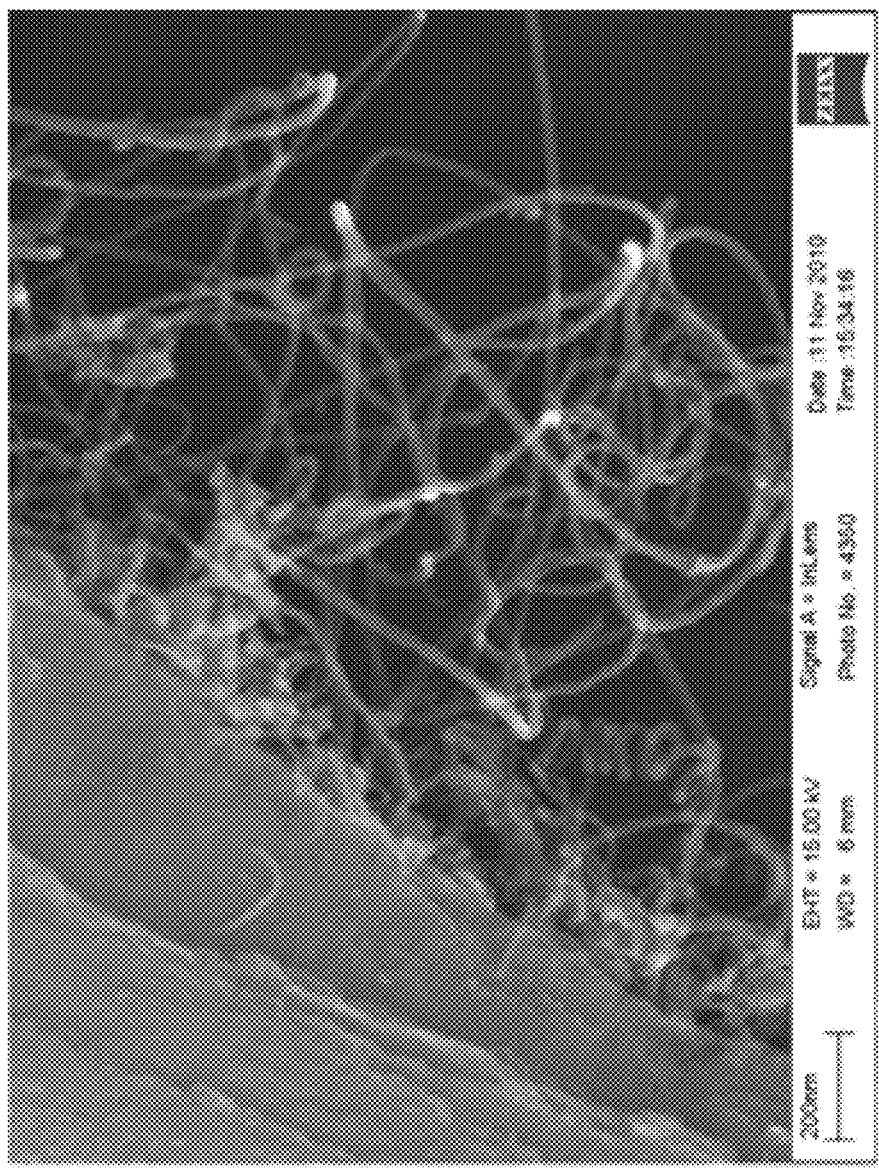
Figure 29E:
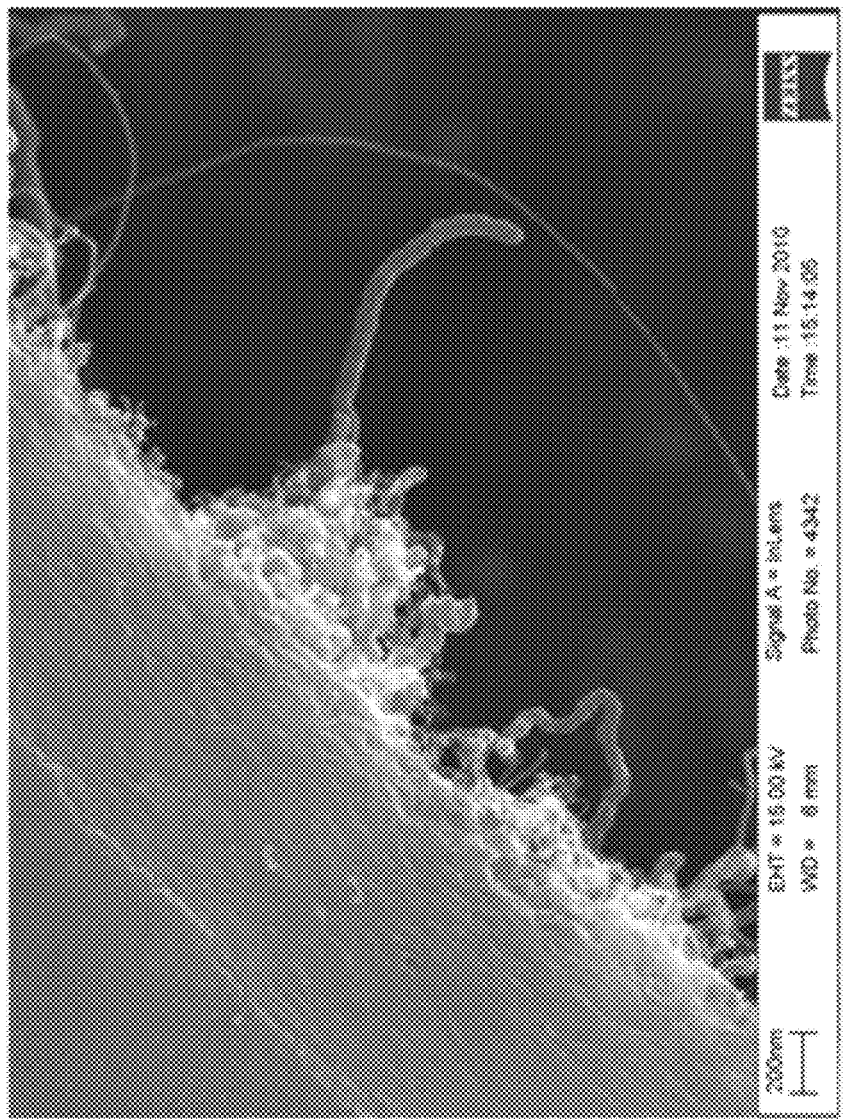
Figure 29F:
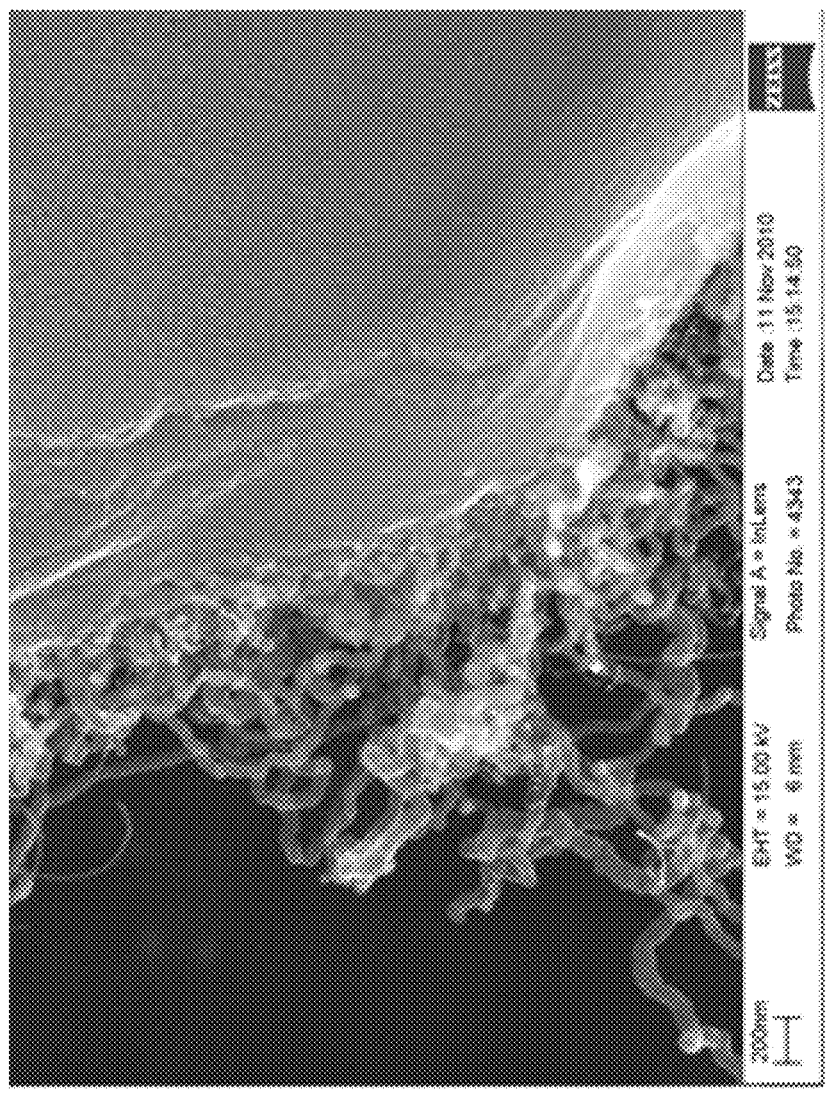
Figure 30A:
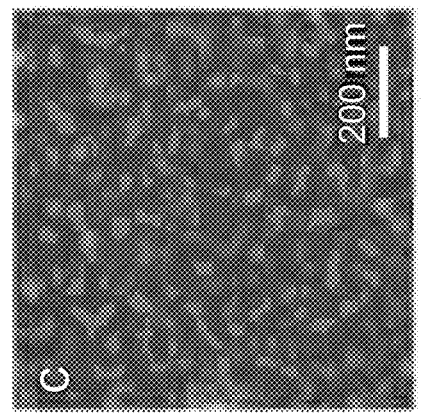
FIGS. 30A-30D show (a) an AFM image of an example embodiment of PS-P4VP block-copolymers; (b) an AFM image of an example embodiment of BCP after exposure to plasma for about 110 sec; (c) an AFM image of an example embodiment of BCP after exposure to plasma for about 200 sec; and (d) the Raman spectra of example embodiments of monolayer and bi-layer graphene samples.
Figure 30B:
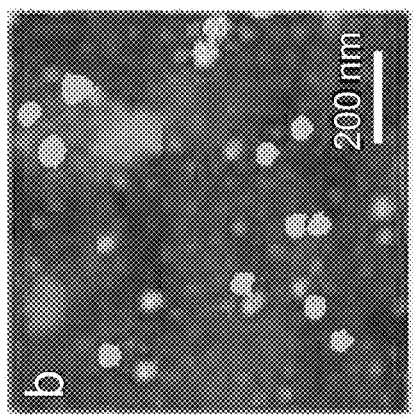
Figure 30C:
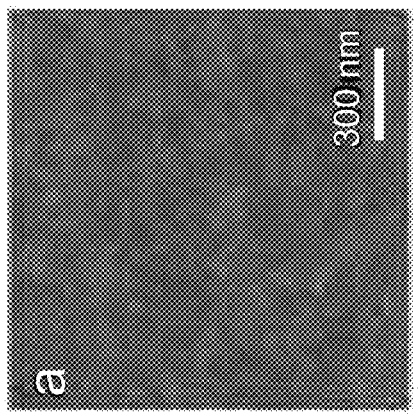
Figure 30D:
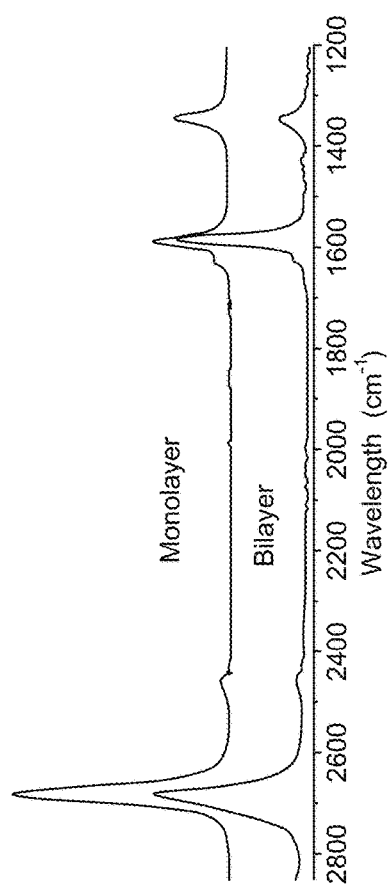

The orientation of grown CNTs can be highly influenced by the interaction of between catalyst particles and substrate. By reducing the interaction between catalysts and substrates, better control over the orientation in the CVD growth process may be provided. Therefore, different methods of preparation of catalyst particles, by virtue of their very different mechanism of catalytic particle fabrication, result in different quality of alignment in CNT growth. FIG. 27B shows an SEM image of the CNT growth in which block copolymers have been used for preparation of Fe particles, whereas in FIG. 27A shows an Fe catalyst layer Fe is e-beam evaporated on top the growth substrate. FIGS. 28A-28E show the improvement of BCP strategy in term of growth alignment.

Further images and measurements for example embodiments are disclosed herein. For example, FIGS. 29A-29F are SEM images taken from the back of example embodiments of PGN samples. In addition, FIGS. 30A-30D show (a) an AFM image of an example embodiment of PS-P4VP block-copolymers; (b) an AFM image of an example embodiment of BCP after exposure to plasma for about 110 sec; (c) an AFM image of an example embodiment of BCP after exposure to plasma for about 200 sec; and (d) the Raman spectra of example embodiments of monolayer and bi-layer graphene samples.

Figure 31A:
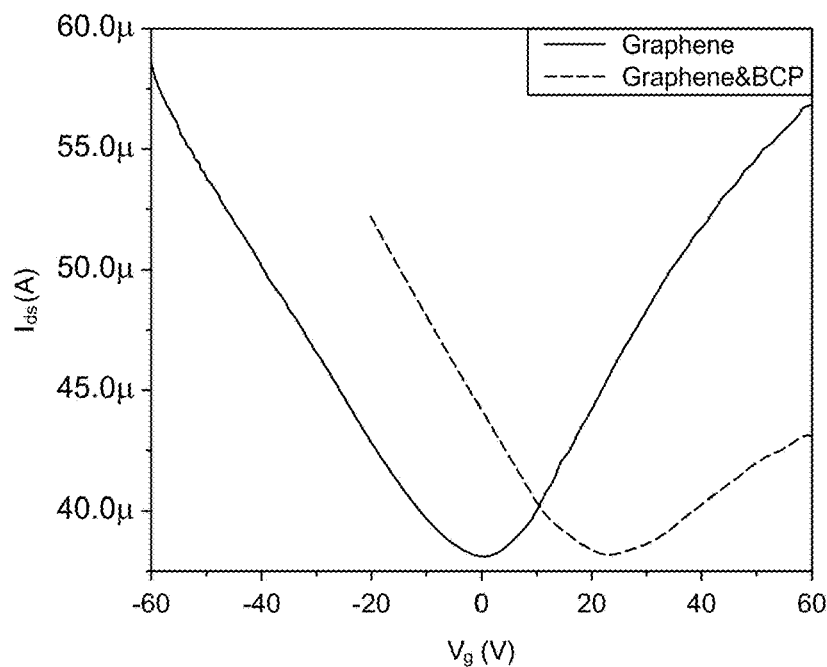
FIG. 31A shows a plot of the source-drain current vs. gate voltage ($I_{ds}$-$V_g$) curves for example embodiments of pristine graphene and BCP-covered graphene field-effect transistor (GFET) devices after drying in air.
Figure 31B:
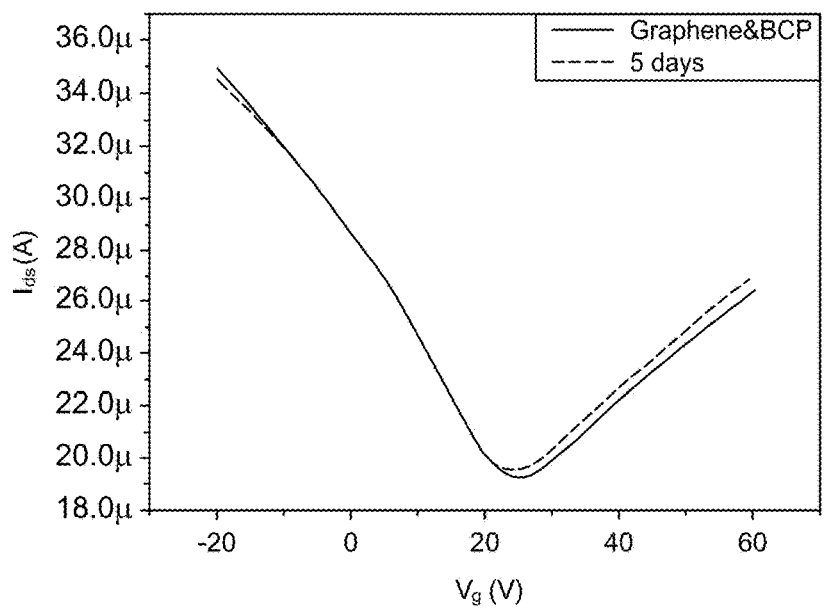
FIG. 31B shows a plot of the $I_{ds}$-$V_g$ curves of GFET covered with BCP and during approximately 5 days within a vacuum desiccator.
Figure 31C:
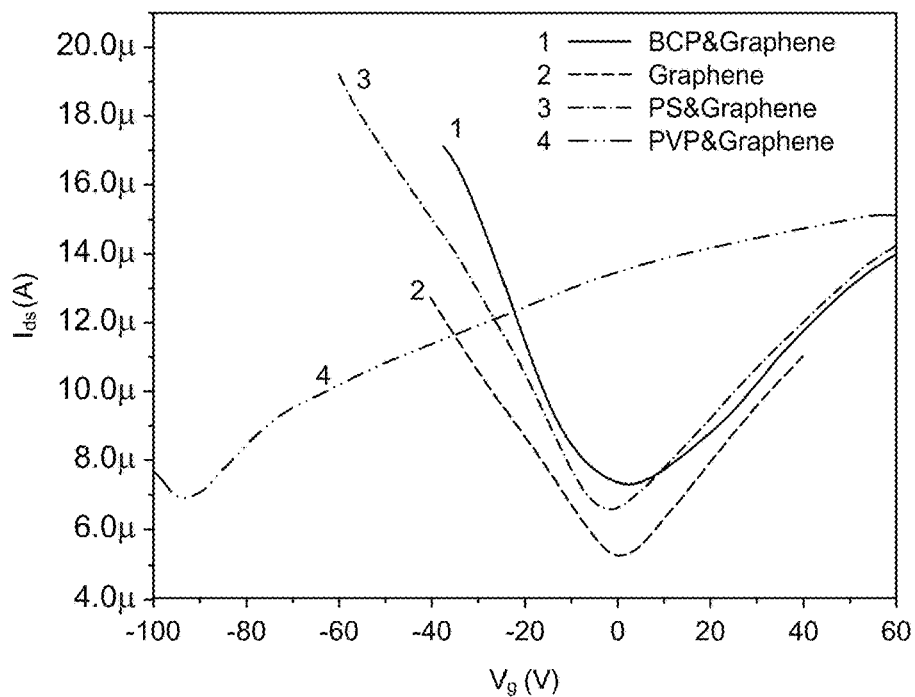
FIG. 31C shows a plot of the $I_{ds}$-$V_g$ curves for example embodiments of GFET devices with pristine graphene, graphene doped with polystyrene (PS), graphene doped with polyvinylpyrrolidone (PVP), and BCP covered graphene subjected to high vacuum annealing at about 50° C. for about 12 hrs.
Figure 31D:
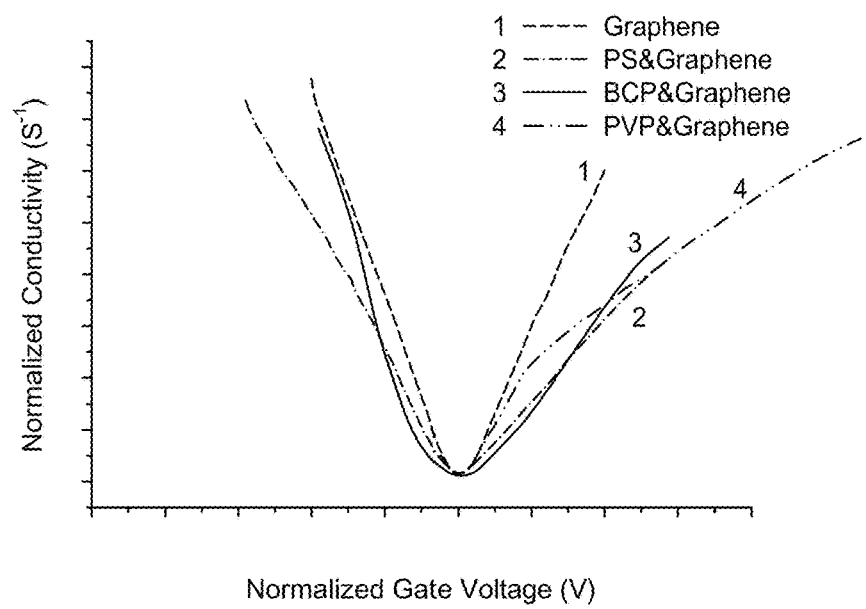
FIG. 31D shows a plot of normalized source-drain conductivity vs. normalized gate voltage ($G_{ds}$-$V_g$) curves for example embodiments of graphene devices with pristine graphene, PS covered graphene, PVP covered graphene, and BCP covered graphene.

The used of BCP covered graphene devices can be compared to other embodiments of graphene based devices. For example, FIG. 31A shows a plot of the source-drain current vs. gate voltage ($I_{ds}$-$V_g$) curves for example embodiments of pristine graphene and BCP-covered graphene field-effect transistor (GFET) devices after drying in air. FIG. 31B shows a plot of the $I_{ds}$-$V_g$ curves of GFET covered with BCP and during approximately 5 days within a vacuum desiccator. FIG. 31C shows a plot of the $I_{ds}$-$V_g$ curves for example embodiments of GFET devices with pristine graphene, graphene doped with polystyrene (PS), graphene doped with polyvinylpyrrolidone (PVP), and BCP covered graphene subjected to high vacuum annealing at about 50° C. for about 12 hrs. FIG. 31D shows a plot of normalized source-drain conductivity vs. normalized gate voltage ($G_{ds}$-$V_g$) curves for example embodiments of graphene devices with pristine graphene, PS covered graphene, PVP covered graphene, and BCP covered graphene.

Figure 32A:
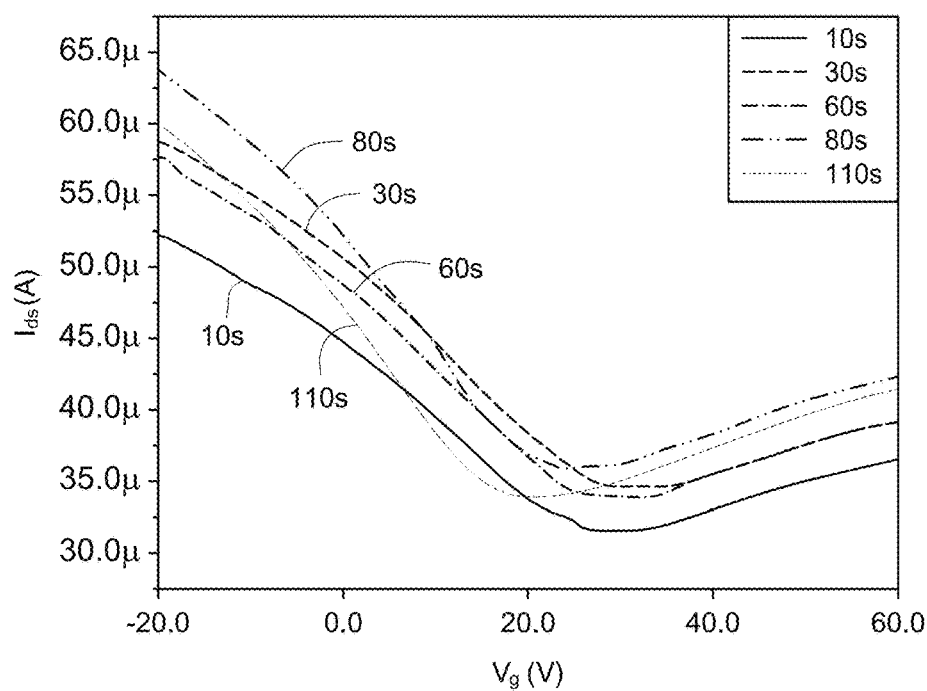
FIG. 32A shows a plot of the source-drain current vs. gate voltage ($Id_s$-$V_g$) curves from example embodiments of samples obtained after different plasma exposure times. The exposure time was accumulated.
Figure 32B:
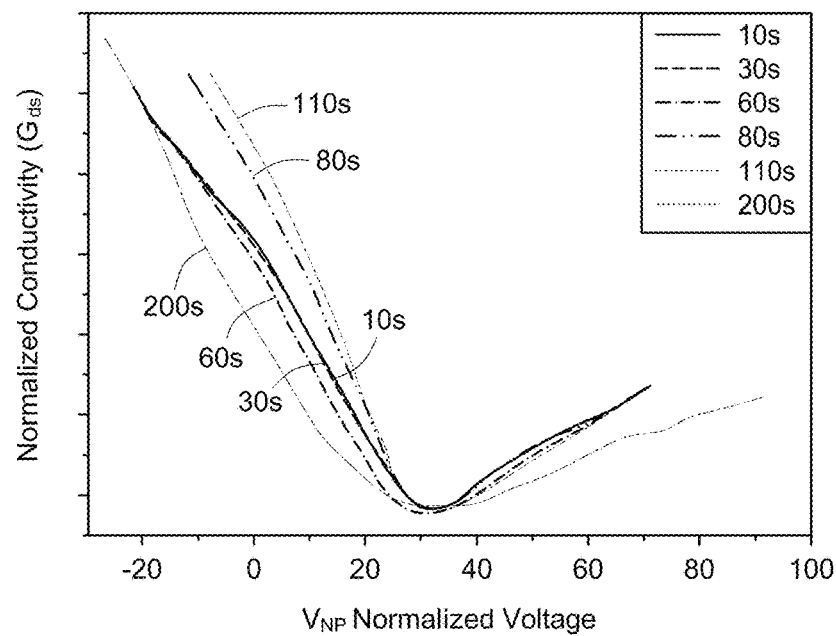
FIG. 32B shows a plot of the normalized source-drain conductance vs. normalized gate voltage ($G_{ds}$-$V_g$) curves from the example embodiments of a graphene device of the present disclosure after different plasma exposure times.

Measurements with respect to plasma treatment can also be compared. For example, FIG. 32A shows a plot of the source-drain current vs. gate voltage ($I_{ds}$-$V_g$) curves from example embodiments of samples obtained after different plasma exposure times. The exposure time was accumulated. FIG. 32B shows a plot of the normalized source-drain conductance vs. normalized gate voltage ($G_{ds}$-$V_g$) curves from the example embodiments of a graphene device of the present disclosure after different plasma exposure times.

Figure 33:
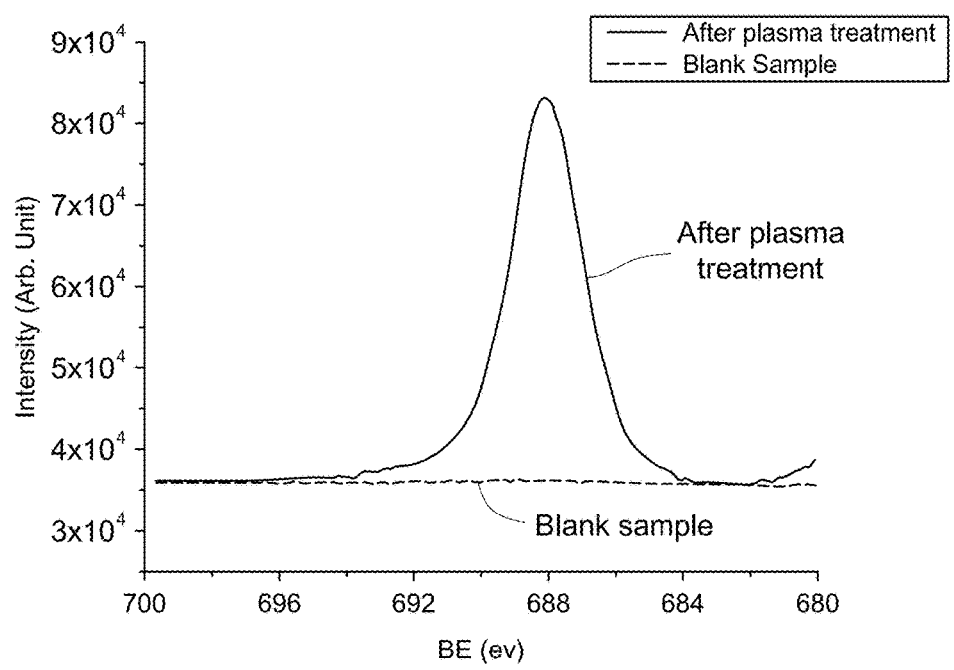
FIG. 33 is a plot illustrating the F is XPS spectra (Intensity vs. BE) from an example embodiment of a blank graphene sample and from an example embodiment of a sample after a $CF_4$ plasma treatment for approximately 10 sec.
Figure 34A:
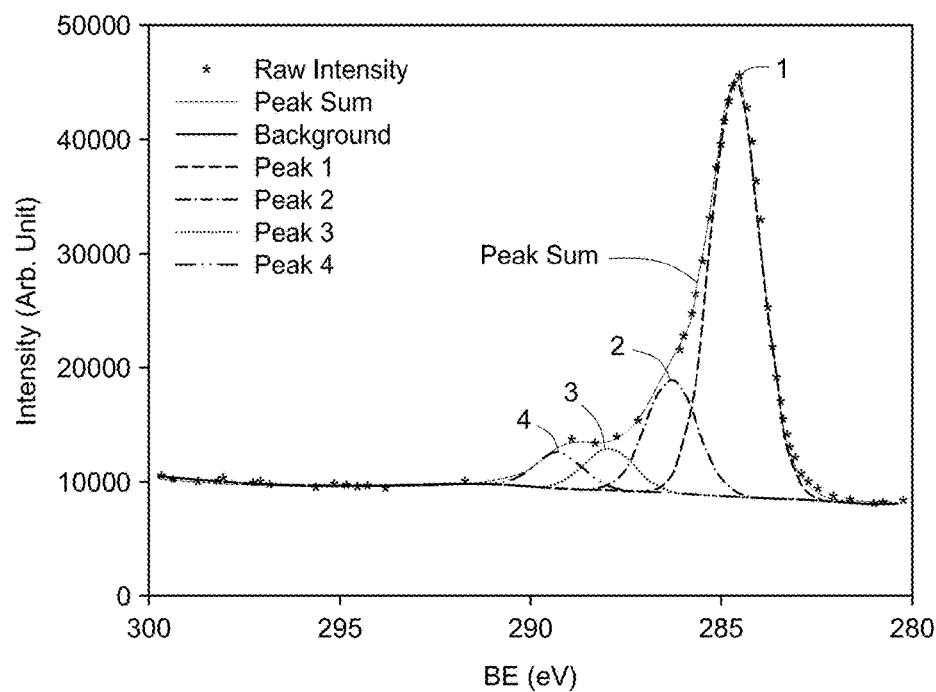
FIG. 34A is a plot of the Intensity vs. BE curves in a control sample of pristine graphene before a $CF_4$ plasma treatment for approximately 30 sec.
Figure 34B:
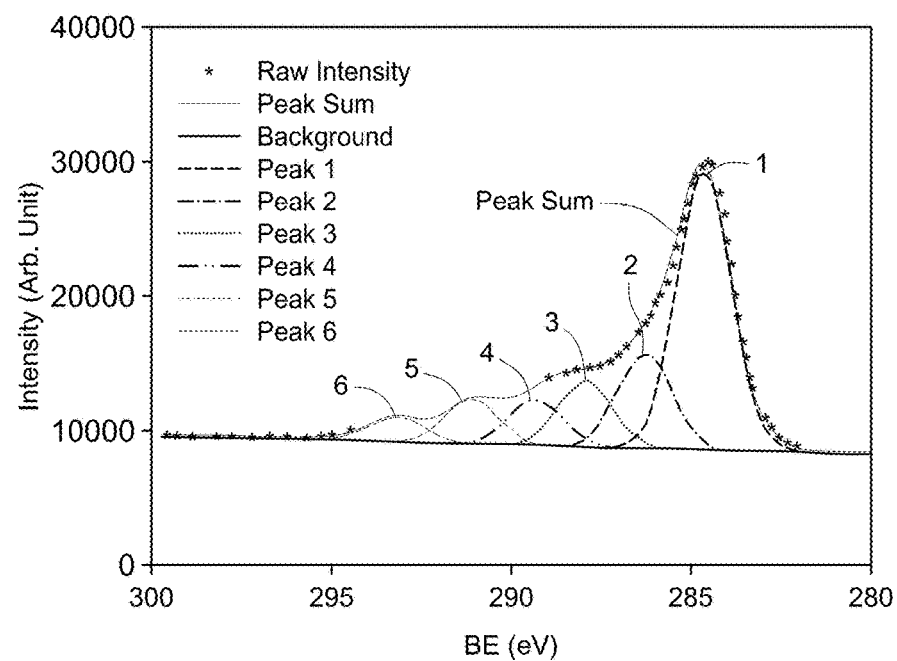
FIG. 34B is a plot of the Intensity vs. BE curves after a $CF_4$ plasma treatment for approximately 30 sec. An increase in resistivity of approximately an order of magnitude is observed after the approximately 30 s plasma treatment.

Furthermore, FIG. 33 is a plot illustrating the F is XPS spectra (Intensity vs. BE) from an example embodiment of a blank graphene sample and from an example embodiment of a sample after a $CF_4$ plasma treatment for approximately 10 sec. FIG. 34A is a plot of the Intensity vs. BE curves in a control sample of pristine graphene before a $CF_4$ plasma treatment for approximately 30 sec. FIG. 34B is a plot of the Intensity vs. BE curves in the control sample after a $CF_4$ plasma treatment for approximately 30 sec. An increase in resistivity of approximately an order of magnitude was observed after the approximately 30 s plasma treatment.

Figure 35A:
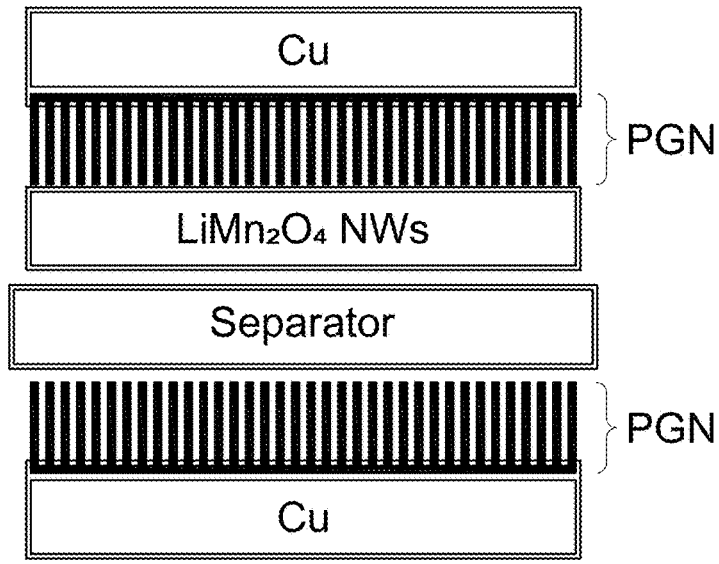
FIG. 35A is a schematic illustration of an example embodiment of a Li-ion battery based on flexible PGN. PGN grown on copper acts as anode and $LiMn_2O_4$ nanowires may be combined with PGN to form a cathode.
Figure 35B:
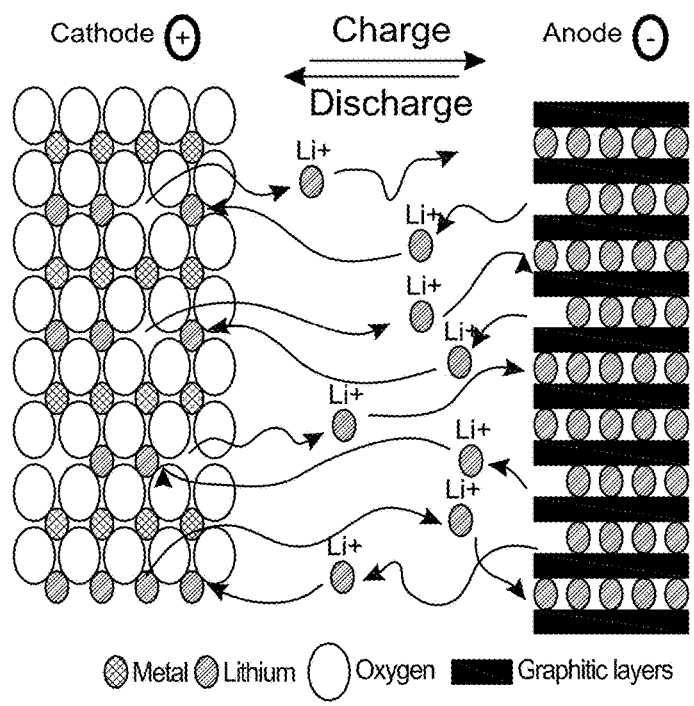
FIG. 35B is a schematic of an example embodiment of a Li-ion battery.
Figure 36:
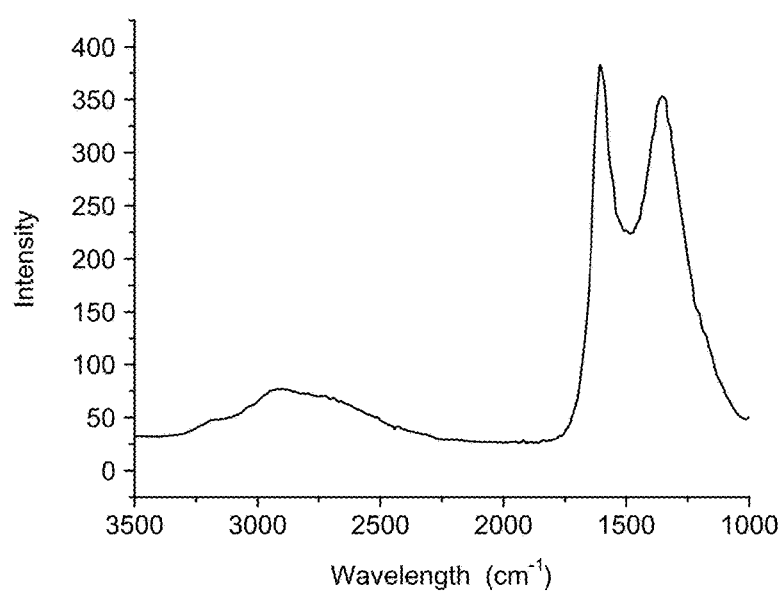
FIG. 36 is a Raman Spectra of PGN. The peak observed around 2800 cm$^{-1}$ shows the thick layer of graphene.

As described herein, PGN can be used in various devices. For example, FIG. 35A is a schematic illustration of an example embodiment of a Li-ion battery based on flexible PGN. PGN grown on copper acts as anode and $LiMn_2O_4$ nanowires may be combined with PGN to form a cathode. FIG. 34B is a schematic of an example embodiment of a Li-ion battery. FIG. 36 is a Raman Spectra of PGN. The peak observed around 2800 $cm^{-1}$ shows the thick layer of graphene.

Although the foregoing description has shown, described, and pointed out the fundamental novel features of the present disclosure, it will be understood that various omissions, substitutions, changes, and/or additions in the form of the detail of the designs illustrated, as well as the uses thereof, may be made by those skilled in the art, without departing from the scope of the present disclosure.

What is claimed is:

1. A method of fabricating a pillared graphene nanostructure comprising carbon nanotubes on a graphene film, the method comprising:
   providing a substrate;
   depositing a block copolymer on the substrate, wherein the block copolymer comprises a matrix of major polymer block, and cylinders of minor polymer block within the matrix;
   subsequently loading a catalyst into the cylinders of the minor polymer block wherein the minor polymer block absorbs catalytic ions to form a loaded block copolymer having a patterned array of catalyst nanoparticles;
   introducing the loaded block copolymer into a heated atmosphere of $Ar+H_2$;
   introducing a carbon source into the heated atmosphere of $Ar+H_2$ to form the pillared graphene nanostructure; and
   cooling the pillared graphene nanostructure.

2. The method of claim 1, wherein depositing the block copolymer comprises:
   dissolving the block copolymer to form a polymer solution;
   spin coating the solution onto the substrate; and
   solvent annealing the spin coated solution.

3. The method of claim 1, wherein the catalyst comprises ions of a transition metal.

4. The method of claim 1, wherein loading the catalyst into the block copolymer comprises introducing the copolymer into a solution of the catalyst in salt form.

5. The method of claim 1, wherein before introducing the loaded block copolymer into the heated atmosphere, the method further comprising:
   removing the loaded block copolymer from the substrate; and
   transferring the loaded block copolymer to a different substrate.

6. The method of claim 5, wherein the different substrate comprises a deposited metal layer.

7. The method of claim 1, wherein the heated atmosphere is between about 600° C. and about 1100° C.

8. The method of claim 1, wherein the carbon source is introduced for about 5 minutes to about 30 minutes.

9. The method of claim 1, wherein the carbon source is $C_2H_2$ or $CH_4$.

10. The method of claim 1, further comprising controlling the size and separation of the carbon nanotubes by controlling the size and separation of the catalyst.

* * * * *